United States Patent
Deladurantaye et al.

(10) Patent No.: US 8,073,027 B2
(45) Date of Patent: Dec. 6, 2011

(54) DIGITAL LASER PULSE SHAPING MODULE AND SYSTEM

(75) Inventors: Pascal Deladurantaye, Lévis (CA); François Duchesne, Québec (CA); Michel Jacob, Québec (CA); Yvan Mimeault, Québec (CA); André Parent, Québec (CA); Yves Taillon, Saint-Augustin de Desmaures (CA)

(73) Assignee: Institut National d'Optique, Quebec (CA)

( * ) Notice: Subject to any disclaimer, the term of this patent is extended or adjusted under 35 U.S.C. 154(b) by 267 days.

(21) Appl. No.: 12/493,949

(22) Filed: Jun. 29, 2009

(65) Prior Publication Data

US 2009/0323741 A1 Dec. 31, 2009

Related U.S. Application Data

(60) Provisional application No. 61/076,337, filed on Jun. 27, 2008.

(51) Int. Cl.
*H01S 3/13* (2006.01)
(52) U.S. Cl. .......... 372/29.014; 372/29.01; 372/25; 372/9
(58) Field of Classification Search .......... 372/29.014, 372/29.01, 25, 9
See application file for complete search history.

(56) References Cited

U.S. PATENT DOCUMENTS

| | | |
|---|---|---|
| 5,151,909 A | 9/1992 | Davenport et al. |
| 5,226,051 A | 7/1993 | Chan et al. |
| 6,172,325 B1 | 1/2001 | Baird et al. |
| 6,281,471 B1 | 8/2001 | Smart |
| 6,477,107 B1 * | 11/2002 | Lee ................ 365/233.18 |
| 7,126,746 B2 | 10/2006 | Sun et al. |
| 7,348,516 B2 | 3/2008 | Sun et al. |
| 2006/0159138 A1 | 7/2006 | Deladurantaye et al. |
| 2007/0228024 A1 | 10/2007 | Bruland et al. |
| 2007/0248136 A1 | 10/2007 | Leonardo et al. |
| 2008/0013163 A1 | 1/2008 | Leonardo et al. |
| 2008/0080570 A1 | 4/2008 | Murison et al. |
| 2008/0225935 A1 | 9/2008 | Reddy |
| 2008/0233715 A1 | 9/2008 | Liu et al. |
| 2008/0261382 A1 | 10/2008 | Starodoumov et al. |
| 2008/0310568 A1 | 12/2008 | Sander |
| 2009/0010288 A1 | 1/2009 | Keaton et al. |

FOREIGN PATENT DOCUMENTS

| | | |
|---|---|---|
| WO | WO 2008/014331 A2 | 1/2008 |
| WO | WO 2009/155712 A1 | 12/2009 |

OTHER PUBLICATIONS

Koechner, "Solid-State laser engineering", Springer-Verlag, Chapter 8, figure 8.8.

* cited by examiner

*Primary Examiner* — Kinam Park
(74) *Attorney, Agent, or Firm* — Merchant & Gould P.C.

(57) ABSTRACT

A digital pulse shaping module for controlling a pulsed laser oscillator according to a digital input waveform is provided. The pulse shaping module includes a clock generator generating a plurality of phase-related clock signals and a shape generator which outputs a digital shape signal corresponding to the digital input waveform in Double Data Rate in response to the clock signals. A DAC converts the digital shape into an analog shape signal. The analog shape signal may be used to control the current source of a laser seed source or modulators in the laser oscillator shaping a seed light signal. Optionally, the pulse shaping module may also output a gate control signal having a predetermined timing relationship with respect to the digital shape signal.

40 Claims, 38 Drawing Sheets

DIGITAL LASER PULSE SHAPING MODULE AND SYSTEM

This application claims benefit of Ser. No. 61/076,337, filed 27 Jun. 2008 in the United States and which application is incorporated herein by reference. To the extent appropriate, a claim of priority is made to the above disclosed application.

FIELD OF THE INVENTION

The present invention relates to the field of laser devices and more particularly concerns a digital platform for providing pulse shaping control signals to a laser oscillator.

BACKGROUND

Many industrial fields require laser processing capability and for such applications, the primary concern is often to generate optical laser pulses with, to some extent, real-time control over the pulse amplitude, duration, shape, peak power and repetition rate. In some applications, such as laser-based material-processing, the rise time and fall time of the shaped optical pulses are also important functional specifications.

U.S. Pat. No. 7,348,516 (SUN et al.), entitled "Methods of and laser systems for link processing using laser pulses with specially tailored power profiles" presents many arguments in favor of pulsed laser systems providing fine control over the pulse temporal power profile in the nanosecond regime, for facilitating better link process quality and yield. Three different laser architectures providing a certain control over the laser pulse shapes are described therein. U.S. Pat. No. 7,126,746 (SUN et al.) further teaches a laser system providing control over the pulse shapes and having a Master Oscillator Power Amplifier (MOPA) configuration. A practical manner of digitally generating appropriate control signals for such systems is not however described in either document.

U.S. Pat. No. 6,281,471 (SMART), entitled "Energy-efficient, laser-based method and system for processing target material" describes many requirements and specifications concerning the temporal generation of square laser pulse shapes in material processing. The system presented therein includes, among its main components, a controller for generating a processing control signal, and a signal generator for generating a modulated drive waveform based on the processing control signal. SMART however does not tackle the issue of the implementation or integration of the controller and the waveform generator into the system described.

Optical pulse shaping implementation can originate from digital electronic means, where some electronic apparatus reads a given sequence of digital samples previously stored in a memory buffer, and writes these samples into a digital-to-analog converter (DAC). The shaped analog signal output by the DAC is then fed to a buffer amplifier having enough bandwidth and drive capability for directly modulating a light source such as a laser diode, or driving an electro-optic modulator.

U.S. Patent Application Publication No. 2008/0080,570 (MURISON et al.), entitled "Method and system for a pulsed laser source emitting shaped optical waveforms" presents a tunable pulsed laser source where optical pulse shaping is based on the digital approach just described above. This pulsed laser architecture implements a double-pass optical fibre amplifier that uses a single Mach-Zehnder type amplitude modulator. The electrical analog shaping signal drives two successive openings of the optical modulator. MURISON also emphasized that electrical pulse shaping capability is beneficial for the reduction of gain saturation in the fiber amplifier, or for several fields of laser processing where it is desirable that the optical pulse be different than a square pulse. Although MURISON mentions that the shaped waveform originates from a digital pattern stored in memory on-board a DAC, it does not provide an explicit architecture or method for transferring data from the memory to the DAC, apart from using built-in functional features of an off-the-shelf laboratory instrument such as the AWG2040 (trademark) waveform generator from Tektronix Inc.

Other architectures than the one described by MURISON exist for building pulsed laser sources and these architectures may benefit from the advantages of optical pulse shaping produced from digital electronics as well. An example is U.S. Pat Application published under No. US2006/0159138 (DELADURANTAYE et al.), entitled "Pulse laser light source". This patent application describes a pulse laser source built around two Mach-Zehnder modulators. In the general case of this architecture, it is likely that distinct analog pulse shaping signals must be generated for each modulator, along with proper synchronization and delay settings between one and the other.

Finally, pulsed laser sources sometimes necessitate that several utilitarian functions or modes of operations be present in or in close vicinity of the main architectural body of the fiber amplifier. Typical examples of such functions or modes of operations are a bias servo function for maintaining the extinction point of an electro-optic modulator, the on-demand generation of a quasi-CW optical output or the monitoring and control of the laser pump drivers. In those approaches where individual stand-alone waveform generators and controlling electronics are used, timing jitter as well as synchronization aspects must be carefully managed. In general, such approaches result in higher system cost, volume and complexity.

There is therefore a need for a digital module for generating appropriate control signals for a pulsed laser oscillator.

SUMMARY OF THE INVENTION

In accordance with a first aspect of the present invention, there is provided a digital pulse shaping module for controlling a pulsed laser oscillator according to a digital input waveform, comprising:
- a clock generator generating a plurality of phase-related clock signals at a same clock frequency;
- a shape generator outputting a digital shape signal corresponding to said digital input waveform, said shape generator operating in Double Data Rate in response to said clock signals; and
- a Digital-to-Analog Converter, hereinafter DAC, receiving the digital shape signal and converting the same into an analog shape signal.

Preferably, at least part of the components of the digital pulse shaping module are embedded in a high speed digital logic circuit, such as for example a FPGA or an ASIC.

In accordance with another aspect of the present invention, the digital pulse shaping module is provided in combination with a connector interface interfacing communication between the digital pulse shaping module and user equipment.

In accordance with yet another aspect of the invention, there is also provided a pulse laser system for generating laser pulses, said pulsed laser system comprising:
- a digital pulse shaping module comprising:
  - a clock generator generating a plurality of phase-related clock signals at a same clock frequency;

a shape generator outputting a digital shape signal corresponding to said digital input waveform, said shape generator operating in Double Data Rate in response to said clock signals;

a Digital-to-Analog Converter, hereinafter DAC, receiving the digital shape signal and converting the same into an analog shape signal; and a shape buffer driver receiving the analog shape signal and generating a control shape signal; and a laser oscillator receiving said control shape signal and generating said laser pulses in accordance therewith.

The laser oscillator may be based, for example, on a continuous seed light source pulsed by modulators controlled by the digital pulse shaping module, or on a pulsed seed light source whose current source is directly controlled by this module.

DESCRIPTION OF PREFERRED EMBODIMENTS OF THE INVENTION

The present invention generally provides laser systems and a digital pulse shaping module therefor enabling the versatile and adaptable generation of light pulses.

Laser systems according to embodiments of the invention may advantageously be tailored for any specific laser processing-based method or system that would take advantage of its pulse shaping capability. Numerous applications already exist or may be developed in several fields, such as selective ablation of neighboring microstructures in the semiconductor industry, memory repair, sophisticated laser trimming of glass, plastic or metal, medical applications such as selective cell or tissue alteration, etc. It will be understood that this list is non-exhaustive and that numerous other applications could benefit from laser systems using embodiments of the invention.

Overview of the Pulsed Laser System

Figure 1:
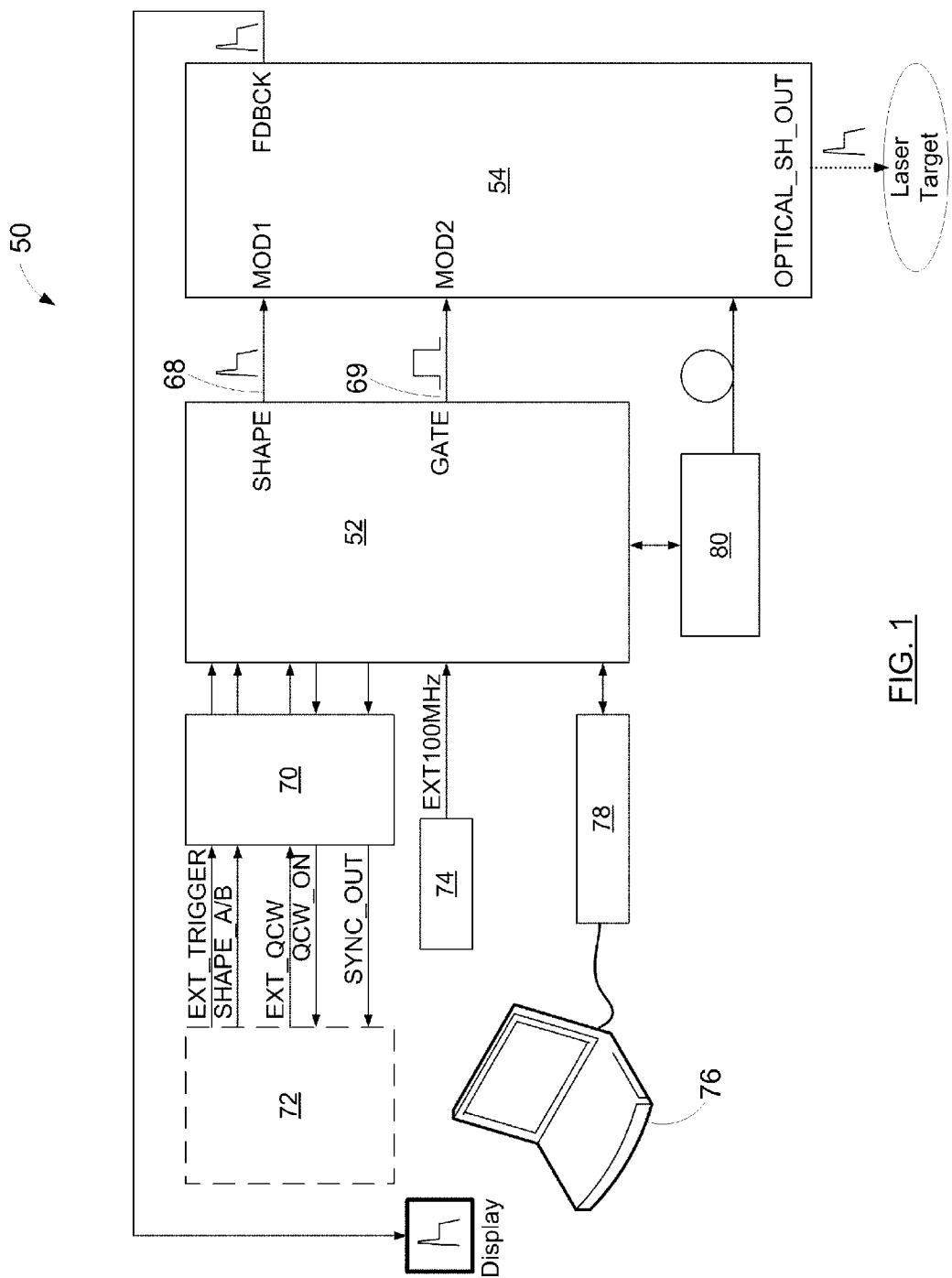
FIG. 1 is a schematic representation of a pulsed laser system which includes a digital pulse shaping module according to an embodiment of the invention.

Referring to FIG. 1, there is shown a pulsed laser system 50 which includes a digital pulse shaping module 52 controlling the laser oscillator of a pulsed laser source 54.

The pulsed laser system 50 may be embodied by any system apt to generate laser pulses and where the pulse shaping functionality of a laser oscillator is controlled by one or more analog control signals. The expression "laser oscillator" is understood to refer to the portion of a laser source 54 which generates light pulses. The oscillator may include a laser cavity or alternatively be based on fluorescent emissions. The oscillator may be part of a larger system including amplifying, beam shaping or any other optical components further defining the properties of the optical pulses generated by the oscillator. In preferred embodiments, the pulsed laser oscillator has a Master Oscillator, Power Amplifier (MOPA) laser architecture, in which the control signals are used to drive gain-switched semiconductor lasers or high speed optical switches such as electro-optic modulators. Laser sources based on such oscillators, when incorporated into material processing systems, offer numerous advantages in terms of throughput and processing windows over traditional Q-Switched technologies. However, one skilled in the art will understand that embodiments of the pulse shaping module 52 may also be used to provide control signals to Q-switched or other equivalent oscillators without departing from the scope of the invention. Various exemplary embodiments of pulsed laser oscillator structures compatible with the present invention are given further below.

The digital pulse shaping module 52 controls the pulsed laser oscillator according to a digital input waveform. The digital input waveform is a sequence of digital samples which may be defined or selected by a user, and which determine the resulting temporal shape of at least one pulse to be outputted by the pulsed laser source 54. The digital pulse shaping module outputs a control shape signal adapted for controlling the pulse laser oscillator to produce the desired pulses.

The control shape signal outputted by the digital pulse shaping module 52 is also herein referred to as the SHAPE signal. The digital pulse shaping module 52 has a first output port 68, for outputting the SHAPE signal. Referring back to FIG. 1, the first port 68 may typically be connected to a MOD1 input of the pulsed laser source 54, either for direct modulation in the case of a seed laser diode or for driving an electro-optic modulator, whichever is internal to the architecture of the laser source 54. Also, for compatibility with different laser source architectures, the digital pulse shaping module 52 may optionally have a second output port 69 provide a control gate signal, hereinafter the GATE signal, that may, or may not, be required to be connected to a MOD2 input of the laser source. The GATE signal is preferably synchronized with the SHAPE signal and it can be used in some laser embodiments for gating or further shaping the optical pulse in-between optical amplifier stages. In a preferred embodiment of the invention, the amplitude of the GATE output is fixed, its length is user-adjustable in order to match the duration $t_{sh}$ of the SHAPE output, and it always occurs after SHAPE by a delay $d_{gt}$ whose value is preferably user-adjustable. However, in alternative embodiments, the GATE signal may also be a shaped signal generated in a manner siminal to the SHAPE signal.

Under the effect of SHAPE, and optionally GATE, the laser source outputs a shaped optical signal OPTICAL_SH_OUT that is typically amplified by a fiber amplifier inside the source before getting to the target.

The pulsed laser system 50 is preferably adapted to interact with user equipment 72, which enables a user to interact and control the laser system according to desired operation parameters. A connector interface 70 preferably interfaces communication between the digital pulse shaping module 52 and the user equipment 72. The user equipment 72 may be embodied by any appropriate device or combination of devices such as, for example, a memory repair system, a photovoltaic cell scribing system, a micro-via drilling system or a laser surgery system.

Each electrical shape output by the digital pulse shaping module 52 on SHAPE may be triggered either by an internal or an external trigger signal. Preferably, the connector interface 70 provides an external trigger signal EXT_TRIGGER to the digital pulse shaping module 52 in response to a trigger command from the user equipment 72. The connector interface 70 also optionally outputs a trigger synchronization signal SYNC_OUT, having a predetermined timing relationship with respect to a light pulse emitted by the laser oscillator responsive to the external trigger signal EXT_TRIGGER. Preferably, the trigger synchronization signal SYNC_OUT has the same length $t_{tr}$ as EXT_TRIGGER and occurs after the SHAPE output by a delay $d_{so}$ whose value may be fixed or user-adjustable. This delay $d_{so}$ enables SYNC_OUT to occur quasi-simultaneously with the optical output of the laser source (OPTICAL_SH_OUT). The so-defined timing relationships between the EXT_TRIGGER, SHAPE, GATE, SYNC_OUT and OPTICAL_SH_OUT are all illustrated in FIG. 2.

In one embodiment of the invention, the pulsed laser system allows to switch between two input waveforms pre-selected by the user, hereinafter referred to as SHAPE_A and SHAPE_B. The connector interface 70 preferably provides a shape switching signal SHAPE_A/B for switching dynamically the SHAPE output from one of the preselected waveforms to the other, in response to a shape selection command from the user equipment 72.

In one embodiment of the invention, when not triggered for pulse shape generation, the outputs SHAPE and GATE of the digital pulse shaping module 52 may default to a Quasi-Continuous Wave (QCW) signal, that is, a square-wave signal having a higher duty cycle than the typical duty cycle of the SHAPE signal, and an appropriate frequency, for example 100 MHz in the illustrated embodiment. The digital pulse shaping module 52 is preferably designed to switch dynamically between the square-wave QCW mode and the pulse-shaping mode. Such switching action can be subject to pre-programmed conditions that will be described in sections below. It is to be noted that in the embodiment of FIG. 1, the connector interface 70 provides a QCW trigger signal EXT_QCW in response to a QCW command from the user equipment 72 to force QCW at the output of the digital pulse shaping module 52. A QCW flag QCW_ON is preferably returned to the user equipment 72 through the connector interface 70 to acknowledge activation of the QCW mode.

Preferably, an oscillator external to the digital pulse shaping module 52 provides a start-up clock signal of 100 MHz at power-on. Other time-critical clock signals for the QCW and pulse shaping modes are generated inside the digital pulse shaping module 52, as will be seen further below.

The digital pulse shaping module 52 includes a microcontroller 62 (see FIG. 3A) that can communicate with a host computer 76 through a communication port 78. The communication port 78 may for example be embodied by a RS-232, USB or Ethernet port or any equivalent thereto. In the illustrated embodiment, the host computer 76 is provided to command the digital pulse shaping module 52 to operate either in a SERVICE mode or in a USER mode, as will be explained in detail further below. The host computer 76 may be embodied by any appropriate device such as a general purpose computer, driven by appropriate software. The software may also execute housekeeping functions in collaboration with the microcontroller in the digital pulse shaping module 52, such as controlling and monitoring laser pump drivers 80 associated with the pulsed laser source 54, and, if appropriate, controlling and monitoring the extinction point of electro-optic modulators that might be present in the source.

In embodiments of the invention, all desirable laser functionalities such as digital control and monitoring of laser diodes, control of optical devices such as electro-optical modulators, management of laser modes of operations (QCW/pulsed), management of communications with the host computer, etc. may advantageously be implemented in a very compact architecture, for example on a single PCB board. As this approach minimizes the number of individual independent modules, many system functionalities can be easily implemented for a given application or laser system embodiment through modification of the Hardware Description Language HDL code alone without the need of addressing expensive hardware modifications.

Examples of the various components of pulsed laser systems according to embodiments of the invention will be explained in more detail in the following sections.

1. Digital Pulse Shaping Module

Figure 3A:
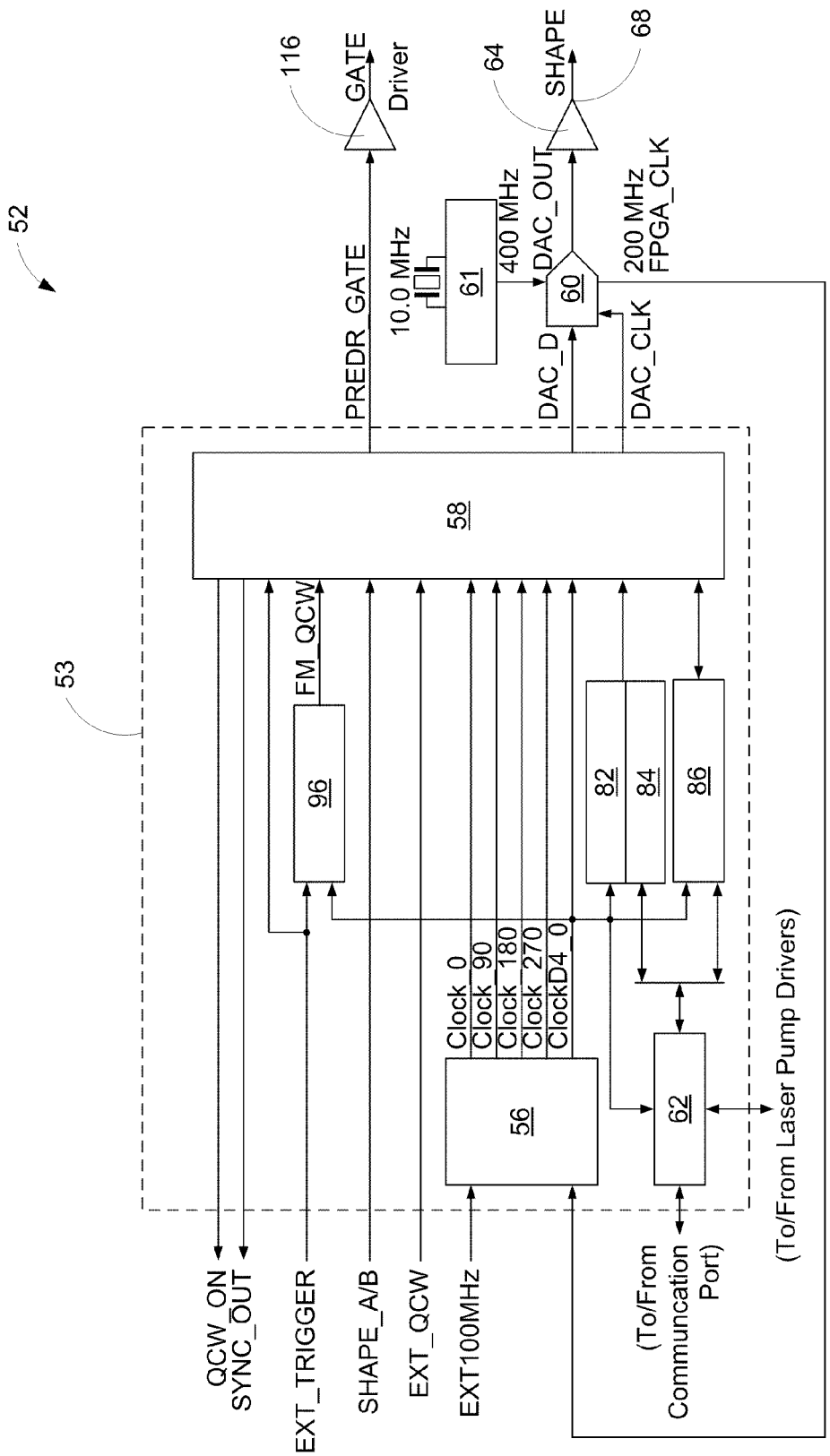
FIG. 3A is a block diagram of a digital pulse shaping module according to an embodiment of the invention.

FIG. 3A generally illustrates a digital pulse shaping module 52 according to an embodiment of the invention.

The digital pulse shaping module 52 generally includes a clock generator 56 generating a plurality of phase-related clock signals at a same clock frequency, and a shape generator 58 outputting a digital shape signal DAC_D corresponding to the digital input waveform. The phase-related clock signals from the clock generator 56 are used as timing signals in the shape generator 58 in a double data rate configuration, hereinafter referred to as "DDR", as will be explained in detail further below. In one embodiment, the digital shape signal DAC_D from the shape generator 58 is either pulse shape data or quasi-continuous data. The pulse shaping module 52 further includes a Digital-to-Analog Converter 60, hereinafter DAC, receiving the digital shape signal DAC_D from the shape generator 58 and converting it into an analog shape signal DAC_OUT. In the illustrated embodiment, the digital pulse shaping module 52 further includes a shape buffer driver 64 receiving the analog shape signal DAC_OUT from the shape generator 58 through the DAC 60 and generating the control shape signal SHAPE adapted for controlling the pulse laser oscillator. The microcontroller 62, which, as mentioned above, is used for controlling the communications with the internal sub-systems of the laser source (pump drivers, etc.) and with the host computer, is finally provided.

The plurality of phase-related clock signals generated by the clock generator 56 include a Clock_0 signal, and Clock_90, Clock_180 and Clock_270 signals respectively lagging a quarter of a period, half a period and three-quarters of a period behind the Clock_0 signal. In one embodiment, the phase-related clock signals are driven at 200 MHz. The clock generator 56 further preferably outputs a slow clock signal CLKD4_0 at 50 MHz, used mainly for clocking the slower elements in the design.

A frequency measurement module 96 is provided for measuring the frequency of the external trigger signal EXT_TRIGGER from the connector interface.

The DAC 60, may for example be embodied by the AD9736 model (trademark) from Analog Devices. The interface to the DAC 60 is preferably differential LVDS, 10-bit source-synchronous with the 200 MHz clock signal, DAC_CLK. The data is input in double data rate into the DAC 60 on each rising edge and each falling edge of DAC_CLK.

The analog output DAC_OUT of the DAC 60 is either 100 MHz QCW or an analog pulse shape. This signal is input to the shape buffer driver 64 which is selected amongst devices appropriate for the external laser source. As such, the shape buffer driver 64 preferably has a very high slew rate and it is capable of driving a 50-Ohm load. This driver can use the Texas Instruments THS3102 amplifier (trademark), or a parallel combination of a few such amplifiers. Possibly also, the output of the shape buffer driver 64 may be transformer-coupled to the laser modulator. The resulting output signal is the SHAPE signal that is input to MOD1 of the laser source.

A low-jitter frequency synthesizer 61, such as the IDT ICS8442 (trademark) with a 10 MHz crystal, outputs a 400 MHz clock signal to the DAC 60. The DAC 60 divides this frequency down to 200 MHz to output the FPGA_CLK signal used by the clock generator 56.

In one embodiment, the shape generator 58 also outputs the PREDR_GATE signal, either in QCW or pulse mode. This output has fixed amplitude and is also buffered similarly to the DAC_OUT with a gate buffer driver 116, for example a THS3102 type amplifier to drive the laser source. The resulting buffered output is the GATE signal that is input to MOD2 of the laser source.

Peripherals such as a timer 82, read/write registers 84, dual-port shape memory buffers 86 and the like may additionally be provided as would be readily understood by one skilled in the art, all of which are preferably mapped on the bus of the microcontroller 62. Detailed descriptions of these components according to examples of the implementation of the present invention are given further below.

Preferably, the microcontroller 62, clock generator 56, shape generator 58 and related peripherals are embedded on a high speed digital logic circuit 53. In the different embodiments of the present invention, high speed digital logic circuits available in technologies such as ASIC or FPGA or off-the-shelves digital ICs and high speed Digital-to-Analog Converters (DAC) may be used to implement a pulse shaping capability and other desirable industrial laser functionalities resulting in a very efficient, low cost and agile laser system platform that can be easily tailored to several laser processing applications and laser architectures. This integrated approach promotes low jitter and generation of time delays with high resolution for control of critical timings for the fast switching and synchronism of devices such as electro-optical modulators or semiconductor laser diodes.

In the preferred embodiment, the high speed digital logic circuit 53 is a FPGA, such as for example a Xilinx Virtex-2 Pro (trademark) which advantageously includes an embedded microcontroller. The advantages in implementing the FPGA-based architecture illustrated in FIG. 3A are felt in terms of reliability, repeatability and versatility. Especially, it allows for creating a fully-synchronous platform where all the timings, both inside the FPGA 53 and between the FPGA and the DAC 60, are related to a single common timing reference, in this case clock input signal FPGA_CLK. The timings, therefore, are homogeneous throughout the digital pulse shaping module.

Moreover, anyone familiar with FPGA technology and digital synchronous design is aware that the implementation described below is not limited to 200 MHz and that it allows for faster speed and, consequently, further temporal resolution in the optical shapes. To this end, the only requirement is to configure the frequency synthesizer 61 to output signals of an appropriate frequency such as 500 MHz or 600 MHz to the DAC 60. The frequency of the input clock signal FPGA_CLK shared by the DAC 60 and FPGA 53 therefore becomes 250 MHz or 300 MHz, which makes for a faster instrument. Of course, if desired the digital pulse shaping module of embodiments of the invention may also be implemented in a slower regime.

Finally, it must be mentioned that the feasibility of the design described herein is subject to several good engineering practices such as appropriate usage of the software tools of the FPGA vendor, and also basic rules in the design of printed circuit boards such as proper part layout, impedance matching, skew analysis among bus signals, etc, as one skilled in the art will readily understand.

1.1 Shape Generator

In accordance with the embodiment of FIG. 3A, the shape generator 58 outputs in double data rate the following signals:
- the digital shape signal DAC_D data and DAC clock signal DAC_CLK which are both used as inputs to the high-speed DAC 60 to generate either a pulse shaping or QCW signal as the control shape signal SHAPE;
- the gate signal PREDR_GATE, for generating either QCW or fixed-amplitude pulse signal with adjustable width and delay as the control gate signal GATE;
- the trigger synchronization signal SYNC_OUT, with adjustable delay for synchronization with the output of optical pulse shapes from the laser source; and
- the QCW flag QCW_ON to flag or acknowledge that QCW is the current output mode on the SHAPE and GATE output ports.

Figure 3B:
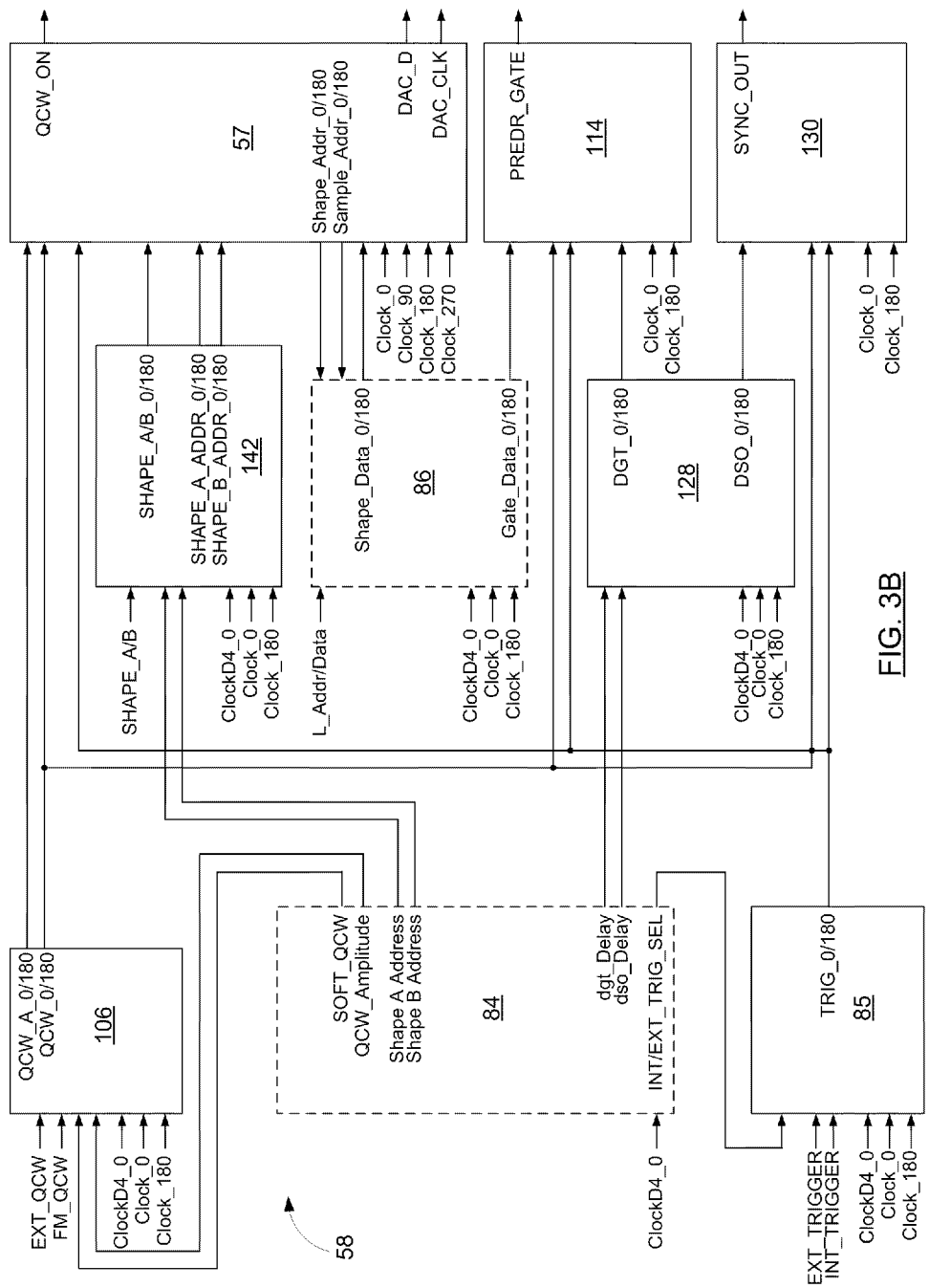
FIG. 3B is a block diagram of the shape generator of the digital pulse shaping module of FIG. 3A.
Figure 11:
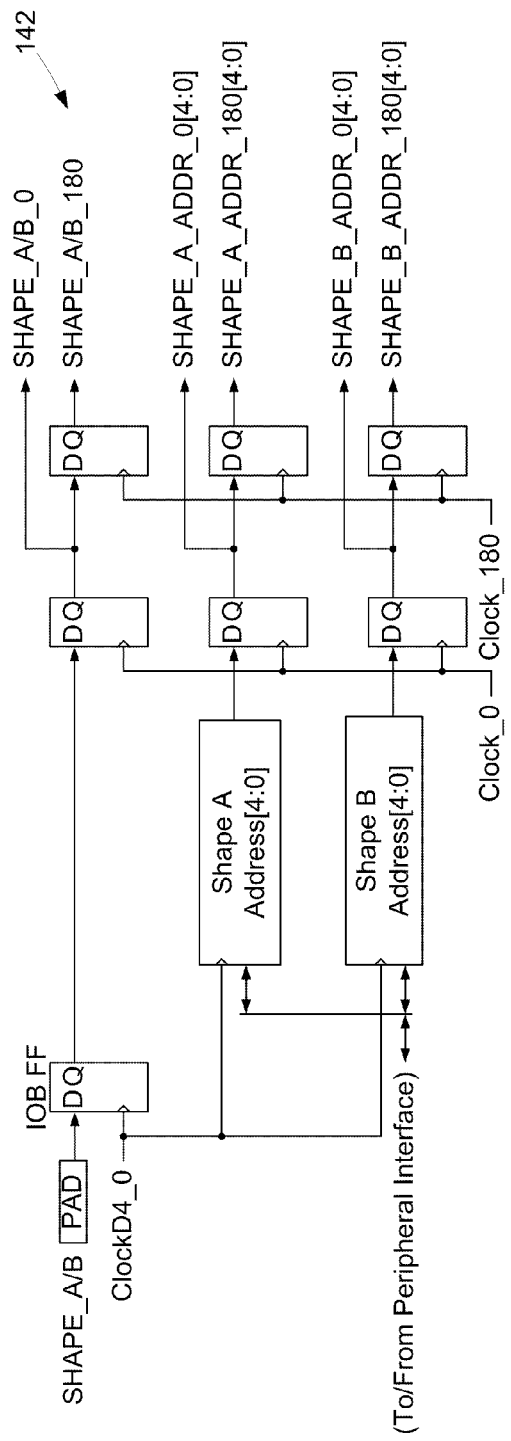
FIG. 11 schematically illustrates the DDR implementation of a shape selection sub-module according to an embodiment of the invention.
Figure 12:
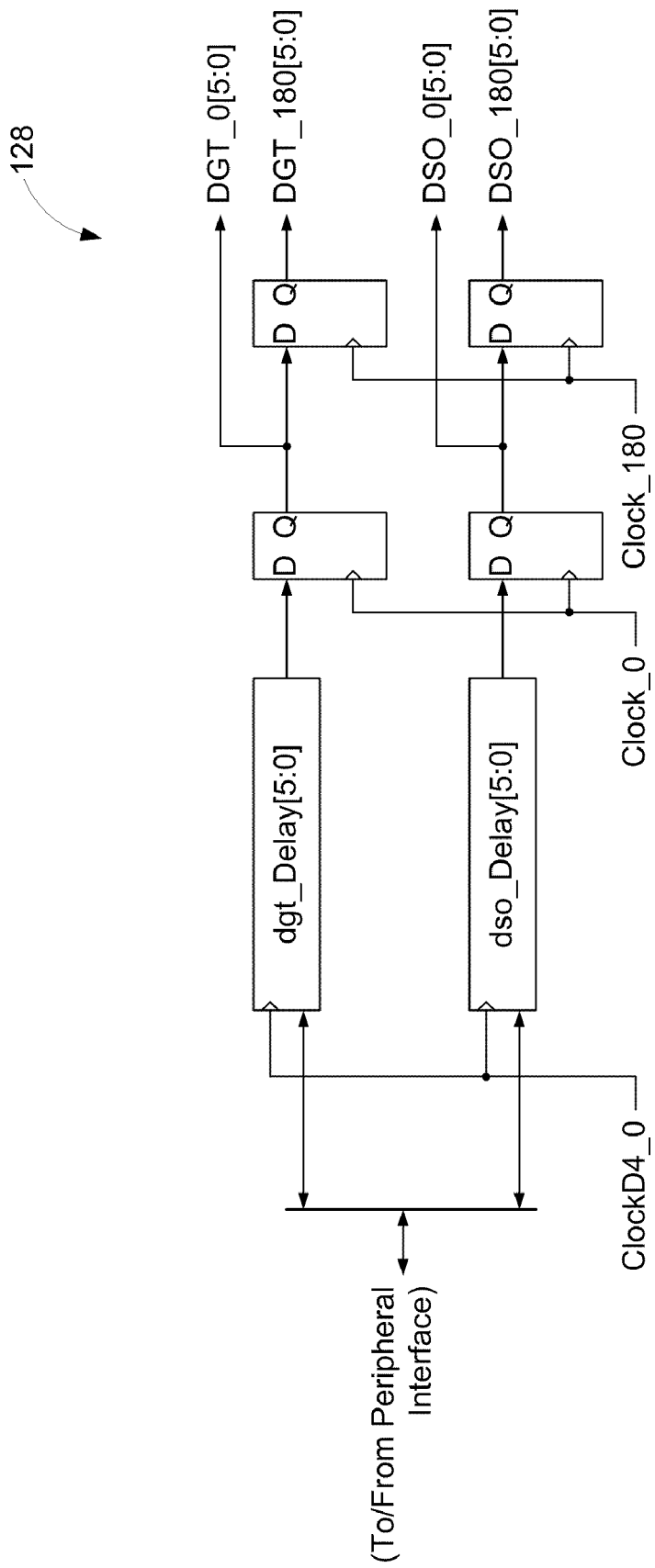
FIG. 12 schematically illustrates the DDR implementation of a delay control sub-module according to an embodiment of the invention.

Referring to FIG. 3B, the shape generator 58 preferably includes the following sub-modules, embodiments of which will be described below with reference to the appended drawings:
- a shape sub-module 57 (FIG. 14)
- a gate sub-module 114 (FIG. 19)
- a synchronization sub-module 130 (FIG. 24)
- an internal/external trigger sub-module 85 (FIG. 8)
- a QCW control sub-module 106 (FIG. 10)
- a shape selection sub-module 142 (FIG. 11)
- a delay control sub-module 128 (FIG. 12).

1.1.1 Shape Sub-Module

Figure 14:
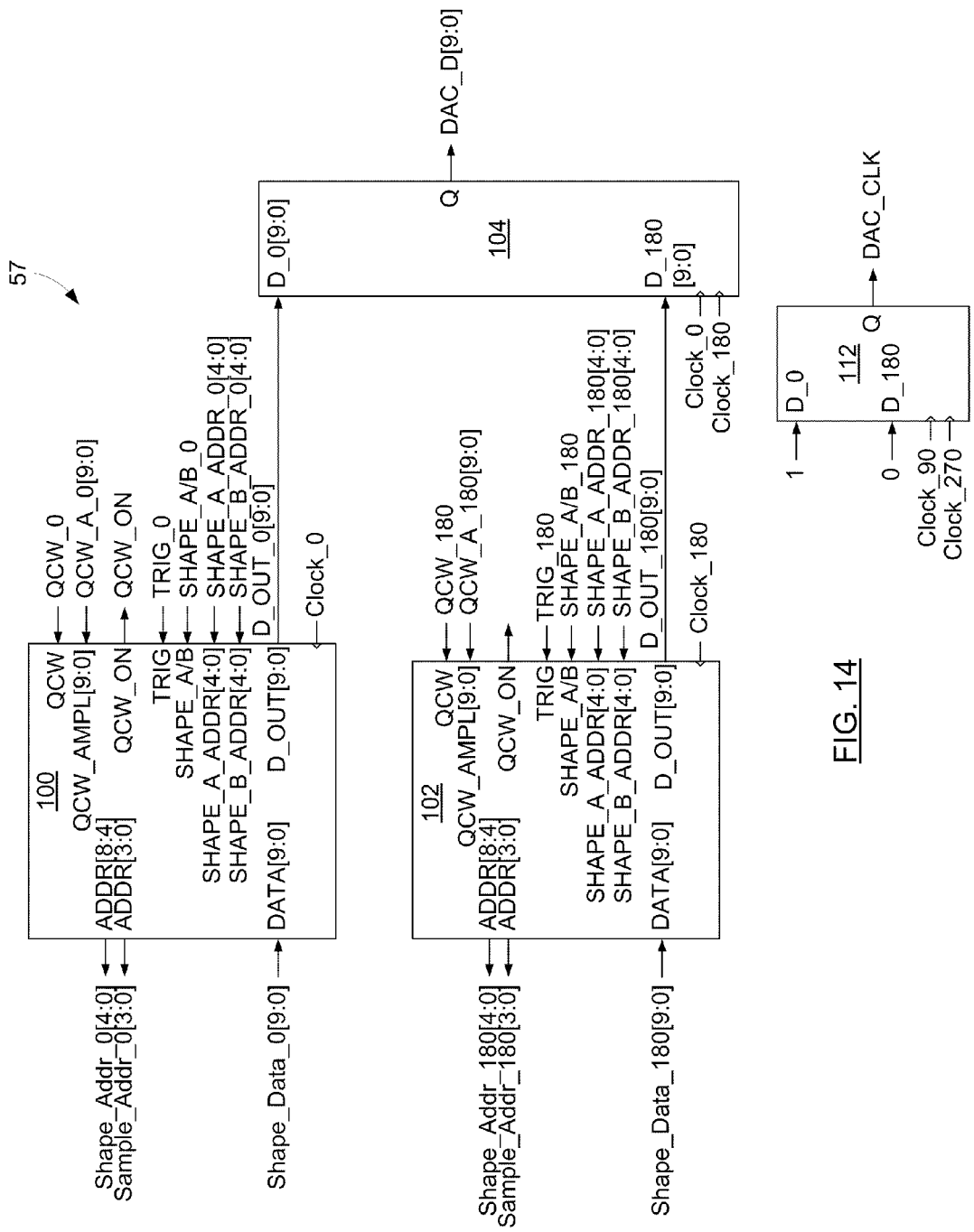
FIG. 14 is a block diagram of a shape sub-module according to an embodiment of the invention.

Referring to FIG. 14, there is shown a block diagram of the shape sub-module 57 according to a preferred embodiment of the invention. In the illustrated embodiment, as will be explained in detail below, the DDR scheme is preferably implemented through the use of parallely operating first and second shape state machines 100 and 102, respectively clocked by the Clock_0 and Clock_180 signals and each outputting a corresponding output shape D_OUT. A shape DDR switch 104 alternatingly outputs the output shape D_OUT from the first and second shape state machines 100 and 102 as the digital shape signal DAC_D. The first and second shape state machines 100 and 102 therefore perform actions in parallel, but delayed by one half-clock period, or 2.5 ns in the 200 MHz frequency scheme. The signals they output at 200 MHz are forwarded to the shape DDR switch 104, which may for example be embodied by a DDR flip-flop in the I/O block (IOB) of the FPGA, in order to create an effective data flow of 400 MSample/s out of the system.

Each state machine 100 and 102 of the shape sub-module 57 may be operated in a shape mode, wherein the output shape corresponds to a selected predetermined waveform, or QCW mode, wherein the output shape is a quasi-continuous wave shape, depending on the command signal being asserted.

Preferably, by default, the shape state machines 100 and 102 are operated in QCW mode and signals QCW_0, QCW_180 force the output in 100 MHz QCW mode. Input signals QCW_A_0, QCW_A_180 determine the amplitude of the corresponding QCW signal and the outputted QCW_ON signal flags or acknowledges the QCW output status to the connector interface (FIG. 1).

For each state machine 100 and 102, when the corresponding command QCW_0, QCW_180 is deasserted, the shape sub-module 57 operates in shape mode, and the output from each shape state machine is pulse shape data at every occurrence of the trigger signal pair TRIG_0, TRIG_180.

Preferably, each shape state machine 100 and 102 includes selecting means for selecting the digital input waveform from any one of a plurality of predetermined waveforms stored in a corresponding shape memory buffer 86 (see FIG. 3A). For example, 32 pre-programmed predetermined waveforms may be available to choose from in the shape memory buffer, although, of course, any other appropriate number may alternatively be considered. For embodiments involving shape switching between shape A and shape B, each shape state machine 100 and 102 further includes shape switching means for dynamically switching the corresponding output shape between two of the predetermined waveforms stored in the shape memory buffer. In the illustrated embodiment of FIG. 14, SHAPE_A_ADDR_0, SHAPE_B_ADDR_0, SHAPE_A_ADDR_180, SHAPE_B_ADDR_180 are the addresses of the two preferred shapes among the 32 shapes available and SHAPE_A/B_0, SHAPE_A/B_180 actuate dynamic switching from shape A to shape B. The address of the selected shape, either shape A or shape B, is output to Shape_Addr_0, Shape_Addr_180 in order to read the shape data samples out of the shape memory buffers. The sequence of the shape sample addresses is output on Sample_Addr_0, Sample_Addr_180 while the sequence of the shape data samples is read from Shape_Data_0, Shape_Data_180.

Still referring to FIG. 14, the shape sub-module 57 further preferably includes a DDR clock switch 112 clocked by the Clock_90 and Clock_270 signals providing a DAC clock signal DAC_CLK as a clock to the double data rate port of the DAC. Since DAC_D and DAC_CLK are output through DDR flip-flops located in the IOB's of the FPGA, DAC_CLK lags the DAC_D data by a precise and repeatable delay of 1.25 ns in order to ensure reliable setup and hold times between the data and the clock seen by the DAC.

Figure 15:
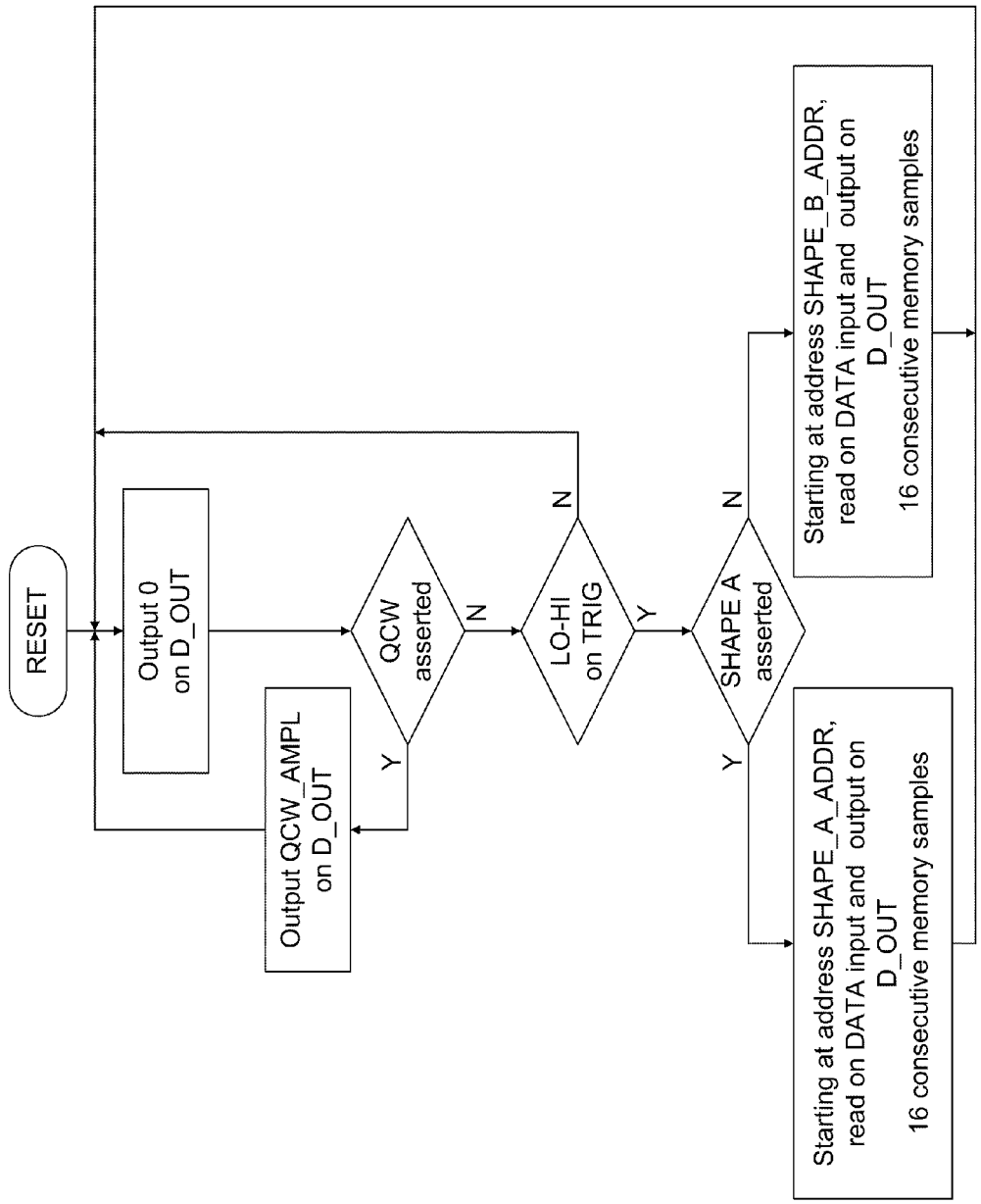
FIG. 15 is a logic flow chart of the operation of a shape state machine according to the embodiment of FIG. 14.

FIG. 15 illustrates the flow chart of the logic implemented in the shape state machines. As mentioned earlier, the output defaults to QCW unless the QCW input is deasserted, in which case, a 32-sample shape is output to the DAC on each LOW-to-HIGH transition of the shape trigger.

Figure 16:
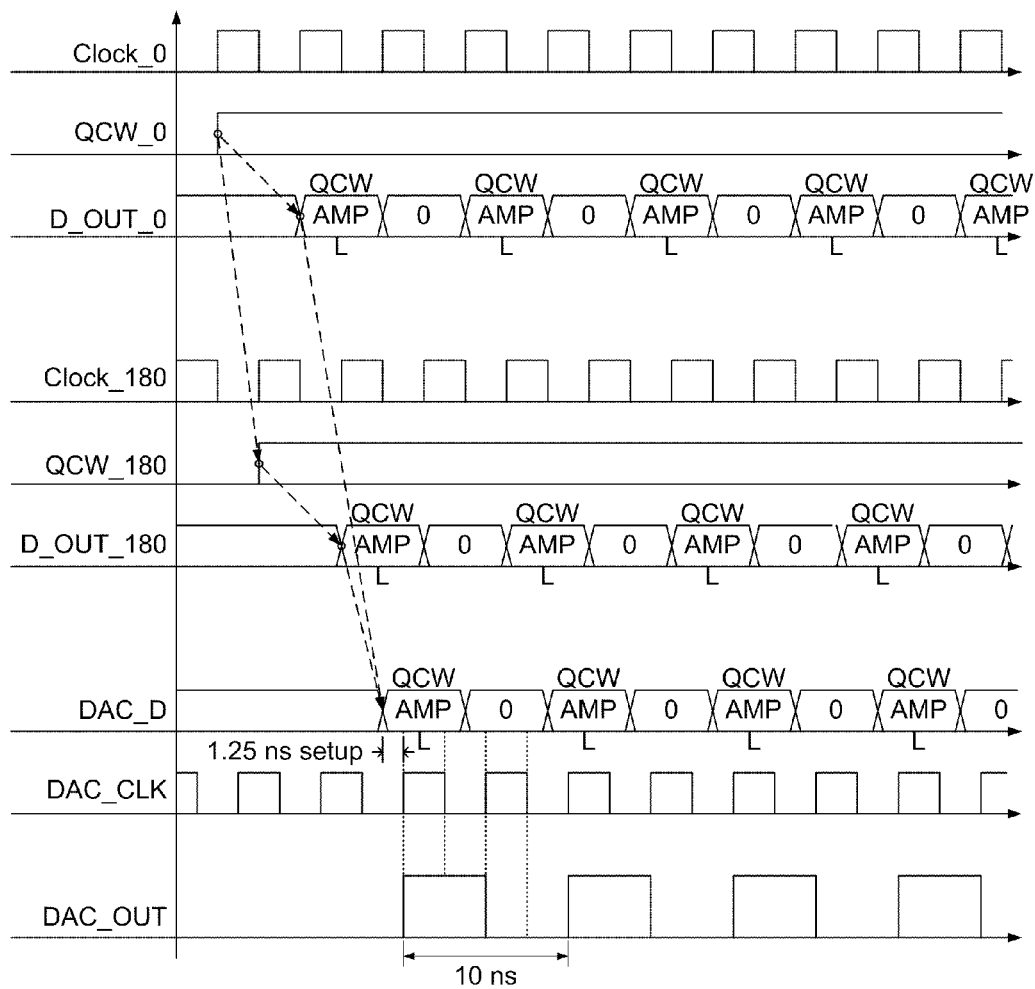
FIG. 16 is a timing diagram for the DDR generation of the 100 MHz QCW.

FIG. 16 shows a timing diagram illustrating how the two shape state machines operate in parallel to output 100 MHz QCW. The shape state machines respectively output the D_OUT_0 and D_OUT_180 sequences. In the preferred embodiment, the values in the sequences alternate between 0 and the 10-bit user-set QCW amplitude.

The DAC_D output is generated by the DDR switch 104; on the rising edge of Clock_0, the DDR switch outputs the D_OUT_0 data, and on the rising edge of Clock_180 immediately after, the DDR switch outputs the D_OUT_180 data.

The 100 MHz QCW square-wave output seen at DAC_OUT results from the DAC_D present at the DAC input on each rising and falling edge of DAC_CLK. Note that the diagram in FIG. 16 does not necessarily take into account possible pipelining latencies intrinsic to the DAC, but nevertheless, the diagram is valid for understanding the functional principle discussed herein.

Figure 17:
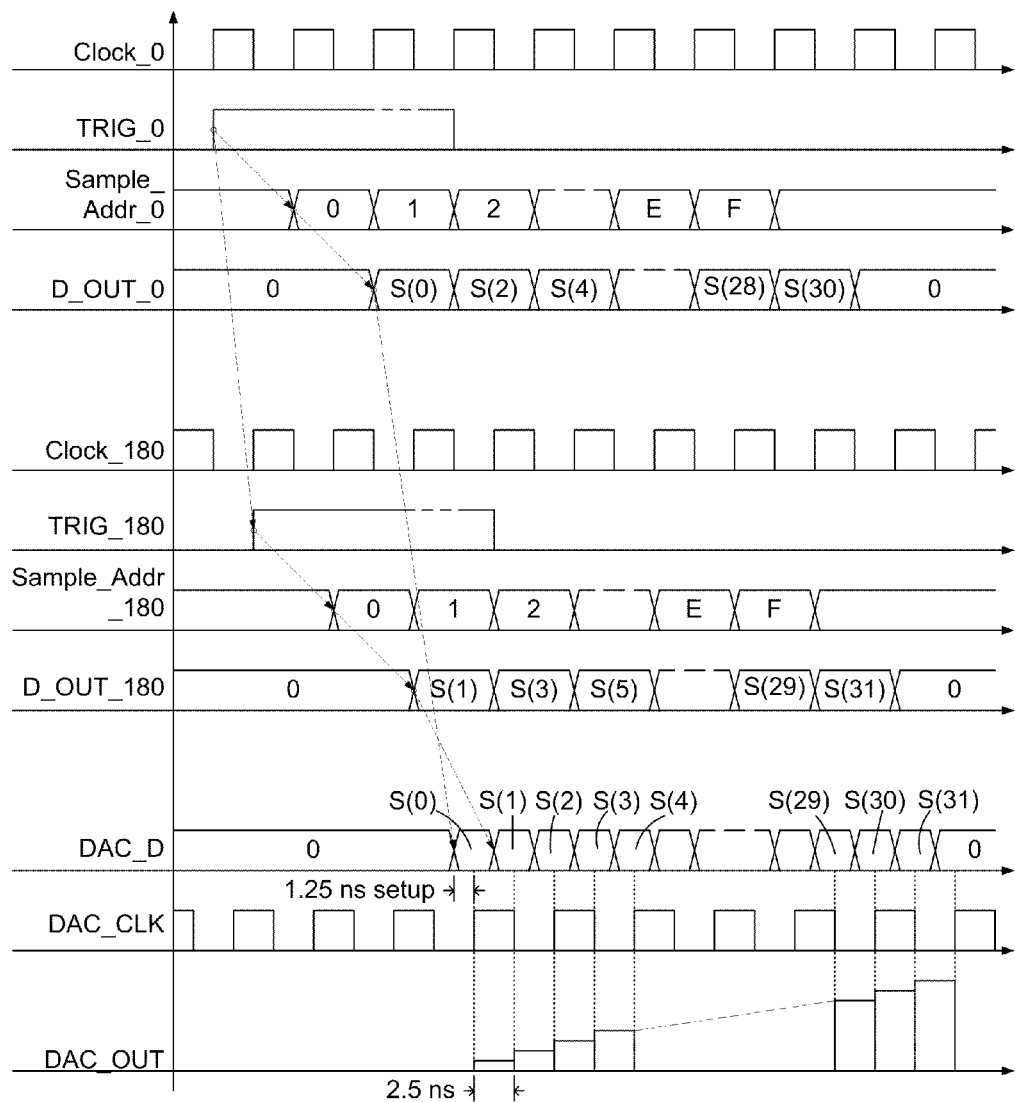
FIG. 17 is a timing diagram for the DDR generation of a user-defined arbitrary pulse shape.

The advantage of the double data rate approach is more apparent in the generation of pulse shapes. FIG. 17 shows how the two shape state machines work in parallel to generate 16 consecutive sample addresses. Assuming that the 32 samples of a shape, S(0), S(1), S(2), . . . , S(31), have been stored in the memory buffer according to an even-indexed/ odd-indexed approach (see further below), when the triggers TRIG_0, TRIG_180 occur, identical addresses are generated on both Sample_Addr_0 and Sample_Addr_180, so that the double data rate sequence generated at DAC_D is a well-ordered sequence that reproduces the shape sequence. This sequence is input in the DAC on rising and falling edges of DAC_CLK.

In FIG. 17, a monotonically increasing pulse shape is represented at the output of the DAC. Since the double data-rate produces samples at each 2.5 ns, the effective output sampling rate is 400 MSPS.

Note that a shape may be defined to be 0 for all of its samples but the first one. Hence, a shape can be as short as 2.5 ns, or any length that is a multiple of 2.5 ns, up to 80 ns.

A feature of this embodiment of the invention is that it provides the user with a very agile laser pulse shaping instrument capable of fast switching between a QCW mode and a pulse shaping mode, as well as fast switching between the two preferred shapes Shape A and Shape B when in pulse shaping mode.

Figure 18:
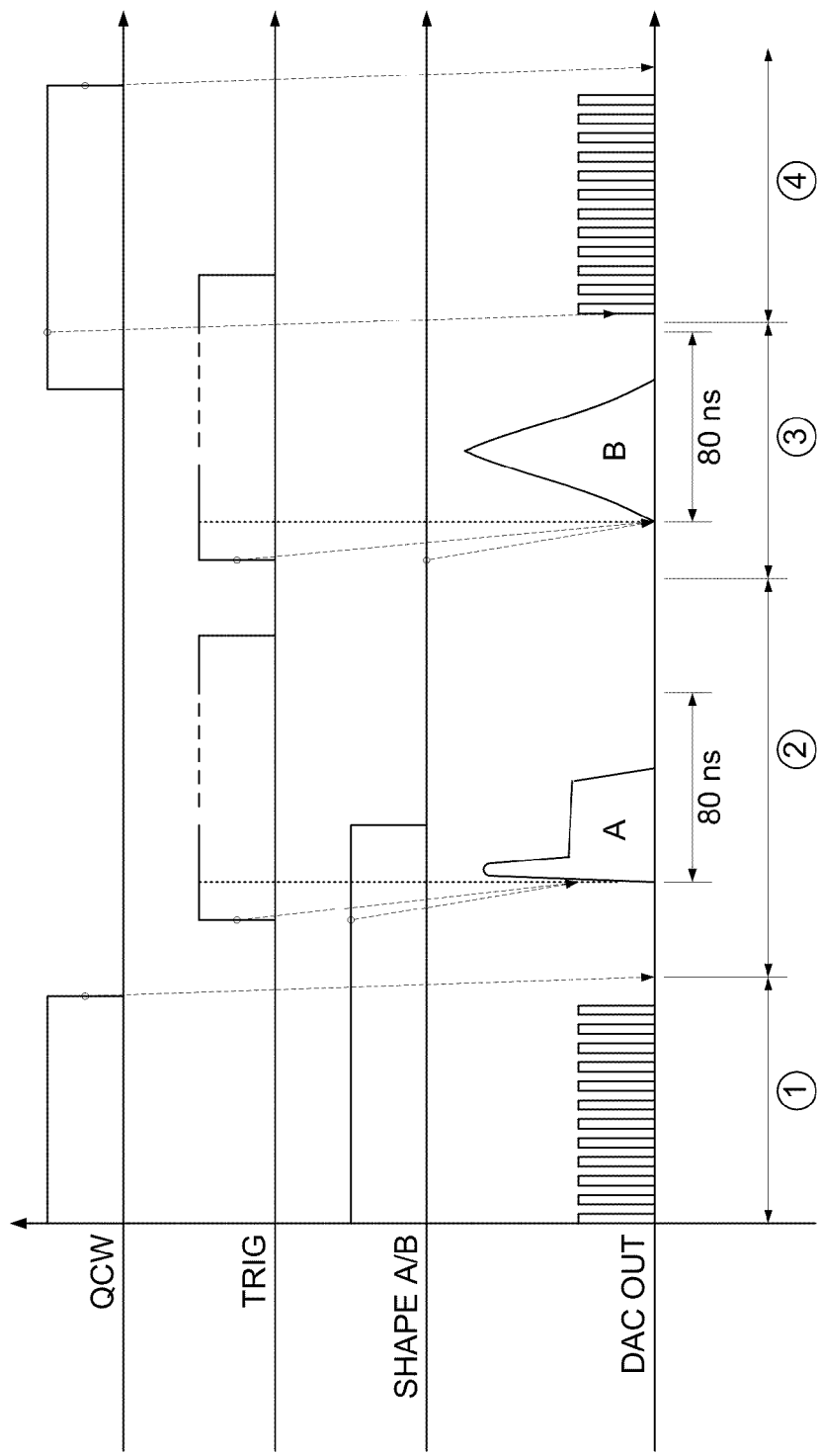
FIG. 18 is a typical timing diagram of mode switching and pulse shape switching.

FIG. 18 illustrates a typical sequence of output mode switching and shape switching. In time interval (1), the DAC outputs 100 MHz QCW since the QCW command input is asserted. The output goes to 0 when the QCW command is deasserted. At the beginning of time interval (2), the QCW command is deasserted and pulse shaping mode is enabled. The output remains to zero until a rising edge occurs on the TRIG input. This triggers the output of Shape A since the command Shape A/B is asserted for Shape A. The output of a shape is performed as a burst. No event at the QCW, the TRIG or the SHAPE A/B inputs can interrupt or alter the output sequence of the 32 shape samples. Once the 32 shape samples have been output, the output goes back to 0. At the beginning of time interval (3), pulse shaping is still enabled. Note that Shape A/B has changed state during the preceding time interval. Shape B is output when the next rising edge of TRIG occurs. Then the output goes back to 0. Since QCW has been asserted during output of shape B, in time interval (4) the output immediately reverts back to default QCW mode.

As can be seen from this example, in the preferred embodiment switching from QCW to pulse shaping occurs as soon as QCW is deasserted, switching from pulse shaping to QCW occurs as soon as QCW is asserted at the end of a pulse shape.

Furthermore, switching between shapes is always accomplished as requested at the rising edge of TRIG following the end of the preceding pulse shape.

1.1.2 Gate Sub-Module

Figure 19:
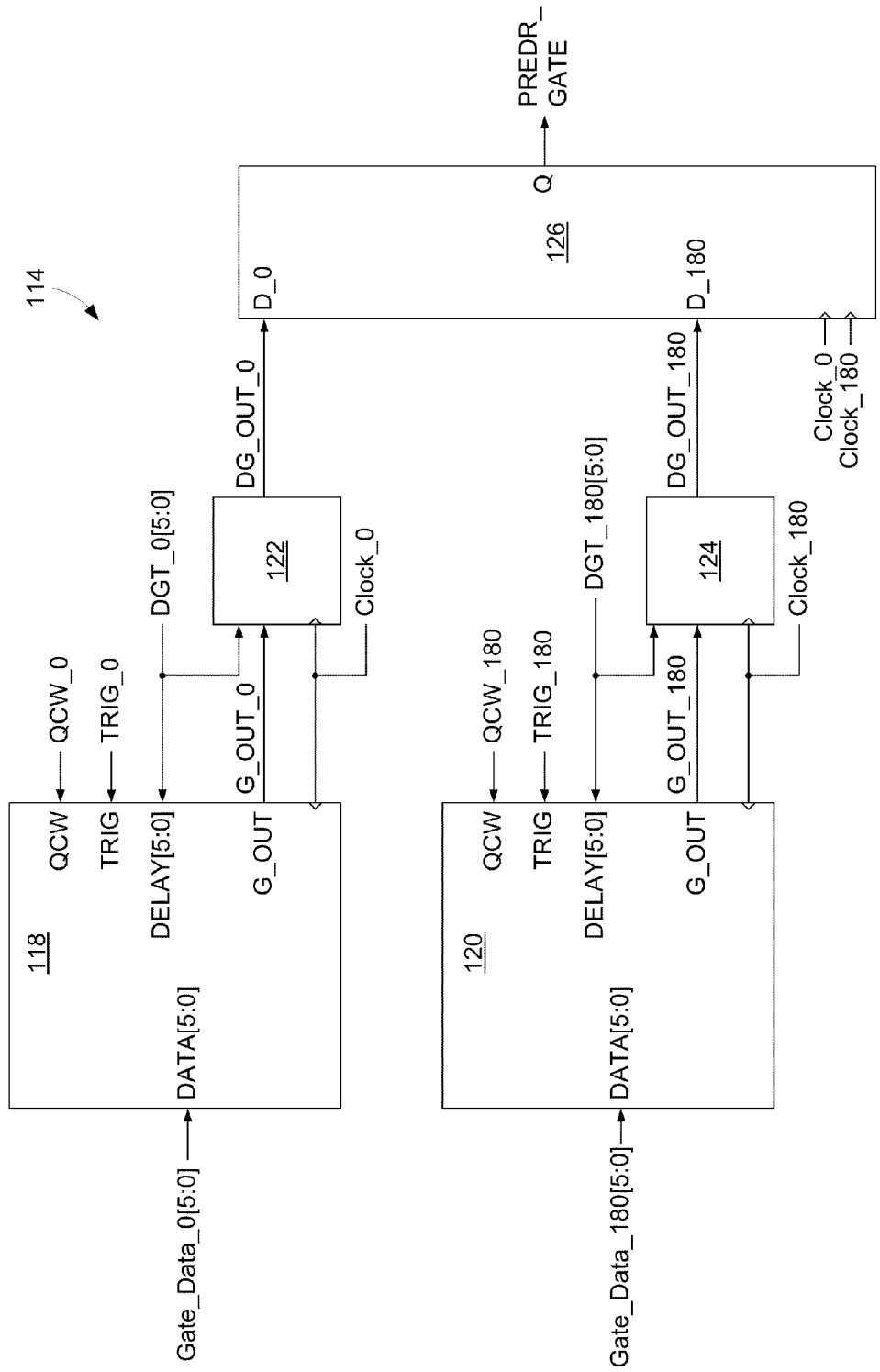
FIG. 19 is a block diagram of a gate sub-module according to an embodiment of the invention.

As mentioned above, the digital pulse shaping module preferably outputs a control gate signal GATE having a predetermined timing relationship with respect to the digital shape signal SHAPE. Referring to FIG. 19, the shape generator preferably includes a gate sub-module 114 generating an analog gate signal PREDR_GATE. A gate buffer driver 116 (see FIG. 3A) receives the analog gate signal PREDR_GATE and generates the corresponding digital control gate signal GATE.

In the illustrated embodiment, the gate sub-module 114 includes parallely operating first and second gate state machines 118 and 120, respectively clocked by the Clock_0 and Clock_180 signals and each outputting a corresponding gate output G_OUT_0 and G_OUT_180. First and second variable delay lines 122 and 124 are respectively associated with the first and second gate state machines 118 and 120, and impose a delay on the corresponding gate output G_OUT_0 and G_OUT_180. In this manner, a delayed gate output DG_OUT_0 and DG_OUT_180 is obtained from each delay line 122 and 124. A gate DDR switch 126 alternatingly outputs the delayed gate output DG_OUT_0 and DG_OUT_180 from the first and second delay lines 122 and 124 as the gate signal PREDR_GATE.

In the preferred embodiment, the gate signal PREDR_GATE outputted by the gate sub-module 114 is either QCW, or a fixed amplitude pulse signal with adjustable delay and width. Each pair of state machine and delay line 118-122 and 120-124 operate together in the 200 MHz domain. In one example of implementation of the invention, the variable delay lines 122 and 124 were configured for a minimum fixed delay value of 170 ns, plus and adjustable delay ranging from 5 to 160 ns in steps of 5 ns.

As shown in FIG. 19, the first and second gate state machines 118 and 120 are preferably controlled by asserting the QCW_0, QCW_180 input pair in order to force the outputs G_OUT_0, G_OUT_180 in 100 MHz fixed-amplitude QCW mode. When the QCW_0, QCW_180 input pair is deasserted, the outputs of the gate state machines 118 and 120 switch to a fixed-amplitude pulse mode synchronized with the occurrence of TRIG_0, TRIG_180.

1.1.3 Delay Control Sub-Module

Figure 2:
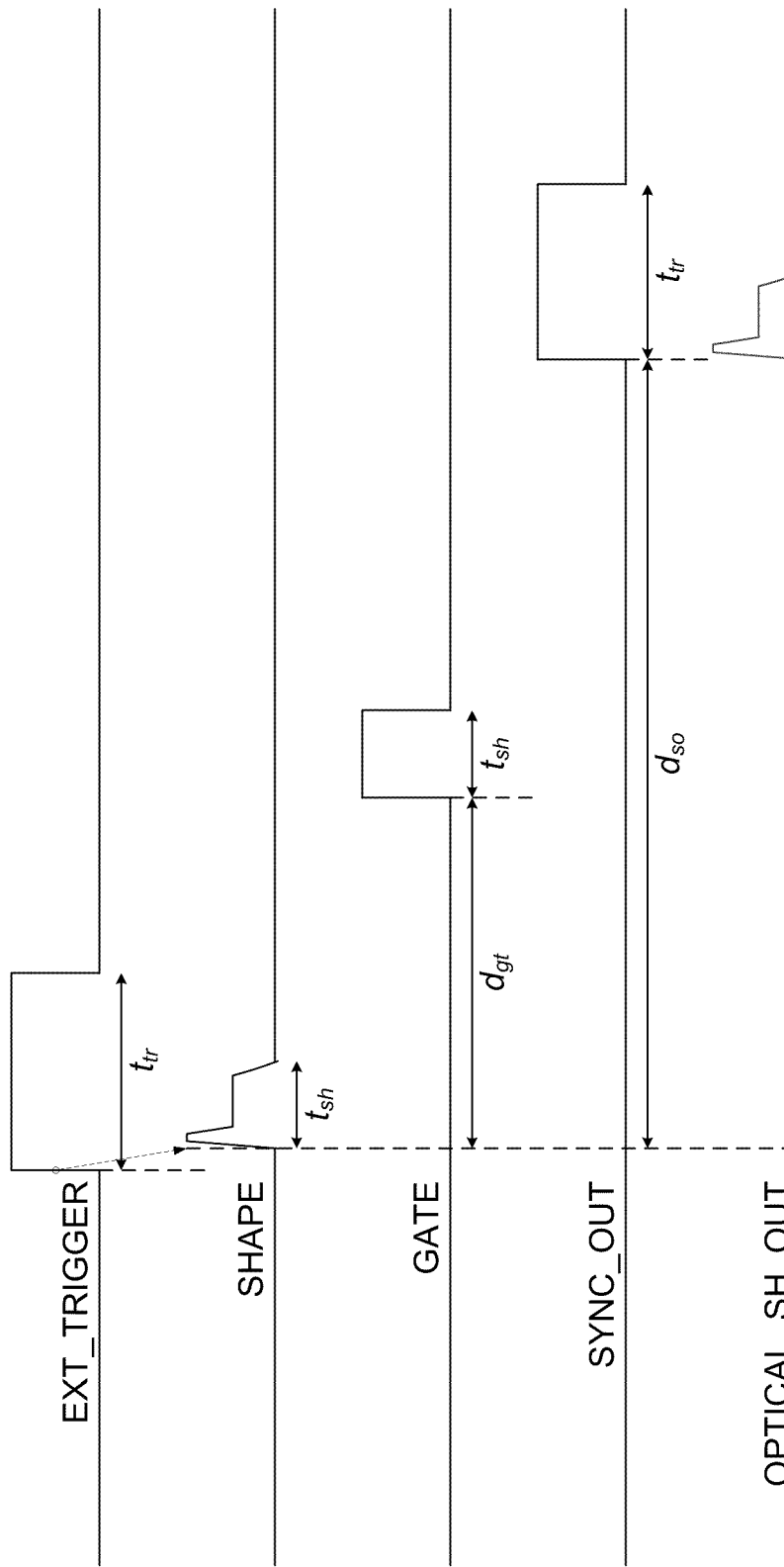
FIG. 2 is a graph illustrating the timing relationships between input and output signals of the digital pulse shaping module of FIG. 1.

Referring to FIG. 12, there is shown a gate control sub-module 128 which is part of the shape generator according to one embodiment of the invention. FIG. 12 illustrates how dgt_Delay and dso_Delay, corresponding to software-selectable $d_{gt}$ and $d_{so}$ delay values in the timing diagram of FIG. 2, are propagated down to the DDR hardware of the digital pulse shaping module. The resulting DDR signal pairs are, respectively, DGT_0, DGT_180 for the $d_{gt}$ delay and DSO_0, DSO_180 for the $d_{so}$ delay.

Referring back to FIG. 19, the first and second gate state-machines 118 and 120 are preferably programmed so that the delayed outputs DG_OUT_0 and DG_OUT_180, once combined into the gate DDR switch 126, will produce a desired granularity of 2.5 ns in both the delay value $d_{gt}$ and the pulse width $t_{sh}$ of PREDR_GATE. With the adjustable delay $d_{gt}$ and pulse width $t_{sh}$ shown in FIG. 2, the DGT_0, DGT_180 is a 6-bit integer n such that $$170\ ns + (n \times 2.5) ns = d_{gt}$$

and Gate_Data_0, Gate_Data_180 is an integer w such that $$(w \times 2.5) ns = t_{sh}$$

The desired granularity can be achieved even if the temporal resolution of the signals output by the state machines and the delay lines is 5 ns. The reason is that there is an intrinsic delay of one-half clock cycle, or 2.5 ns, between the pulse outputs of the state-machines and that the DDR flip-flops in the IOB of the FPGA have the ability to update their output at each 2.5 ns, or one-half clock cycle interval.

The first rule is to take only the five most-significant bits of DGT_0, DGT_180 to set the variable delay value of the delay lines. This is equivalent to delaying the outputs of the state-machines by (n*×5) ns, where n* is half the greatest even integer less than or equal to n. Following this rule, the pulse outputs of the gate state machines are always delayed by an even multiple of 2.5 ns, since the delay lines are clocked at 200 MHz and consequently, they have a single-tap delay of 5 ns.

TABLE 1

Rules for setting the W0, W180 output pulse widths

| W | n | W0 | W180 |
|---|---|---|---|
| odd | even | (w + 1)/2 | (w − 1)/2 |
| | odd | (w − 1)/2 | (w + 1)/2 |
| even | even | w/2 | w/2 |
| | odd | | |

Second, for a given combination of width w and delay n, the pulse width W0 and W180 output by, respectively, the first gate state machine 118 and the second gate state machine 120, are set according to the rules defined in Table 1 above.

Finally, for the case n odd, we further impose that there is one wait state prior to outputting the pulse of width W0 at output G_OUT_0 of the first gate state machine 118.

Figure 20:
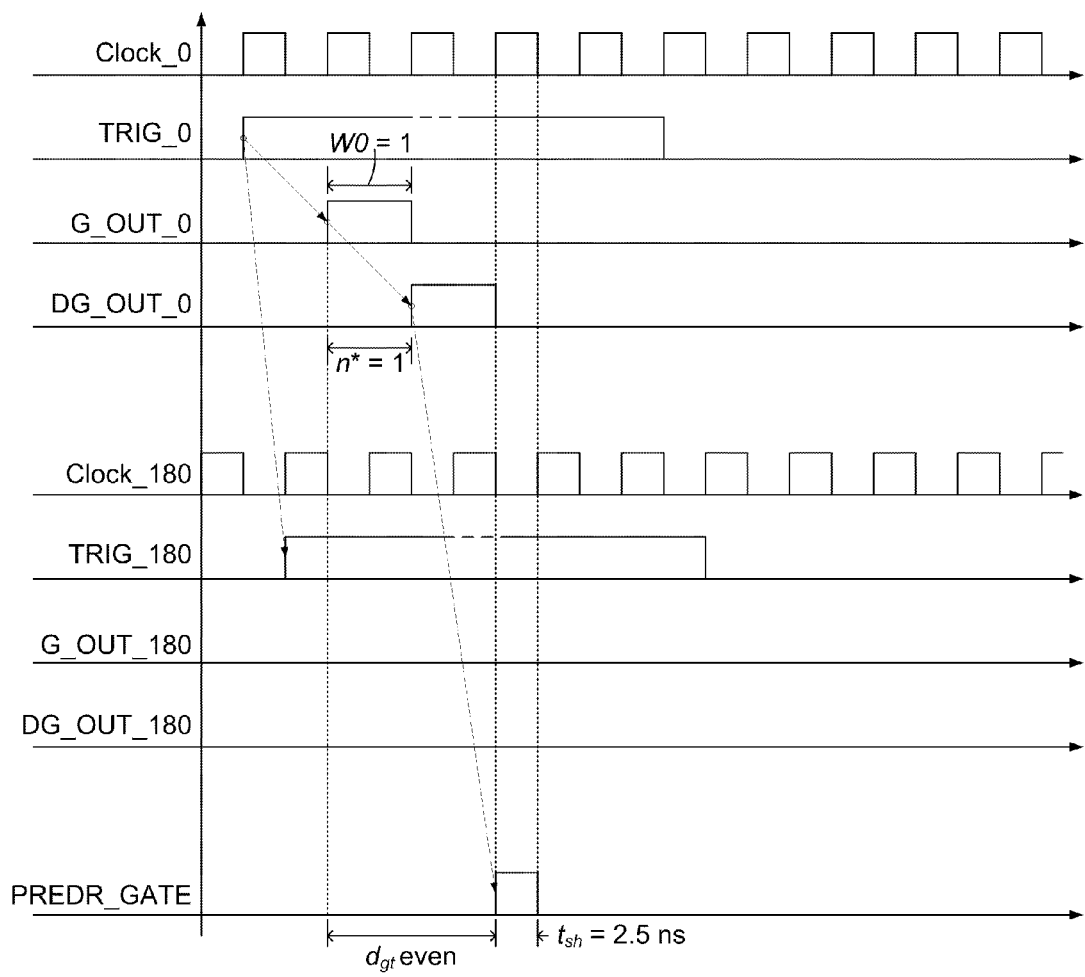
FIG. 20 is a timing diagram schematically illustrating the DDR PREDR_GATE output for w odd, n even.
Figure 21:
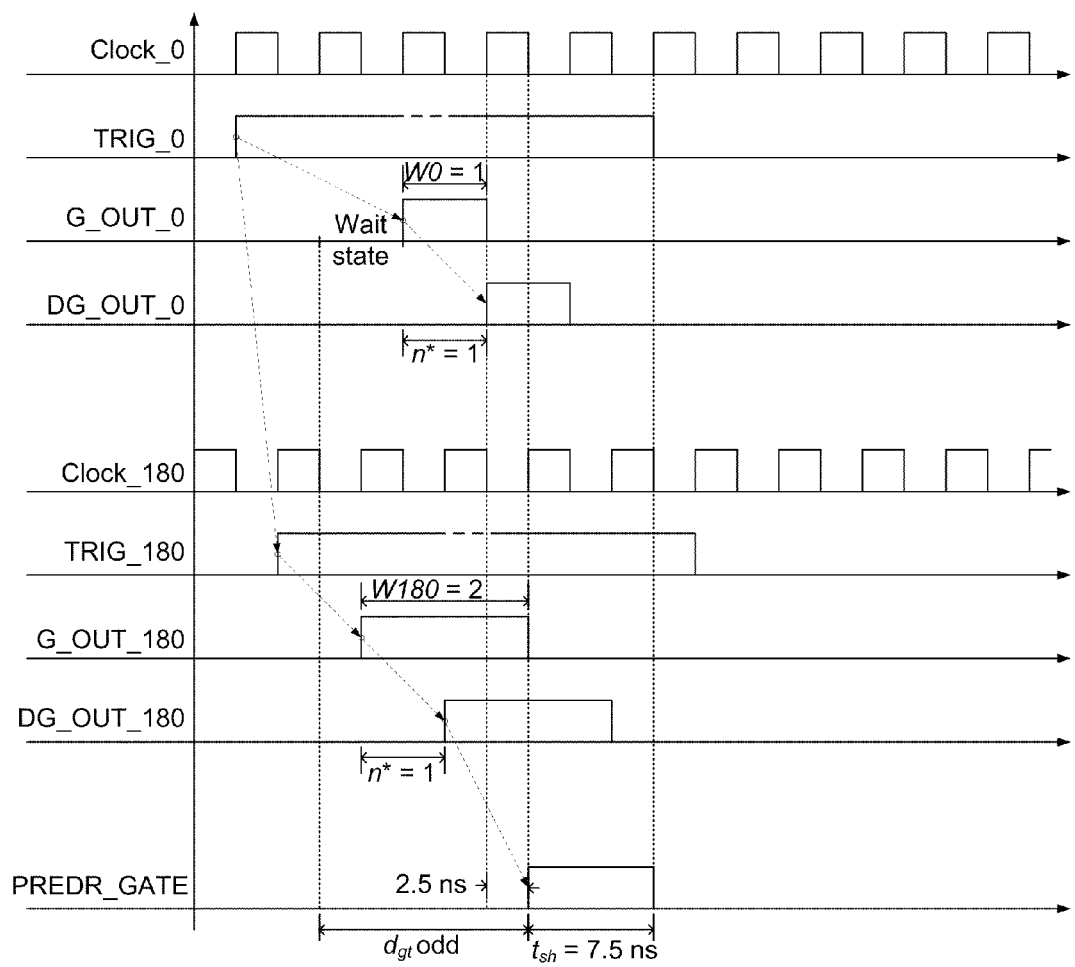
FIG. 21 is a timing diagram schematically illustrating the DDR PREDR_GATE output for w odd, n odd.
Figure 22:
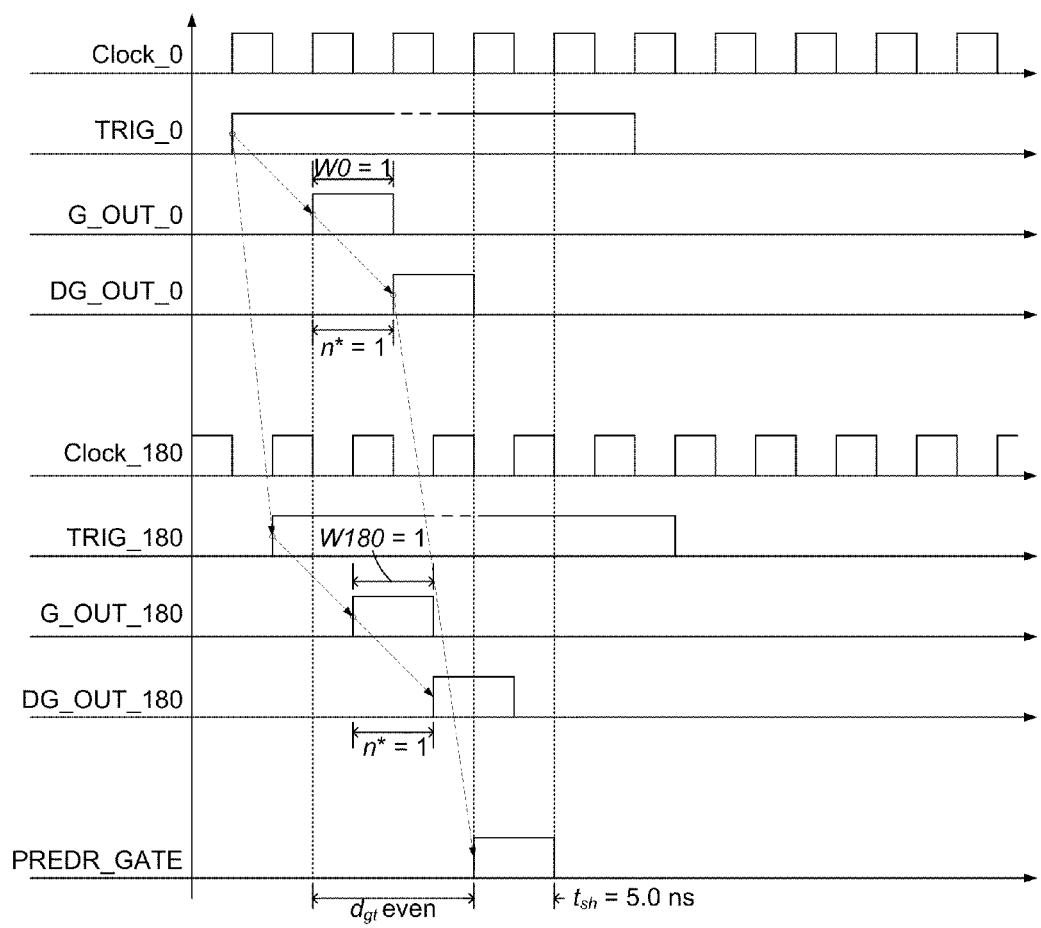
FIG. 22 is a timing diagram schematically illustrating the DDR PREDR_GATE output for w even, n even.

FIG. 20 to 23 are timing diagrams showing how applying these rules makes it possible to generate the PREDR_GATE output with pulse width and delay values with the desired granularity of 2.5 ns.

w odd, n even. Here we choose w=1 to output a pulse width of 2.5 ns, and n=2 to produce a delay $d_{gt}$ which is an even multiple of 2.5 ns. Following the rules defined above, we have n*=1 for a line delay which is (1×5) ns, or (2×2.5) ns; and W0=1, W180=0, i.e., no pulse output by the second gate state machine 120. This is illustrated in FIG. 20, where we deliberately omit to represent the fixed offset of 170 ns of the delay lines. Note that even if a pulse of 5 ns is output by the first gate state machine 118, the PREDR_GATE output lasts only 2.5 ns because the D_180 input of the gate DDR switch 126 is always is 0. Further, it is fairly simple to demonstrate that for every other w odd, the pulse width $t_{sh}$ is an odd multiple of 2.5 ns. Similarly, for every other n even, the delay $d_{gt}$ is an even multiple of 2.5 ns.

w odd, n odd. Here, we set w=3 and n=3. Applying our rules, we have n*=1 for a line delay which is (1×5) ns, or (2×2.5) ns; and W0=1, W180=2. Also, since n is odd, there is one wait state at the output G_OUT_0. The result is illustrated and FIG. 21 and shows that the PREDR_GATE pulse width is (3×2.5) ns and that, with respect to the previous case illustrated in FIG. 20, an additional delay tap of 2.5 ns has now been added, which accounts for an odd-valued delay. For every other w odd, the pulse width $t_{sh}$ is an odd multiple of 2.5 ns. Similarly, for every other n odd, the delay $d_{gt}$ is an odd multiple of 2.5 ns. Particularly, for w=1, we get W0=0, W180=1 and it is readily seen that the width $t_{sh}$ of PREDR_GATE reduces to 2.5 ns.

w even, n even. Setting w=2, n=2. We get n*=1, W0=1, W180=1. The result is illustrated and FIG. 22 and shows that the delay is an even multiple of 2.5 ns and that the PREDR_GATE pulse width is (2×2.5) ns. For every other w even, the pulse width $t_{sh}$ is an even multiple of 2.5 ns. Similarly, for every other n even, the delay $d_{gt}$ is an even multiple of 2.5 ns.

Figure 23:
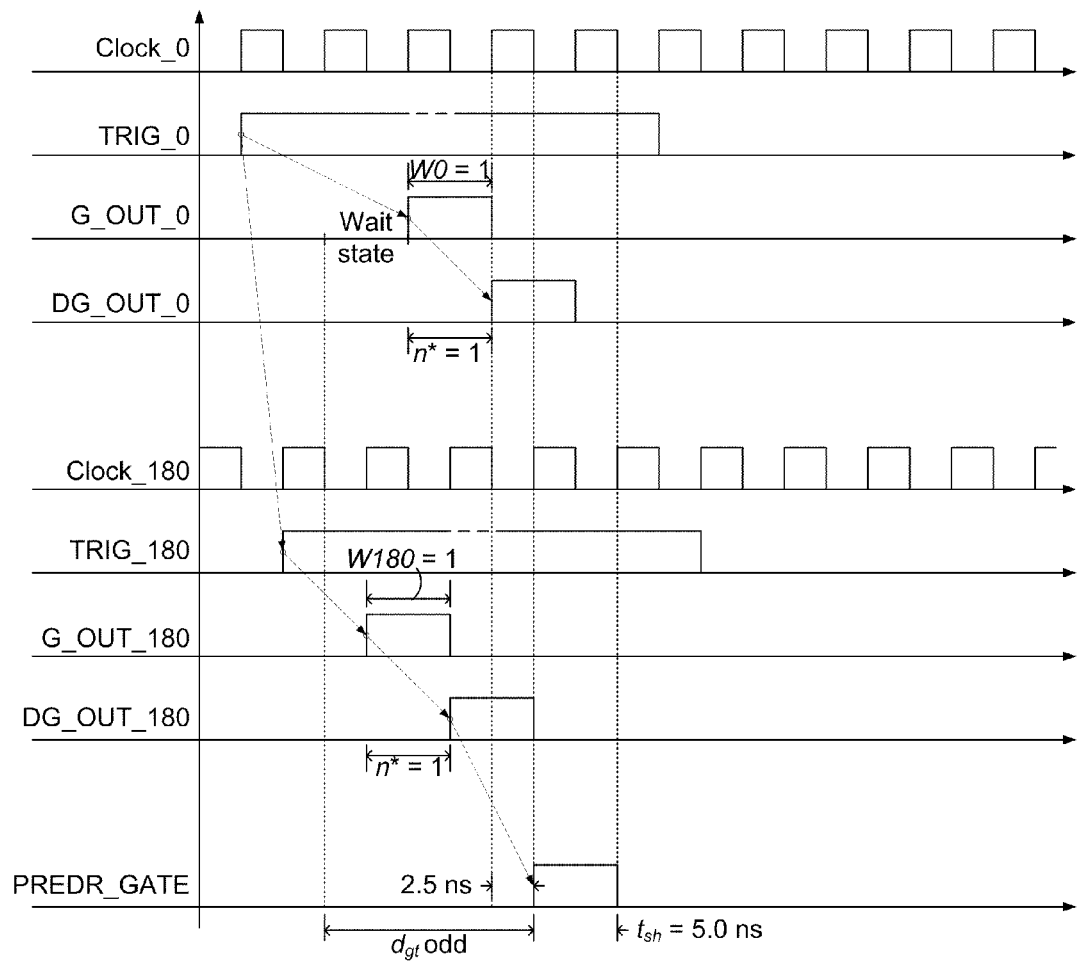
FIG. 23 is a timing diagram schematically illustrating the DDR PREDR_GATE output for w even, n odd.

On the other hand, it is worth noting that for any n even delay, the first and second gate state machines 118 and 120 may be programmed to output the combination W0=1, W180=1, and then W0=0, W180=0, which will produce 100 MHz fixed-amplitude QCW on PREDR_GATE when the input pair QCW_0, QCW_180 is asserted.

w even, n odd. Here, w=2 and n=3. Applying our rule, we have n*=1 for a line delay which is (1×5) ns, or (2×2.5) ns; and W0=1, W180=1. Also, since n is odd, there is one wait state added at the output G_OUT_0. The result is illustrated in FIG. 23 and shows that the PREDR_GATE pulse width is (2×2.5) ns and that, with respect to the case illustrated previously in FIG. 22, an additional 2.5 ns delay tap has now been added, which accounts for an odd delay value. For every other w even, the pulse width $t_{sh}$ is an even multiple of 2.5 ns. Similarly, for every other n odd, the delay $d_{gt}$ is an odd multiple of 2.5 ns.

On the other hand, it is worth noting that for any n odd delay, the first and second gate state machines 118 and 120 may be programmed to output the combination W0=1, W180=1, then W0=0, W180=0, which will produce 100 MHz fixed-amplitude QCW on PREDDR_GATE when the input pair QCW_0, QCW_180 is asserted.

1.1.4 Synchronization Sub-Module

Figure 24:
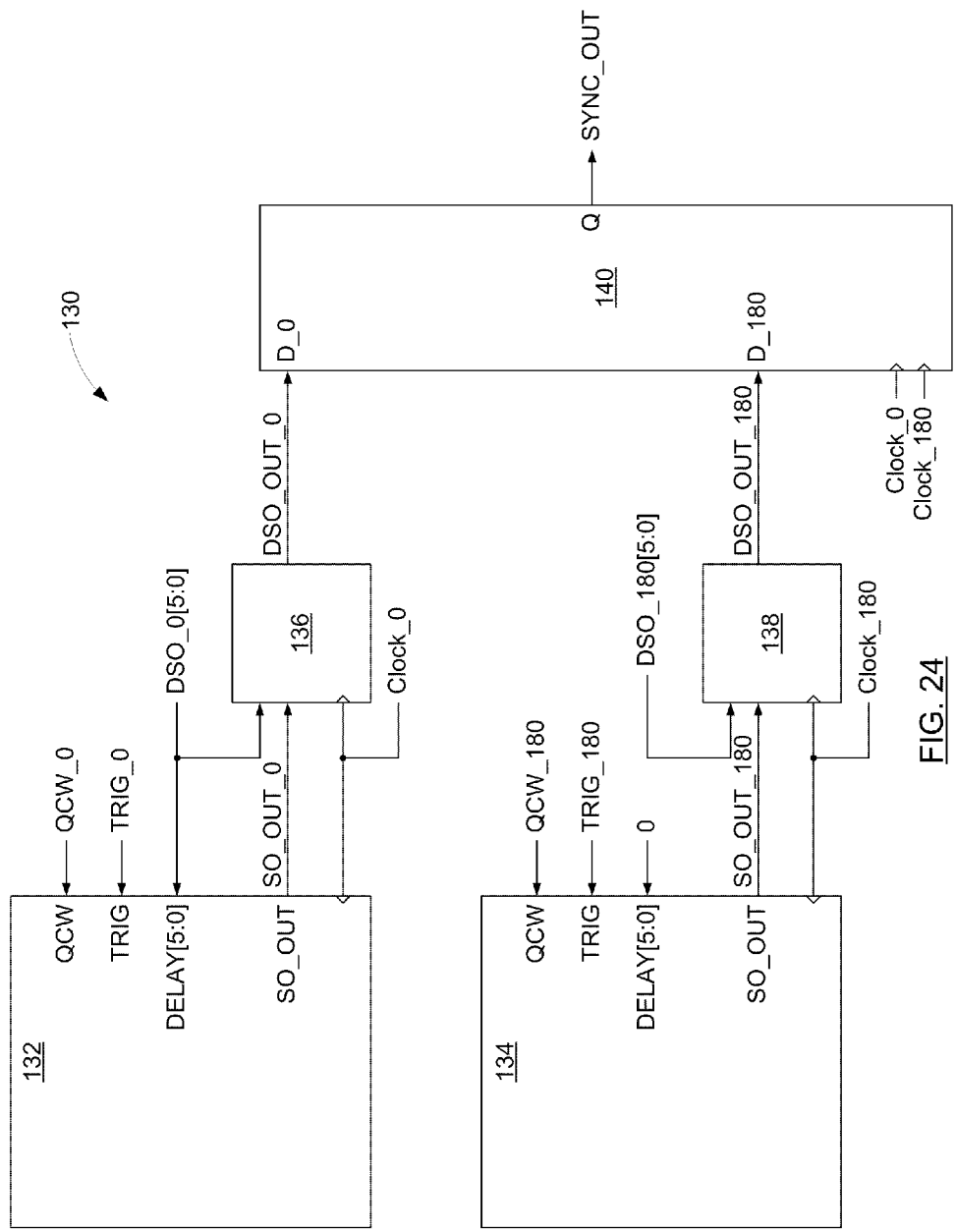
FIG. 24 is a block diagram of the synchronization sub-module according to an embodiment of the invention.

Optionally, with reference to FIG. 24, the shape generator may include a synchronization sub-module 130 for generating the trigger synchronization signal SYNC_OUT. Preferably, the output of the trigger synchronization signal output SYNC_OUT is either a logical 0, or a fixed amplitude pulse signal with an adjustable delay. In the preferred embodiment, the synchronization generator 130 includes a first and second parallely operated synchronization state machines 132 and 134, and corresponding variable synchronization delay line 136 and 138, each pair of synchronization state machine and corresponding synchronization delay line being operated together in the Clock_0 and Clock_180 domains. In the preferred embodiment, the variable delay lines 136 and 138 are preferably configured for a minimum fixed delay value of 245 ns, plus an adjustable delay ranging from 5 to 160 ns in steps of 5 ns.

The first and second synchronization state machines 132 and 134 are preferably controlled by asserting the QCW_0, QCW_180 input pair in order to force the synchronization outputs SO_OUT_0, SO_OUT_180 into the logical 0 state.

When the QCW_0, QCW_180 input pair is deasserted, the synchronization outputs SO_OUT_0, SO_OUT_180 of the first and second synchronization state machines 132 and 134 switch to fixed-amplitude pulse mode, synchronized to the occurrence of TRIG_0, TRIG_180.

The first and second synchronization variable delay lines 136 and 138 impose a delay DSO_0, DSO_180 on the corresponding synchronization output SO_OUT_0, SO_OUT_180, thereby generating a delayed synchronization output DSO_OUT_0, DSO_OUT_180.

In accordance with the adjustable delay $d_{so}$ and pulse width $t_{tr}$ shown in FIG. 2, the DSO_0, DSO_180 is a 6-bit integer n such that $$245\ ns + (n \times 2.5) ns = d_{so}$$

and the duration $t_{tr}$ of the pulse signal pair SO_OUT_0, SO_OUT_180 follows the duration of TRIG_0, TRIG_180 input pair.

A synchronization DDR switch 140 alternately outputs the delayed synchronization output DSO_OUT_0, DSO_OUT_180 from the first and second synchronization state machines 132 and 134 as the trigger synchronization signal SYNC_OUT. The first and second synchronization state machines 132 and 134 are programmed so that the delayed synchronization outputs DSO_OUT_0 and DSO_OUT_180, once combined into the synchronization DDR switch 140, will produce the desired granularity of 2.5 ns in the delay value $d_{so}$ of SYNC_OUT.

Referring back to FIG. 12, there is shown how the delay control module 128 provides the DSO_0, DSO_180 signal pair. In this embodiment, the first rule is to take only the five most-significant bits of DSO_0, DSO_180 to set the variable delay value of the delay lines. This is equivalent to delay the outputs of the state-machines by (n*×5) ns, where n* is half the greatest even integer less than or equal to n. Following this rule, the pulse output of the state-machine is always delayed by an even multiple of 2.5 ns.

The second rule is that for the case n odd, we further impose that there is one wait state prior to outputting the pulse at output SO_OUT_0 of the first synchronization state machine 132. As shown in FIG. 24, note that this condition will not apply to the instantiation of the second synchronization state machine 134, since its DELAY input is permanently tied to the logical 0 state.

Figure 25:
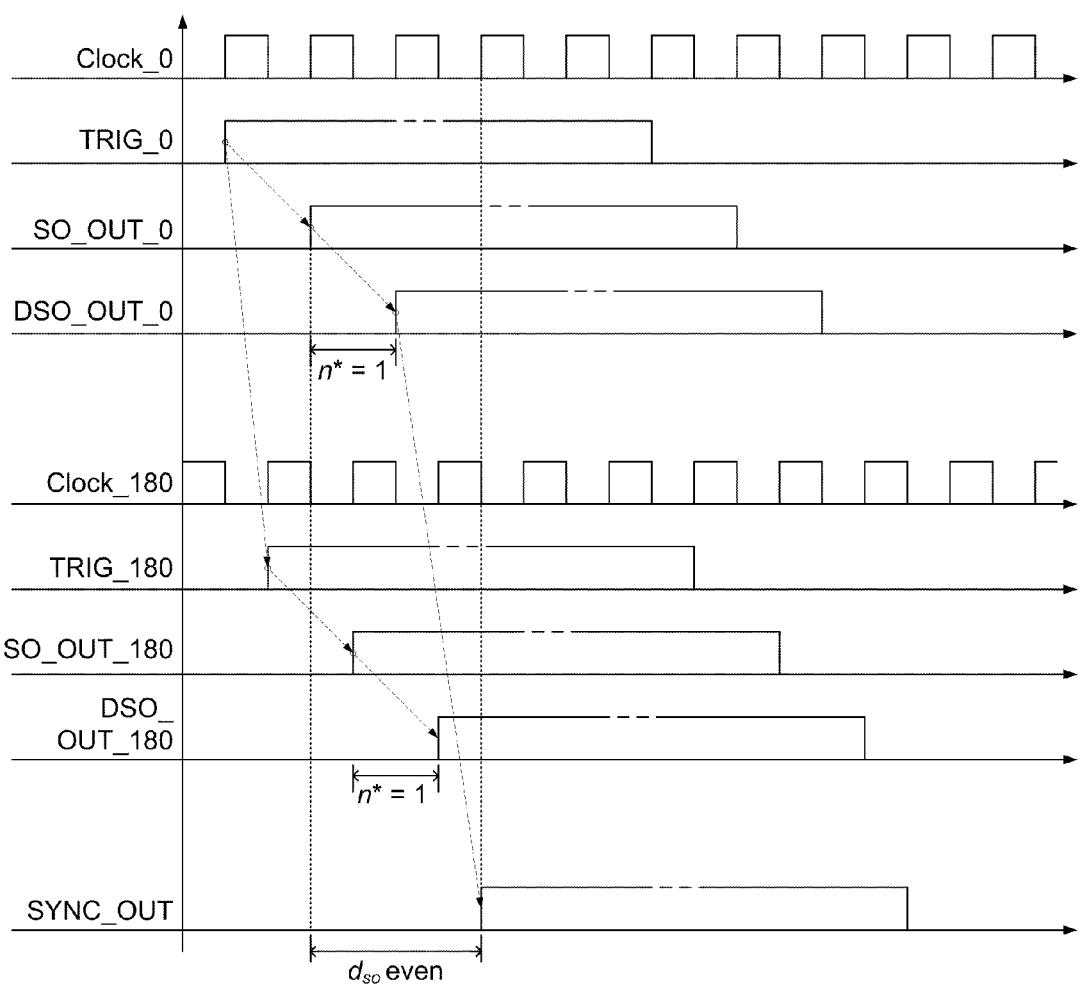
FIG. 25 is a timing diagram schematically illustrating the DDR SYNC_OUT output for n even.
Figure 26:
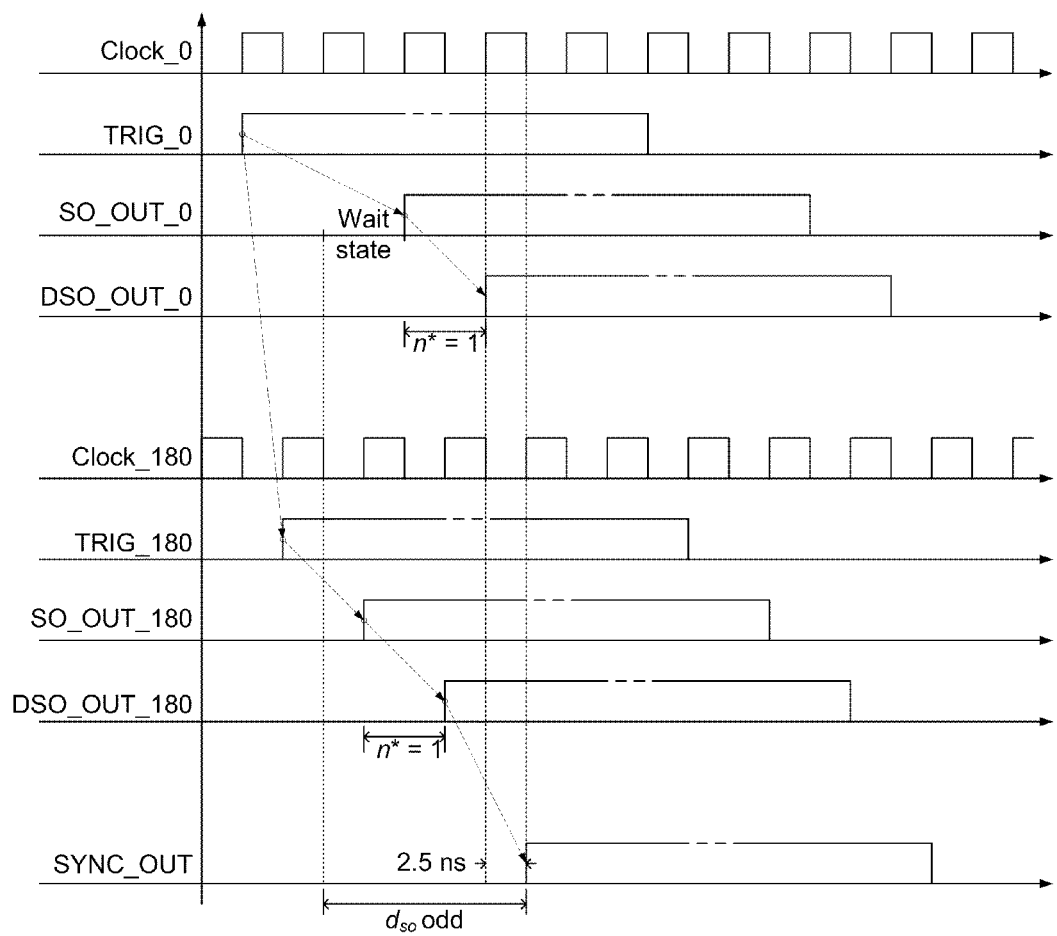
FIG. 26 is a timing diagram schematically illustrating the DDR SYNC_OUT output for n odd.

In FIGS. 25 and 26, it is shown that applying these rules makes it possible to generate the SYNC_OUT output with pulse delay values at a desired granularity of 2.5 ns.

n even. Here, we set n=2. Applying our rules, we get n*=1 for a line delay which is (1×5) ns, or (2×2.5) ns. As shown in FIG. 25, this produces a delay $d_{so}$ which is an even multiple of 2.5 ns and it is readily seen that for every other n even, the delay $d_{so}$ is an even multiple of 2.5 ns.

n odd. Here, we set n=3. Applying our rule, we get n*=1 for a line delay which is (1×5) ns, or (2×2.5) ns. Also, since n is odd, there is one wait state added at the output SO_OUT_0. The result is illustrated and FIG. 26 and shows that, with respect to the case illustrated previously in FIG. 25, an additional 2.5 ns delay tap has now been added which accounts for an odd delay value. It is readily seen that for every other n odd, the delay $d_{so}$ is an odd multiple of 2.5 ns.

1.1.5 QCW Control Module

Figure 10:
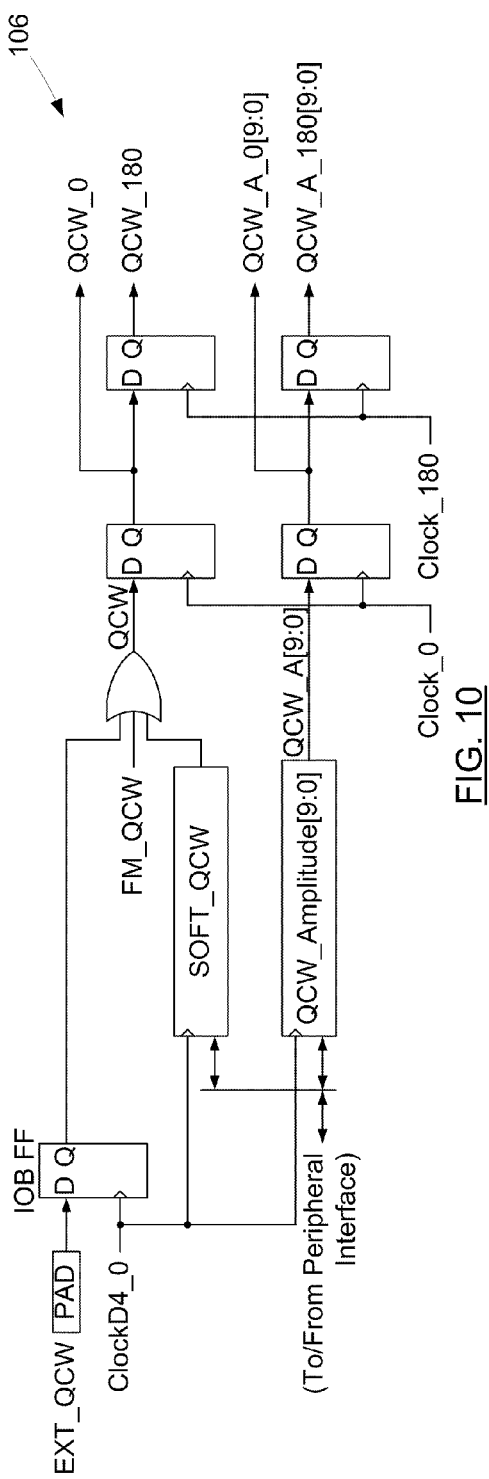
FIG. 10 schematically illustrates the DDR implementation of a QCW control sub-module according to an embodiment of the invention.

The shape generator preferably includes a QCW control sub-module 106 which is illustrated in FIG. 10, and which provides the signals QCW_0, QCW_180, QCW_A_0, and QCW_A_180. The QCW control sub-module 106 includes a QCW_Amplitude register 108 and a SOFT_QCW register 110. The output of the SOFT_QCW register 110 defaults to asserting QCW, and is logically OR-ed with the EXT_QCW hardware command and the FM_QCW command generated by the measurement of the frequency of the external trigger. All of EXT_QCW, FM_QCW and SOFT_QCW must be deasserted for pulse shaping to be enabled.

As illustrated in FIG. 10, the hardware/software assertion control and amplitude settings of the QCW mode are propagated down to the DDR QCW_0, QCW_180 and the QCW_A_0, QCW_A_180 signal pairs.

1.1.6 Shape Selection Sub-Module

FIG. 11 illustrates a shape-selection sub-module 142 through which the Shape A/B shape select command and the Shape A, Shape B software-selectable addresses are propagated down to the DDR hardware of the digital pulse shaping module. The resulting DDR signal pairs are, respectively, SHAPE_A/B_0, SHAPE_A_B_180 for shape select, SHAPE_A_ADDR_0, SHAPE_A_ADDR_180 for shape A address and SHAPE_B_ADDR_0, SHAPE_B_ADDR_180 for shape B address.

Referring back to FIG. 3A, other components of a digital pulse shaping module 52 according to a preferred embodiment of the invention will now be described in more detail.

As suggested above, one skilled in the art will understand that other embodiments of the invention may be considered to provide the user with much higher output sampling rates, hence higher temporal resolution than what has been presented so far. One principle of interest put forward in the embodiments of the invention described above is that time-critical aspects of high-speed pulse shaping involve digital state-machines that output data to sequential elements located in the I/O blocks of the FPGA. The more recent FPGA components such as the Virtex-5 (trademark) from Xilinx now include sequential primitives like the IOSERDES in their I/O blocks. These allow DDR output at an effective rate higher than 1 GSPS. Although it might be necessary to store pulse shape data in memory in a different way than the one described above, the IOSERDES primitive might certainly be used in an embodiment of this invention that would achieve sub-nanosecond temporal resolution for QCW and pulse shaping.

1.2 Clock Generator

The clock generator 56 is preferably driven at power-on startup by the startup clock signal EXT100 MHz from the external oscillator 74 (see FIG. 1). A clock input signal, FPGA_CLK, at 200 MHz in the preferred embodiment, is used as a timing reference to output the phase-related clock signals Clock_0, Clock_90, Clock_180 and Clock_270.

Preferably, the clock generator 56 also outputs a slow clock signal ClockD4_0, at 50 MHz in the preferred embodiment. The slow clock signal CLKD4_0 is used mainly for clocking the slower elements in the design, such as the microcontroller 62, the registers 84 and memory buffers 86.

In one embodiment, the clock generator 56 is based on a Digital Clock Manager (DCM) primitive available in state-of-the-art FPGA components. The DCM is configured to output the five clock signals Clock_0, Clock_90, Clock_180, Clock_270 and ClockD4_0.

Figure 4:
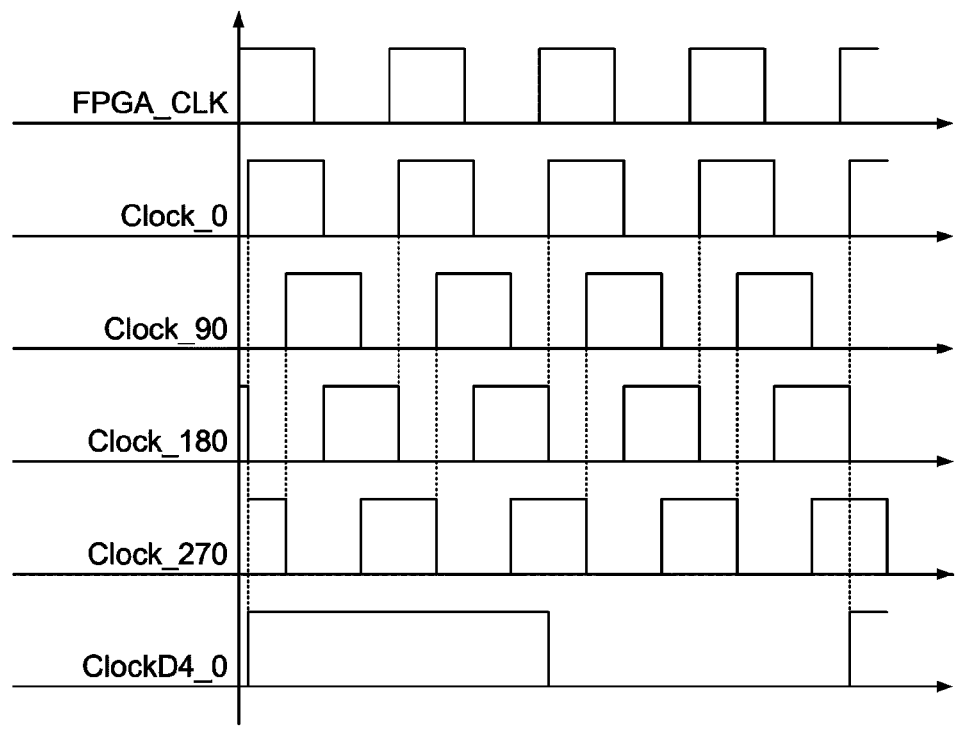
FIG. 4 is a graph schematically illustrating the phase-related clock signals outputted by the clock generator according to a preferred embodiment of the invention.

Referring to FIG. 4, Clock_0, Clock_90, Clock_180 and Clock_270 preferably have the same frequency as FPGA_CLK, namely 200 MHz in the preferred embodiment. ClockD4_0 is at 50 MHz. Apart from a negligible latency, Clock_0 is a copy of the 200 MHz input FPGA_CLK. There is a strict phase relation among the outputs of the DCM: ClockD4_0 is in phase with Clock_0, Clock_90 is lagging Clock_0 by a quarter of a period, or 1.25 ns, Clock_180 is lagging Clock_0 by half a period, or 2.5 ns and Clock_270 is lagging Clock_0 by three quarters of a period, or 3.75 ns.

The five outputs of the clock generator 56 are used to clock all the synchronous elements throughout the system, such as flip-flops, processor, or memories. Moreover, one skilled in the art and familiar with FPGAs knows that the software tools of the FPGA vendor take into account the phase relation between the different clock domains as defined in FIG. 4. As a consequence, the place-and-route of the design is performed iteratively so as to resolve any setup and hold time issue between synchronous elements, even if located in different clock domains, until reliable timing closure is achieved.

The 200 MHz Clock_0 and Clock_180 are the main clocks used to generate either a QCW or pulse shape as the digital shape signal DAC_D. The phase-relation between these two clocks is purposely set to one half-period in order to create a double data rate output for the samples sent to the DAC.

The 200 MHz Clock_90 and Clock_270 are used to create the DAC clock signal DAC_CLK for proper data setup and hold times in the source synchronous interface between the FPGA and the DAC.

As mentioned above, in the preferred embodiment, an external 100 MHz signal, EXT100 MHZ, is used for startup at power-on. Its only use is for clocking an elementary state-machine who releases system reset once (1) the DCM has locked on the FPGA_CLK input and (2) the DCM outputs are ready to clock the digital pulse shaping module 52.

1.3 Frequency Measurement Module

The digital pulse shaping module 52 preferably includes a frequency measurement module 96 (see FIG. 1), which is preferably embodied by a state-machine having an internal counter clocked at 50 MHz. The frequency measurement module 96 asserts a QCW output flag FM_QCW, to force the QCW output mode when the frequency of the external trigger signal EXT_TRIGGER is outside of a pre-defined range.

Figure 5:
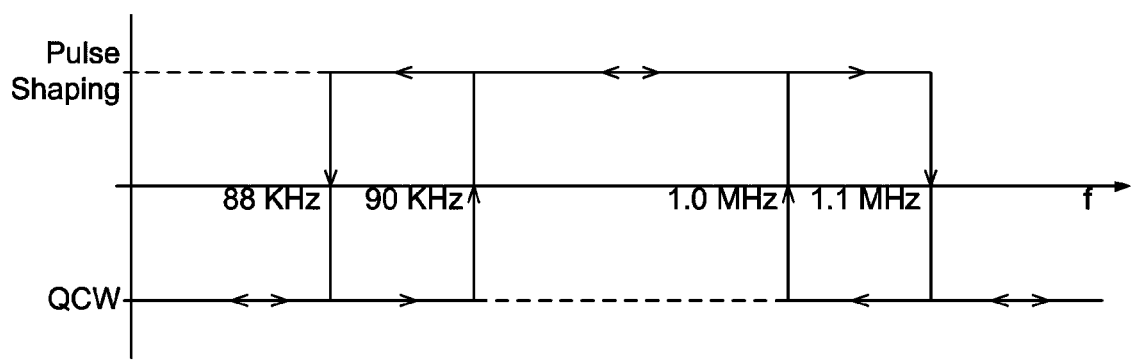
FIG. 5 shows a hysteresis output transition diagram for the frequency measurement module of the digital pulse shaping module of FIG. 3.

Preferably, the frequency range of EXT_TRIGGER for which the QCW output flag FM_QCW is asserted is lower and upper bounded with hysteresis. For example, the transition diagram in FIG. 5 shows that the FM_QCW output is asserted when the frequency of the EXT_TRIGGER input decreases below 88 KHz or increases beyond 1.1 MHz. Reciprocally, the FM_QCW output is deasserted when the EXT_TRIGGER frequency increases beyond 90 KHz or decreases below 1.0 MHz.

In the preferred embodiment, it is up to the user to activate or de-activate the frequency monitoring function just-described. When monitoring is de-activated, no assertion of the FM_QCW signal will occur.

1.4 Microcontroller

Figure 6:
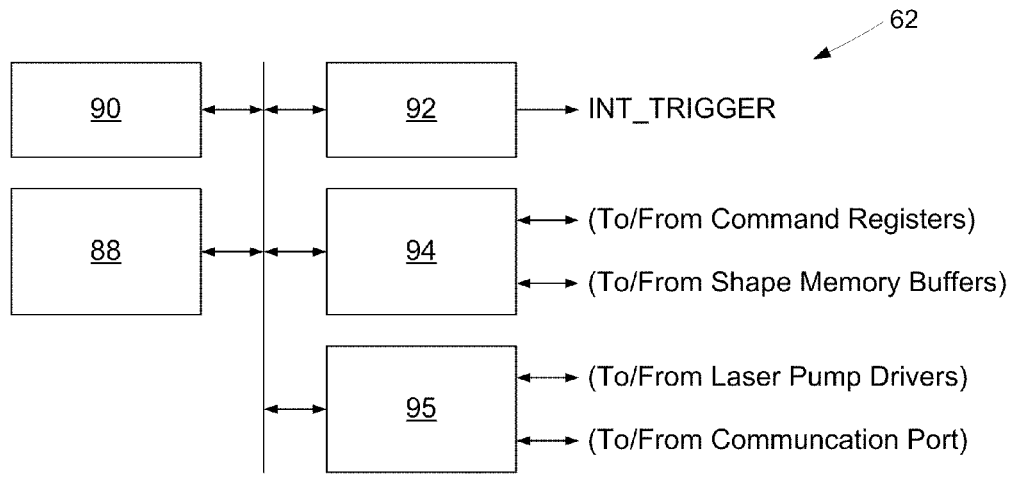
FIG. 6 schematically illustrates the architecture of an embedded microcontroller according to one embodiment of the invention.

The microcontroller 62 preferably has an embedded architecture as shown in FIG. 6. In the preferred embodiment, it is implemented in the FPGA around a CPU core 88, such as for example a Power PC 405 (trademark) from IBM. The platform of the microcontroller 62 is preferably tailored with the number and the type of peripherals needed by connecting FPGA vendor-supplied peripheral cores to the CPU address/data bus. First, a Program Memory core 90 is included for storing the programmed executable code for the CPU 88. A Timer core 92 is used for generating an internal shape trigger signal INT_TRIGGER. A Peripheral Interface core 94 is connected to the CPU 88 to perform address decode and generate read/write control signals for data access to/from the command registers and the shape memory buffers. Communications with the laser pump drivers and the host are implemented with UART interfaces 95.

1.5 Command Registers and Control Signals

Figure 7:
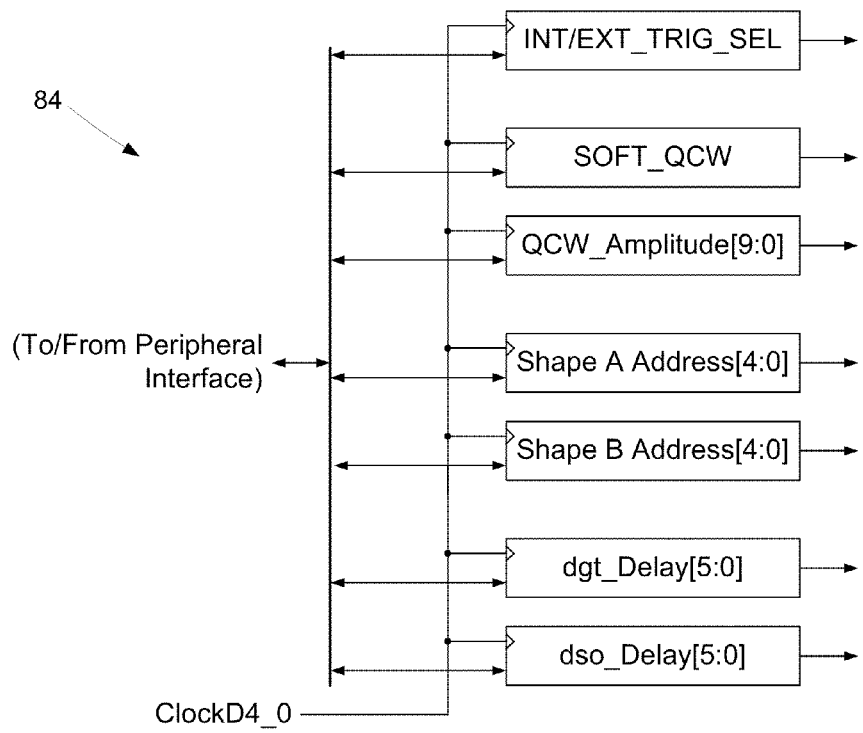
FIG. 7 schematically illustrates a command read/write register set according to an embodiment.

Referring to FIG. 7, there is shown a preferred embodiment of the command registers 84 for use in a digital shaping module according to FIG. 3. Preferably, the command registers 84 are embodied by read/write registers which are connected to the Peripheral Interface 94 of the microcontroller 62 (see FIG. 6). As such, they are clocked by the 50 MHz ClockD4_0. The registers 84 are used for software-control of the QCW or pulse shape output modes on SHAPE, GATE and SYNC_OUT outputs, together with the external hardware command signals EXT_QCW, EXT_TRIGGER and SHAPE_A/B (see FIG. 2).

In the section below, the role of the command registers is outlined, with respect to the main functional aspects such as triggering the pulse shapes, switching between QCW and pulse shaping, and switching between shape A and shape B. It will be understood by one skilled in the art that the command registers 84 as described is given by way of example only. In addition, other command registers might be present in the platform for other useful purposes, but their description is not essential to the understanding of the present invention.

Referring to FIG. 7, the registers are described as follows:

INT/EXT_TRIG_SEL: for selecting the external or the internally generated pulse trigger.

SOFT_QCW: allows QCW output mode to be set by user software command.

QCW_Amplitude[9:0]: 10-bit register for setting the amplitude of the 100 MHz QCW square wave signal.

Shape A Address[4:0]: 5-bit register for setting the address of Shape A among the 32 available shapes.

Shape B Address[4:0]: 5-bit register for setting the address of Shape B among the 32 available shapes.

dgt_Delay[5:0]: 6-bit register for setting the delay value $d_{gt}$ of GATE after SHAPE.

dso_Delay[5:0]: 6-bit register for setting the delay value $d_{gt}$ of SYNC_OUT after SHAPE.

The command registers are clocked by the 50 MHz ClockD4_0 for read/write accesses by the CPU through the Peripheral Interface. For proper operation of the QCW or pulse shaping in double data rate mode, the state of the register must propagate down to the time-critical 200 MHz Clock_0 and Clock_180 clock domains altogether. This is accomplished by using cross-domain synchronization flip-flops.

Figure 8:
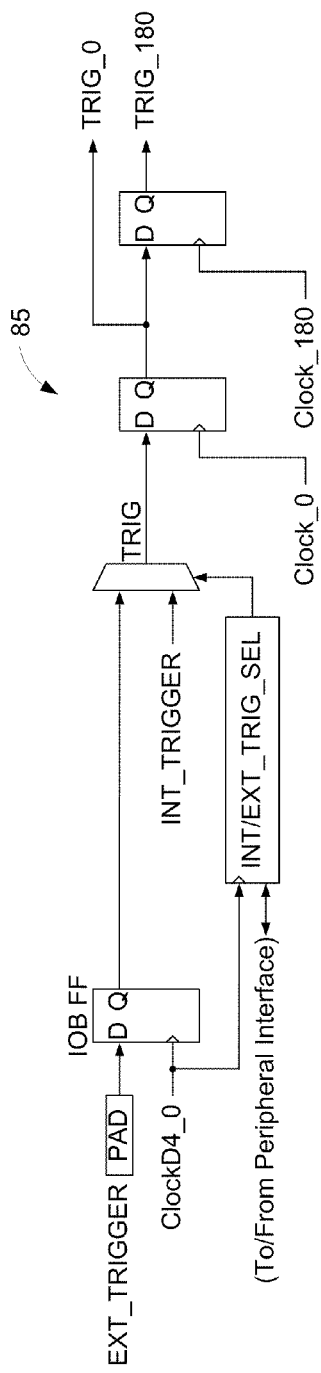
FIG. 8 schematically illustrates a DDR implementation of an internal/external pulse trigger.

FIG. 8 shows an internal/external trigger sub-module 85 according to an embodiment of the invention, where synchronization flip-flops are used in the case of the external and internal pulse shape triggers, together with the INT_EXT_TRIG_SEL register.

First, as shown at the left-hand side of FIG. 8, the EXT_TRIGGER connected to the pad of the FPGA is synchronized to the 50 MHz ClockD4_0 right after entering the FPGA. This is done by using a dedicated input flip-flop located into the I/O block (IOB FF) of the FPGA.

The internally-generated trigger INT_TRIGGER (FIG. 6) and the trig-select output of register INT/EXT_TRIG_SEL, by definition, are synchronized to ClockD4_0. The trig-select output of the register orders a multiplexer to output either INT_TRIGGER or the synchronized EXT_TRIGGER. Since there is a well-defined phase-relationship between all clock signals, the TRIG output of the multiplexer is synchronous with respect to all three clocks ClockD4_0, Clock_0 and Clock_180 and it can be readily propagated down to the TRIG_0 TRIG_180 signal pair through the synchronization flip-flops.

Figure 9:
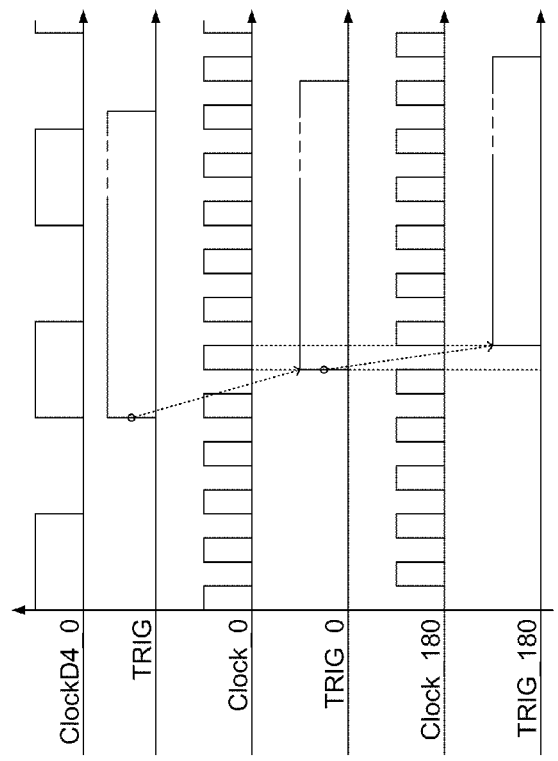
FIG. 9 is a timing diagram showing signal synchronization from the 50 MHz to 200 MHz time-critical clock domains.

FIG. 9 illustrates that under the effect of the synchronization flip-flops, when a signal transition occurs in the ClockD4_0 domain, it is followed by a corresponding transition of the signal pair in the Clock_0, Clock_180 domains. This typical dual-propagation principle is useful for the proper generation of the QCW or the pulse shapes at double data rate and it is used extensively throughout the practical implementation of this invention.

1.6 Shape Memory Buffers

Figure 13:
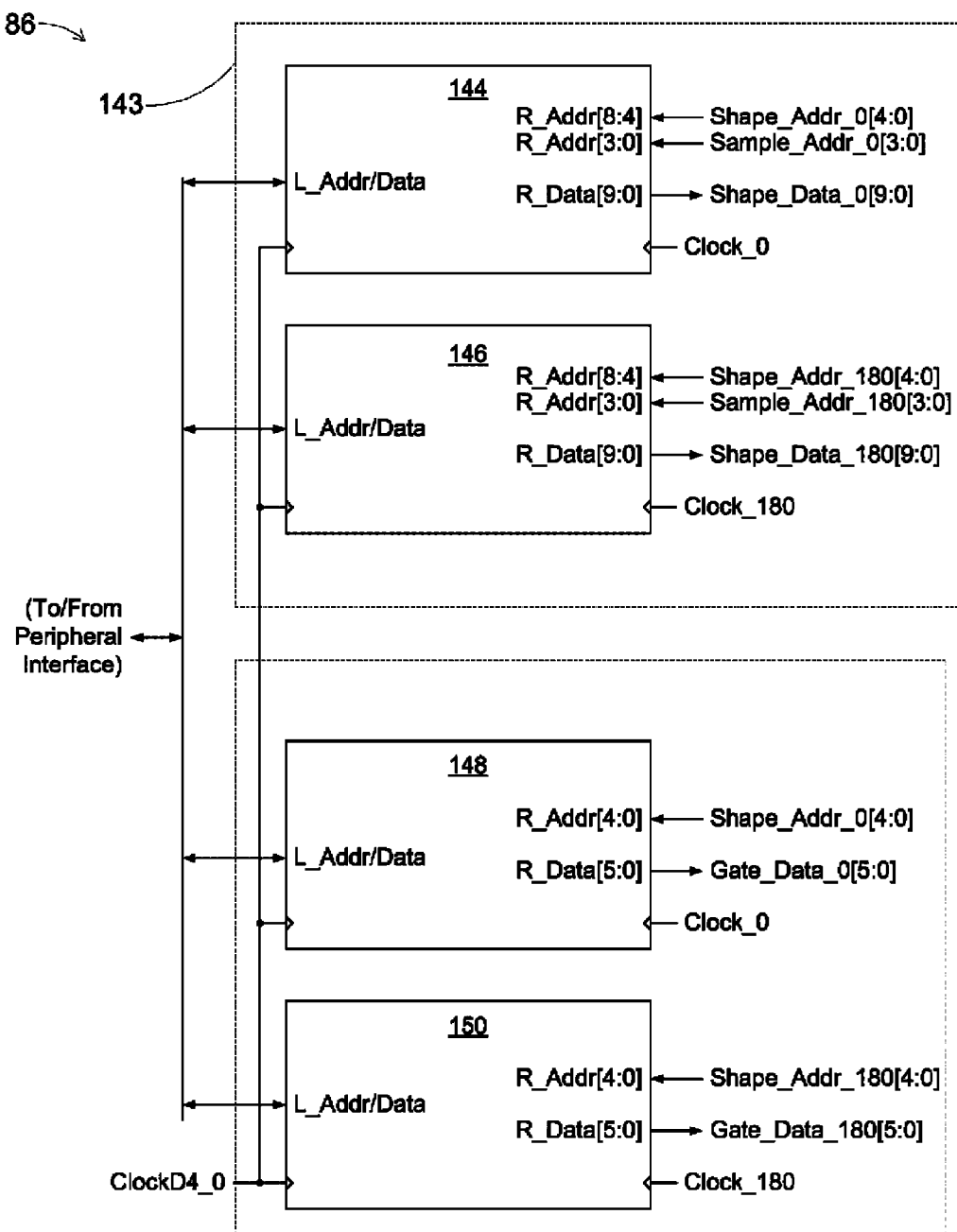
FIG. 13 schematically illustrates a dual-port pulse shape memory buffer.

Referring to FIG. 13, there is shown a shape memory buffer 86 according to an embodiment of the invention. The shape memory buffer 86 stores a plurality of predetermined waveforms Shape_Data, which are provided to the shape state machines of the shape sub-module upon selection.

The shape memory buffer 86 according to the illustrated embodiment includes two components, a pulse shape data buffer 143 storing the digital samples of the pulse shapes that are output on the SHAPE port, and a pulse duration data buffer 147 for storing the pulse durations $t_{sh}$ of the pulses shapes (Refer to FIG. 2). This data is used to output the fixed-amplitude pulse signal on the GATE port. Each of data buffers 143 and 147 includes even and odd memory components 144, 146 and 148, 150.

The four memory components 144, 146, 148 and 150 are preferably dual-port type with their left port used for read/write accesses through the CPU's Peripheral Interface previously outlined with respect to FIG. 6. The left port of these memories, therefore, is clocked at 50 MHz by ClockD4_0, and it is used primarily for initializing the pulse shapes and the pulse durations.

In one embodiment, the shape memory buffer 86 is configured in the FPGA for a capacity of 32 shapes and 32 corresponding pulse durations. Each of the 32 pulse shapes is user-defined with 32, 10-bit samples, and each of the 32 pulse durations has a 6-bit value n, such that (n×2.5) ns is equal to the duration $t_{sh}$ of the corresponding pulse shape.

The even pulse shape buffer component 144 of the pulse shape data buffer 143 contains the even-indexed samples of the shapes, while the odd pulse shape buffer component 146 contains the odd-indexed samples. More specifically, if a shape has 32 consecutive samples indexed as S(0), S(1), S(2), . . . , S(30), S(31), then the 16 even-indexed samples S(O), S(2), . . . , S(30) are stored in the even pulse shape buffer component 144 and the odd indexed samples S(1), S(3), . . . , S(31) are stored in the odd pulse shape buffer component 146.

This partitioning of the pulse shape data buffer 143 is defined for the practical implementation of the double data rate output to the DAC. To this end, it is to be noted that the right port of the even pulse shape buffer 144 is clocked at 200 MHz by Clock_0 and that the right port of the odd pulse shape buffer 146 is clocked at 200 Mhz by the shifted Clock_180.

The right port of each of the pulse shape data buffer components 144 and 146 is read-only. It is connected to the shape generator 58 shown in FIG. 3A and described above. Shape generator supplies the shape addresses Shape_Addr_0, Shape_Addr_180, the sample addresses Sample_Addr_0, Sample_Addr_180 and reads the data out of the memory.

The 5-bit Shape_Addr_0[4:0] is for selecting one shape among the 32 shapes available. In the even pulse shape buffer 144, the 4-sample Shape_Addr_0[3:0] are for addressing each of the 16 even-indexed samples of the addressed shape. Data is read out of memory on the 10-bit bus Shape_Data_0.

Similarly, Shape_Addr_180[4:0] and Sample_Addr_180[3:0] are for doing the equivalent on the odd pulse shape buffer 146. Data is read out of memory on the 10-bit bus Shape_Data_180.

The pulse duration data buffer 147 is similarly implemented in the even and odd pulse duration buffer components 148 and 150. These two buffers components 148 and 150 are provided two keep with the double data rate approach that is put forward in this embodiment of the invention. Hence, the even pulse duration buffer component 148 is clocked by Clock_0, while the odd pulse duration buffer component 150 is clocked by Clock_180.

Both pulse duration buffer components 148 and 150 preferably contain 32 values. For a given address, the 6-bit value stored at this address is the same in both even and odd components 148 and 150, and is preferably a 6-bit integer n such that (n×2.5) ns is equal to the duration $t_{sh}$ of the corresponding pulse shape. As with the pulse shape data buffer 143, the shape generator 58 of FIG. 3A is responsible for generating the addresses for the pulse duration data buffer 147 and for reading its data output. FIG. 13 clearly illustrates that Shape_Addr_0 will simultaneously address a given pulse shape data and its duration since the shape address seen by both buffer components 144 and 148 is the same. Similarly Shape_Addr_180 simultaneously addresses a given pulse shape data and its duration on the odd pulse shape component 146 and odd pulse duration component 150.

Finally, it is to be noted that the data bus outputs of the even and odd components 148 and 150 have been named, respectively, Gate_Data_0 and Gate_Data_180, since these information are used in the generation of the fixed-amplitude pulse output on the GATE port of the digital pulse shaping module.

2. Service Mode

As mentioned above, in one embodiment of the invention the digital pulse shaping module operates either in a SERVICE mode or in a USER mode.

Referring back to FIG. 1, according to one embodiment of the invention, in SERVICE mode, the software on the host computer 76 allows the user to define up to 32 arbitrary pulse shapes of his choice. Each shape is written as 32, 10-bit consecutive samples in the memory buffer of the digital pulse shaping module 52. Such fine granularity in the adjustable amplitudes of the sample enables very precise optical shapes to be output by the instrument. The software can select either the internal or the external EXT_TRIGGER input to trig the shapes out of the digital pulse shaping module 52 to the laser source 54.

Each sample in a shape is 2.5 ns long so that a shape output by the digital pulse shaping module 52 has length varying between 2.5 and 80 ns. This allows internal or external triggering of the pulse shapes at a rate faster than 10 MHz.

Optionally, appropriate components such as a power splitter and a photodetector can be used in order to implement in the laser source 54 an output port for an analog electrical signal whose shape matches the optical shape output at OPTICAL_SH_OUT. This is the purpose of the FDBCK output appearing on the laser source 54, as illustrated in FIG. 1. By connecting this FDBCK signal to a display such as an oscilloscope, the user gets a visual feedback so that corrections can be sent to the digital pulse shaping module 52 to perform fine tuning in real-time of the optical pulse shaping at OPTICAL_SH_OUT.

The software preferably on the host computer 76 also preferably allows the user to select two shapes among the 32 pulse shapes available. These are defined as Shape A and Shape B and they are provided for being output alternately on the SHAPE port under the action of the external SHAPE_A/B signal input. Once selected by the user, Shape A and Shape B addresses are stored in the registers internal to the digital pulse shaping module 52. This allows dynamic switching from Shape A to Shape B at a rate faster than 10 MHz.

Finally, the amplitude of the QCW output can be set by writing to a specific register, in case the register's default value is not suitable for the application.

It must be noted that other embodiments of this invention might implement pulse shaping with more than 10 bits per sample, more than 32 samples per shape, or more than 32 shapes. This simply is a matter of system architecture as it is defined in the HDL coding of the FPGA component.

In order to make the digital pulse shaping module 52 adaptable to different laser source architectures, the software on the host preferably allows the user to define the timing parameters for the GATE output.

Referring to FIG. 2, the value of the delay $d_{gt}$ of GATE with respect to SHAPE is user-selectable by writing to a single register internal to the digital pulse shaping module 52. The allowed value for $d_{gt}$ is in the range 170 ns up to 327 ns in steps of 2.5 ns.

On the other hand, the digital pulse shaping module 52 may provide a memory buffer for storing 32 values for the duration $t_{sh}$ of GATE, as explained above. Each of these 32 values for $t_{sh}$ must be equal to the duration of each of the 32 pulse shapes. When a given pulse shape of duration $t_{sh}$ is triggered to be output on SHAPE, the corresponding fixed-amplitude pulse of equal duration $t_{sh}$ is simultaneously triggered to be output on GATE, after a delay equal to $d_{gt}$. Accordingly with the allowed shape durations described above, the allowed value for $t_{sh}$ is from 2.5 ns up to 80 ns in steps of 2.5 ns.

It must be noted that other embodiments of this invention might implement different ranges of values for $d_{gt}$ and $t_{sh}$. Moreover, the GATE output is not restricted to a fixed amplitude signal. In another embodiment of the invention, it could as well be designed and implemented as an arbitrarily shaped signal.

The software on the host computer 76 may also allow the user to set the value of the delay $d_{so}$ after SHAPE for the SYNC_OUT pulse (refer to FIG. 2). The digital pulse shaping module 52 contains a single register for writing the value of $d_{so}$. The allowed value for this parameter is preferably in the range 245 ns up to 403 ns in steps of 2.5 ns.

The SYNC_OUT pulse has nominally the same duration $t_{tr}$ as the EXT_TRIGGER input. Other embodiments of this invention might implement different ranges of values for $d_{so}$ and $t_{tr}$.

3. User Mode

Referring still to FIG. 1, once shapes, timing parameters and shape addresses have been defined in the memories and registers of the digital pulse shaping module 52, the digital pulse shaping module 52 is ready to be set in USER mode for material processing. In USER mode, the external user equipment 72 can drive the digital pulse shaping module 52 through the connector interface 70. The default output mode on SHAPE and GATE is preferably square-wave 100 MHz QCW. In the preferred embodiment, this mode has priority over pulse shaping.

4. Pulsed Laser Source

Numerous pulsed laser source architectures can be controlled by the digital pulse shaping module so as to constitute a complete industrial laser system having all desirable embedded functionalities for a given laser processing application. Exemplary embodiments are described below. It will be obvious to those ordinary skilled in the art that many changes may be made to the details of the pulsed laser source architectures that are presented in this document without departing from the scope of this invention.

4.1 Pulsed Laser Source Based on Electro-Optic Modulators and CW Seed Source

Figure 27:
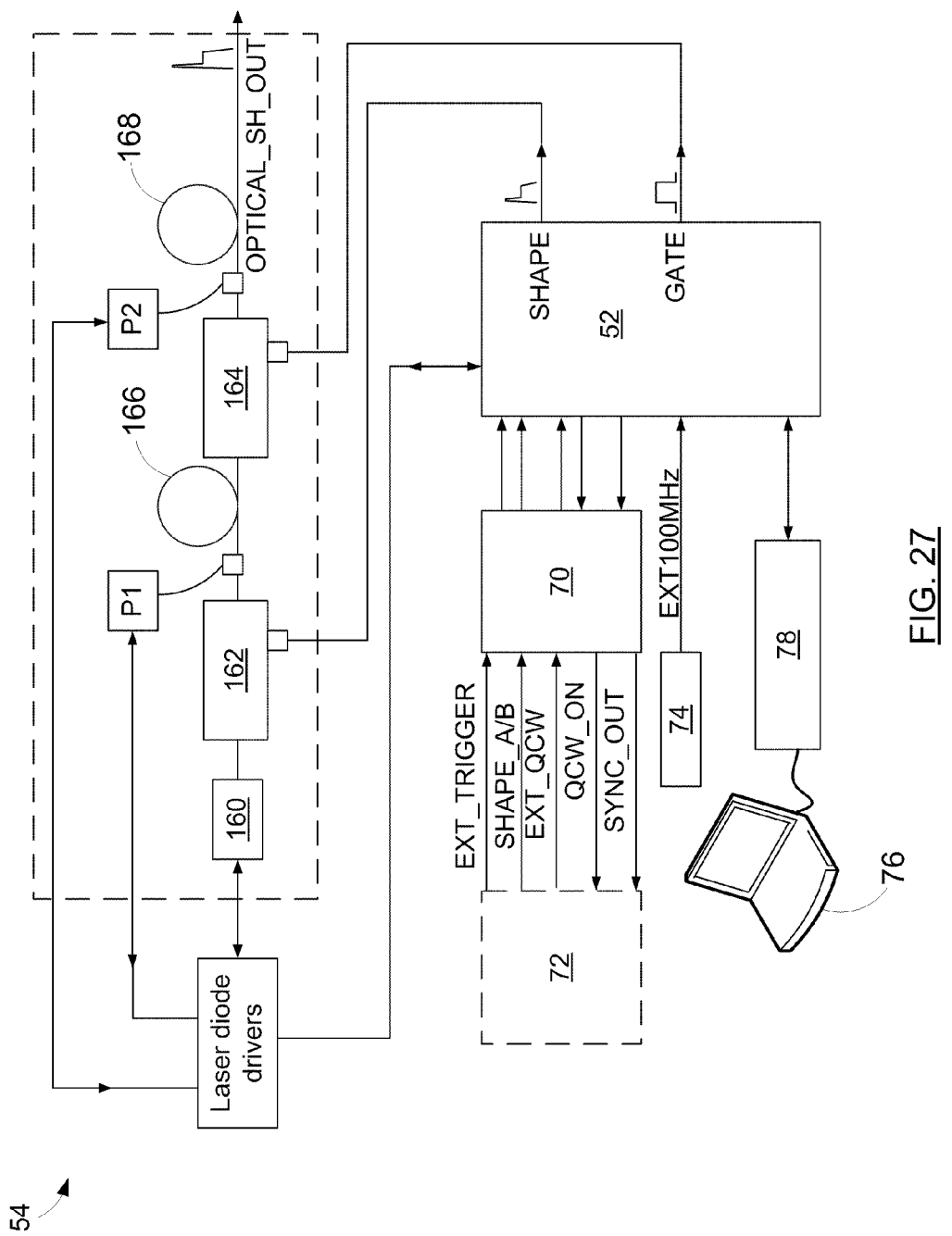
FIG. 27 schematically illustrates an embodiment of the present invention including a pulsed laser source employing two electro-optic modulators and a seed laser diode operated in the CW regime.

Referring to FIG. 27, in a first embodiment the pulsed laser source 54 includes a seed source 160 operated in the CW regime and two electro-optic modulators 162 and 164.

The seed source 160 is preferably a continuous wave (CW) seed light source generating a continuous light beam. Preferably, the seed light source 160 is a laser diode, but any other light source generating an appropriate continuous beam could be considered, such as for example a filtered ASE source, a superfluorescent source, a CW fiber laser or a fiber coupled CW bulk solid-state laser source. The continuous light beam preferably has a spectral shape which will determine the spectral shape of the light outputted by the entire pulsed light source. Advantageously, the laser diode may be selected or replaced depending on the required spectral profile of the outputted light. Alternatively, a wavelength tunable diode may be used. Additional components may optionally be provided downstream the laser diode to modify its spectral shape. An optical isolator may also be provided downstream the seed laser diode to prevent feedback noise from reaching it.

Figure 28:
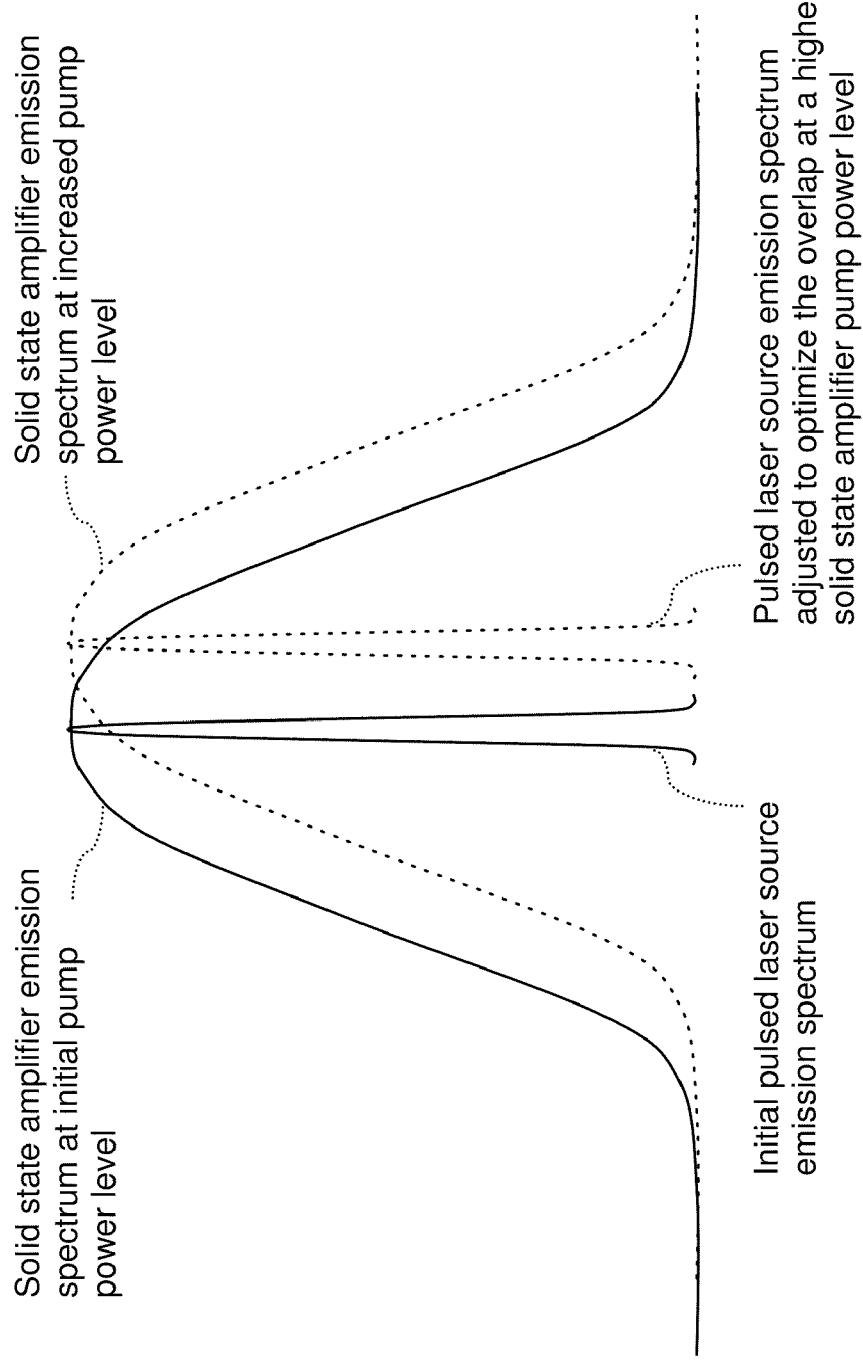
FIG. 28 schematically illustrates the pulsed laser source emission wavelength tuning for amplification in a solid state optical amplifier.

In one exemplary embodiment, the seed source is an external cavity semiconductor laser diode with a central emission wavelength of 1064.3 nm and a nominal output power of 100 mW. The emission is single longitudinal mode with a fairly narrow line width (less than 10 MHz). The emission wavelength can be easily fine-tuned by the user with a simple user command giving access to the seed laser diode operating temperature. This functionality, preferably embedded in the digital pulse shaping module, has been used for example in a memory repair application where the pulsed laser source output was amplified with a Nd:YVO$_4$ solid state amplifier (See patent WO 2008/014331). In such a configuration, the overlap of the pulsed laser source emission spectrum with respect to the relatively narrow spectrum (~0.5 nm FWHM) of the solid state medium should be controlled for optimizing the amplification, especially under different pumping conditions of the crystal. With increasing pump power, the crystal gain spectrum tends to shift to higher wavelengths. In the mentioned application, the emission wavelength flexibility provided by the embedded laser platform is used to fine-tune the pulsed laser source emission wavelength with a simple user command sent by a computer, in order to optimize the spectral overlap of the source with respect to the solid state amplifier gain spectrum under varying pumping conditions (see FIG. 28). In typical conditions, the seed laser diode wavelength shifts by about 50 pm when changing the diode operating temperature by 1° C. The laser platform provides a resolution of 0.1° C. for the laser diode operating temperature set point, thus allowing for a resolution of about 5 pm in the wavelength adjustments. In another embodiment, the seed source is a Fiber Bragg Grating (FBG) stabilized laser diode emitting at 1064.3 nm with a nominal output power of 150 mW. The FBG temperature is controlled with a resolution of 0.1° C. with a user command, also allowing for fine wavelength tuning by the user.

Those embodiments are particularly suitable for applications requiring a great stability of the pulsed laser source spectrum under change of the conditions of operation (e.g. pulse repetition rate, pulse shape, quasi-CW vs pulsed operation, etc.) since the seed laser diode spectrum is not affected by the modulation as it would be for those configurations where the seed diode current is modulated.

Referring back to FIG. 27, the pulsed laser light source 54 further includes a first modulator 162 for temporally modulating the continuous light beam, and thereby generate a plurality of optical pulses defining a pulsed light beam. The created optical pulses have a pulse shape determined by the amplitude profile of the SHAPE signal outputted by the digital pulse shaping module 52 which drives the RF port of the modulator as will be explained further below. The first amplitude modulator 162 is preferably a Lithium Niobate Mach-Zehnder electro-optic modulator of the APE type having a bandwidth of at least 3 GHz at 1064 nm with an On/Off extinction ratio of at least 25 dB. Such modulators are suitable devices for generating optical pulses with controlled features at the nanosecond scale. In other embodiments, other modulation scheme, such as based on an acousto-optic modulator, an electroabsorption modulator, etc. could also be considered. The optical input port of the first modulator 162 is optically coupled to the CW source 160 to receive the continuous light beam therefrom. Preferably, the whole pulsed fiber source 54 is an all-fiber source, but it will be understood by one skilled in the art that additional optical components such as mirrors, lenses, spectral shaping elements or any other appropriate element may be provided between the CW light source and the first modulator without departing from the scope of the present invention.

As explained above, each of the drive pulses outputted by the SHAPE output of the digital pulse shaping module has an adjustable width $t_{sh}$, defining the period of time the modulator will be open to allow passage of light, and a shape, which is used to shape the intensity of the light allowed to pass through the modulator 162 during the period of time the modulator is open. In the preferred embodiment, a digital pulse shape is programmed in the digital pulse shaping module 52 with a time resolution of 2.5 ns or better and a minimum amplitude resolution of 10 bits. The shape address is programmed using a computer with a simple command or with a user interface where the number of temporal bins as well as their corresponding amplitudes are determined by the user. For Mach-Zehnder amplitude modulators the transmitted optical intensity I is given by $$I = I_o(1-\Gamma)\left[\mathrm{Sin}^2\left(\frac{\pi}{2} \times \frac{V_{RF}}{V_\pi}\right) + \frac{1}{E.R.}\right] \quad (1)$$

where $I_o$ is the incident optical power impinging on the device, $\Gamma$ is the device insertion loss, $V_{RF}$ is the voltage applied on the RF port, E.R. is the modulator On/Off extinction ratio and $V_\pi$ is the well-known in the art RF half-wave voltage required to switch the transmission from maximum extinction to maximum transmission. This equation assumes that the modulator 162 is maintained at maximum extinction except in the time window corresponding to the pulse duration, which is the preferred case. It is known in the art that this maximum extinction condition during the inter-pulse period can be maintained by controlling the so-called bias voltage applied to a second port of the modulator 162, called the bias port or the DC port. Different controlling schemes can be implemented, the most common one being a closed-loop control based on the application of a dither signal on the bias electrode. Typically, a sample of the light transmitted by the modulator 162 is detected with a photodiode located downstream the modulator. The frequency of this signal is then compared to the dither signal frequency and appropriate corrections are applied to the bias electrode for compensating the drift of the voltage at which the extinction is maximal. In the preferred embodiment, the bias servo-loop control function is embedded in the pulse shaping module 52 with adjustable parameters such as the dither frequency and amplitude as well as the PID parameters of the servo-loop.

Figure 29:
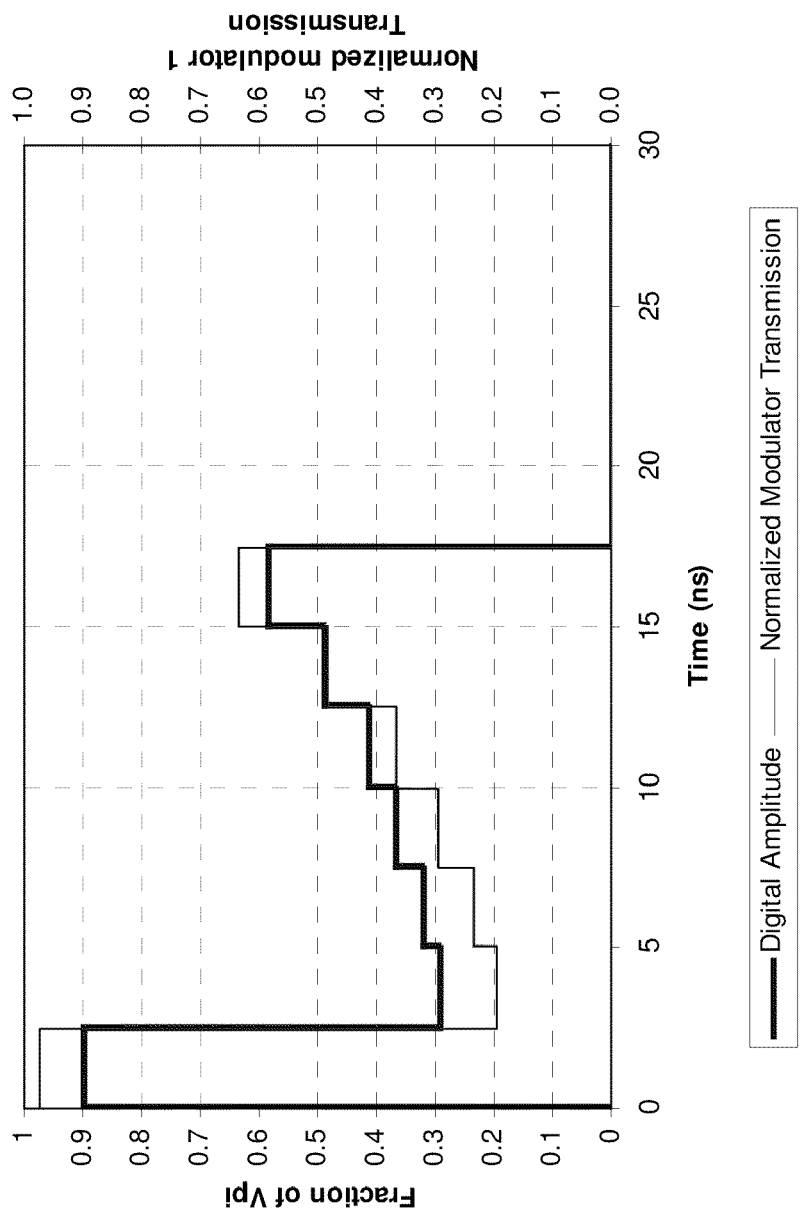
FIG. 29 shows an example of optical shape at the output of the first modulator corresponding to a particular digital waveform (SHAPE signal).

An example of a pulse shape of the SHAPE signal and of the resulting generated optical shape at the output of the first modulator 162 is shown in FIG. 29. In this example, the pulse shape is irregular, such as may for example be desired for particular applications such as for example selective ablation, drilling or other material processing-related applications. The pulse may however be rectangular shaped or have any other desired variation in time.

Referring still to FIG. 27, the pulsed laser source 54 also preferably includes a first optical amplifier 166, positioned downstream the first modulator 162 for amplifying the pulsed light signal generated thereby. An appropriate pump signal from pump source P1, propagating either backward or forward through the gain medium of the amplifier 166, maintains the required population inversion therein. In a particular embodiment, the first amplifier 166 may include a 35 m length of single-clad, polarization-maintaining Yb-doped aluminosilicate optical fiber having a core diameter of 5 µm and an Yb concentration of approximately $2\times10^{24}$ ions/m$^3$. In the same embodiment, a FBG-stabilized pump laser diode P1 emitting at 976 nm with a nominal output power of 280 mW is used to pump the Yb-doped fiber. In specific embodiments, a WDM fiber pump combiner is used to launch the pump power into the gain fiber. In other embodiments the fiber amplifier 166 includes a length of optical fiber doped with other rare earth elements, such as Erbium, Holmium, Praseodymium, Neodymium or Thulium. In yet other embodiments, additional optical components are employed for optimizing the pulsed laser source stability, such as isolators, polarizers, filters, etc. In a specific embodiment, the optical amplifier includes a Semiconductor Optical Amplifier (SOA).

The pulsed light source 54 next includes a second modulator 164 which also temporally modulates the pulsed light beam. The second modulator 164 is used to control the pulse temporal profile in conjunction with the first modulator 162, and it has an input optically coupled to the output of the first optical amplifier 166 for receiving the pulsed light beam therefrom. Preferably, it is a Lithium Niobate Mach-Zehnder electro-optic modulator of the APE type having a bandwidth of at least 3 GHz at 1064 nm with an On/Off extinction ratio of at least 25 dB. In other embodiments, other modulation schemes, such as based on an acousto-optic modulator, an electroabsorption modulator, etc. could also be considered.

The RF port of the second modulator is driven by the GATE signal outputted by the digital pulse shaping module. As with the SHAPE drive signal, the GATE drive signal can be made of a plurality of different drive pulses of predetermined widths $t_{sh}$ and shapes selected according to their desired effect on the pulsed light beam. The shape of the GATE drive pulses may simply be rectangular as shown in FIG. 2, or may present a more complex shape such as the one presented as an example at FIG. 29.

According to embodiments of the present invention, the final shape of the optical pulses of the pulsed light beam will be determined by both modulators 162 and 164. The first and second modulators 162 and 164 may be partially or completely synchronized with each other, depending on the desired shape of the resulting pulses of the pulsed light beam. The term "synchronized" is used herein as describing the joint timing of the opening and closing of the first and second modulators 162 and 164, taking into account the travel time $t_{gt}$ of light between both modulators. For example, the two modulators 162 and 164 will be considered fully synchronized if the second modulator 164 opens exactly at the instant the leading edge of the pulse generated by the first modulator 162 reaches it, and closes at the instant this pulse ends. It is an advantageous aspect of the invention that the synchronicity between the two modulators 162 and 164 may be used advantageously to control the width and shape of the pulses of the pulsed light beam. For example, by setting the two modulators 162 and 164 partially out of synchronization, pulses of a very small width may be obtained. Combining drive pulses of different widths and shapes may also advantageously be used to tailor the resulting pulses of the pulsed light beam to a wide range of specifications and with a very high resolution. Practically speaking, the digital pulse shapes programmed by the user will therefore generally include amplitude values and duration values for both the first and the second modulator.

For the sake of example, we consider the case where the modulators 162 and 164 are fully synchronized, as explained above. In that case the optical pulse intensity profile $I_2(t)$ at the output of the second modulator will be given by $$I_2(t) = I_o(1-\Gamma_1)\left[\mathrm{Sin}^2\left(\frac{\pi}{2} \times \frac{V_{RF1}(t)}{V_{\pi1}}\right) + \frac{1}{E.R._1}\right] \times \\ G_{net1}(t) \times (1-\Gamma_2)\left[\mathrm{Sin}^2\left(\frac{\pi}{2} \times \frac{V_{RF2}(t)}{V_{\pi2}}\right) + \frac{1}{E.R._2}\right] \quad (2)$$

where the indexes 1 and 2 refer to the first and second modulator 162 and 164, respectively, and where $G_{net1}(t)$ is the net optical gain of the first optical amplifier 166. $G_{net1}(t)$ is generally time-dependent due to gain saturation (more gain is available at the beginning of the pulse than at the end of the same). In the literature about pulse amplification with homogeneous gain saturation, one can find that the time dependence of the gain is given by $$G_{01}(t) = \frac{G_{01}}{G_{01} - (G_{01} - 1)\exp[-U_{in1}(t)/U_{sat1}]} \quad (3)$$

where $G_{01}$ is the initial available gain of the first amplifier, $U_{in1}(t)$ is the energy fluence (J/cm$^2$) of the pulsed signal launched in the first amplifier and $U_{sat1}$ is the saturation fluence (J/cm$^2$) of the first optical amplifier 166, which depends on the first amplifier active ion emission cross-section. The ratio $G_{01}U_{in1}(t)/U_{sat1}$ in general determines the amount of pulse shape distortion attributable to gain saturation in the first amplifier. $G_{net1}(t)$ is given by $$G_{net1}(t) = (1 - \Gamma_{amp})G_{01}(t) \quad (4)$$

where $\Gamma_{amp1}$ is the sum of the insertion losses of all optical components located in between the two modulators 162 and 164. Equations (2), (3) and (4) can thus be used to predict the actual optical pulse shape at the output of the second modulator 164 for given SHAPE and GATE signals. Conversely, from a given optical shape obtained with a given pulse shape address it is possible to determine $U_{sat1}$. From equation (2) one can infer that the distortion induced by gain saturation can be compensated easily with appropriate adjustments of the SHAPE and/or GATE waveforms for obtaining a given optical pulse shape, thereby importantly reducing the impact of gain saturation. This is clearly one advantage of embodiments of the present invention. In some embodiments, the gain saturation parameters of the first amplifier 166 as well as the modulators parameters ($V_\pi$, E.R.) are stored in the digital pulse shaping module 52 and used for automatically setting the SHAPE and/or GATE signal characteristics for obtaining a target optical pulse shape entered by the user.

According to embodiments of the present invention, the modulators 162 and 164 may also provide time-domain filtering of the seed and of the amplified spontaneous emission (ASE) generated by the optical amplifier stages. This limits the saturation of the optical amplifier stages since it is maintained in the maximum extinction state during most of the interpulse time period. For example, the ASE background generated by the gain medium of the first optical amplifier 166 is blocked by the second modulator 164 during the interpulse time, this background would otherwise partially deplete the population inversion in any gain medium located downstream, which could limit the laser output pulse peak power to a lower value due to the reduced extractable energy. The second modulator 164 also filters, in the time domain, the amplified leakage coming from the first modulator 162 (resulting from the finite value of E.R.$_1$ in equation (2)).

The optical pulse generation technique of the present embodiment of the invention provides some benefits with respect to U.S. Patent Application Publication No. 2008/0080,570 (MURISON et al.). A first advantage lies in the fact that the pulse shaping capability is totally embedded in the system architecture and is not dependent on the performances of external pattern generators. The user simply starts the system, programs or recalls a desired pulse shape and uses it right away, without the need of any external apparatus. As a second advantage, in the embodiment of FIG. 27, no pedestals or satellite pulses are generated, as it is the case in laser embodiments of MURISON et al. using an amplitude modulator. In effect, in the method of MURISON et al. the modulator is opened twice in order to generate a pulse (first opening) and to gate it (second opening) after a round-trip in an optical amplifier.

During the first opening, the ASE generated by the optical amplifier located in between the modulator and the mirror is transmitted by the modulator toward the output of the pulsed source, thus forming a satellite pulse preceding the main pulse. MURISON et al. also mention a second embodiment where the modulator is opened once instead of twice. In this particular embodiment, the modulator is kept opened during the pulse round-trip time in the optical amplifier. Again, the ASE generated by the amplifier is transmitted by the modulator while the later is kept opened, thus generating a pedestal preceding the pulse. Apart from the ASE and depending on the modulator extinction ratio, the satellite pulse and the pedestal can also be partially constituted of amplified seed signal leakage through the modulator. Finally, in the different embodiments presented by MURISON et al, the modulator is submitted to a higher total optical power than in the present invention as it is employed in a double-pass configuration. The worst case corresponds to the gating of the amplified pulse, as the modulator is submitted to the pulse peak power, the seed power and the first gain medium ASE power all at the same time. For Lithium Niobate Mach-Zehnder electro-optic modulator it is well-known in the art that the photorefractive effect can generate electrical charges inducing changes of the index of refraction in the waveguide region as the power propagating in the device increases. If enough photorefractive charges are generated the resulting index change can be large enough to affect not only the phase of the light, which has an impact on the drift of the bias point, but also the guiding properties of the waveguide itself. The limit case corresponds to a complete shutdown of the waveguide so that no light is transmitted. The present embodiment of the invention has the advantage of a lower maximum optical power being transmitted by the modulators with respect to MURISON et al., for equivalent pulsed laser source output power levels.

Still referring to FIG. 27, the pulsed laser source 54 also preferably include a second optical amplifier 168 provided downstream the second modulator 164 for final pulse amplification. As for the first optical amplifier 162, an appropriate pump signal, propagating either backward or forward through the gain medium of the amplifier 168, maintains the required population inversion therein. In a particular embodiment, the second amplifier 168 includes a 3.5 m length of single-clad, polarization-maintaining Nd-doped aluminosilicate optical fiber having a core diameter of 5 µm and a Neodymium concentration of approximately $5 \times 10^{24}$ ions/m$^3$. In the same embodiment, a FBG-stabilized pump laser diode P2 emitting at 808 nm with a nominal output power of 125 mW is used to pump the Nd-doped fiber. In specific embodiments, a WDM fiber pump combiner is used to launch the pump power into the gain fiber.

In other embodiments the second fiber amplifier 168 includes a length of single-clad or multi-clad optical fiber doped with other rare earth elements, such as Erbium, Holmium, Praseodymium, Ytterbium, Samarium or Thulium. In yet other embodiments, additional optical components are employed for optimizing the pulsed laser source stability, such as isolators, polarizers, filters, etc. In a specific embodiment, the second optical amplifier 168 includes a Semiconductor Optical Amplifier (SOA). Although FIG. 27 shows a single stage amplifier for the final pulse amplification, it is not required by the present invention. In specific embodiments, an amplifier chain comprising several cascaded amplifier stages is used for the final pulse amplification. In a particular embodiment, the amplifier chain includes at least one DPSS amplifier stage based on gain medium like Nd:YAG or Nd:YVO$_4$. Those skilled in the art will recognize numerous variations and alternatives.

The pulsed signal OPTICAL_SH_OUT outputted by the pulsed laser source will have an optical intensity $I_{out}(t)$ given by $$I_{out}(t) = I_2(t) \times G_{net2}(t) \quad (5)$$

where $I_2(t)$ is given by equation (2) and where $G_{net2}(t)$ is the net optical gain of the second optical amplifier 168, given by $$G_{net2}(t) = (1 - \Gamma_{amp2}) G_{02}(t) \quad (6)$$

where $\Gamma_{amp2}$ is the sum of the insertion losses of all optical components located downstream to the second modulator 164 and where $G_{02}(t)$ is the optical gain of the second amplifier 168. As for $G_{01}(t)$, a theoretical expression for $G_{02}(t)$ is $$G_{02}(t) = \frac{G_{02}}{G_{02} - (G_{02} - 1)\exp[-U_{in2}(t)/U_{sat2}]} \quad (7)$$

where $G_{02}$ is the initial available gain of the second amplifier, $U_{in2}(t)$ is the energy fluence (J/cm$^2$) of the pulsed signal launched in the second amplifier and $U_{sat2}$ is the saturation fluence (J/cm$^2$) of the second optical amplifier 168, which depends on the second amplifier active ion emission cross-section. The ratio $G_{02}U_{in2}(t)/U_{sat2}$ in general determines the amount of pulse shape distortion attributable to gain saturation in the second amplifier. This distortion can be compensated by appropriate adjustments of the SHAPE and/or GATE waveforms for obtaining a given optical pulse shape, thereby importantly reducing the impact of gain saturation. In some embodiments, the second amplifier gain saturation parameters are stored in the digital pulse shaping module and used for automatically setting the SHAPE and/or GATE signal characteristics for obtaining a target optical pulse shape entered by the user.

Figure 30:
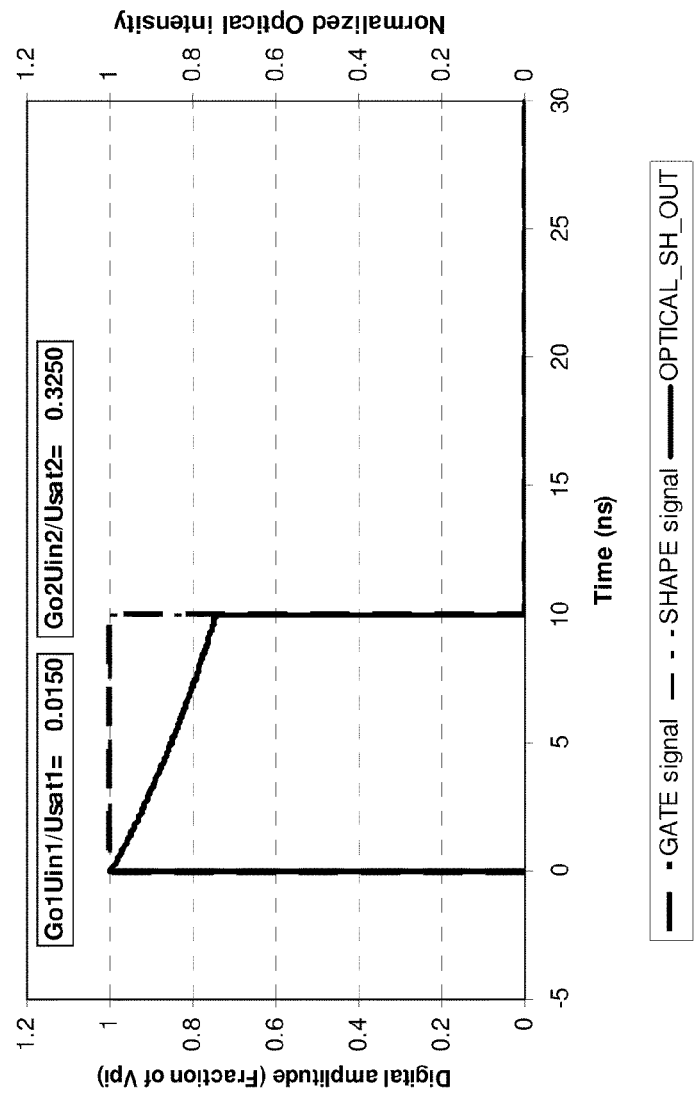
FIG. 30 shows a typical pulse shape distortion resulting from optical gain saturation for rectangular SHAPE and GATE waveforms.

To illustrate the effect of gain saturation we consider the case of fully synchronized rectangular SHAPE and GATE waveforms for the typical gain saturation conditions prevailing in the preferred embodiment (see FIG. 30). For the sake of simplicity and as an approximation, we use the ratio $G_oU_{in}/U_{sat}$ as an indicator for the gain saturation, where $U_{in}$ is the energy fluence of the whole pulse, as if the gain media were punctual elements with negligible length with respect to the spatial distribution of the pulse, and where Go is the optical gain values of the whole gain media. Obviously the longitudinal effects can be readily included through finite element analysis.

For some applications it is required that the pulsed laser system 54 can also operate in a CW or quasi-CW mode so as to emit CW or quasi-CW radiation instead of pulses. For example, in memory repair systems, such a mode of operation is used for target alignment purposes. It may also be required that the laser can be put on demand in the CW or quasi-CW mode and then back to the pulsed mode. In one embodiment of the present invention, there is therefore provided a quasi-CW mode having those characteristics. In the preferred embodiment, both the SHAPE and the GATE signals are rectangular waveforms in the Quasi-CW mode, with a frequency of 100 MHz typically. Dynamic on-demand switching in between the pulsed mode and the quasi-CW mode is also provided, as well as programmable amplitude of the SHAPE rectangular wave.

Specific examples where the capabilities for industrial applications for embodiments as described above are demonstrated are given below. Those examples refer to IC link severing or related applications, but those ordinary skilled in the art will recognize that numerous other applications can be envisioned.

Figure 31:
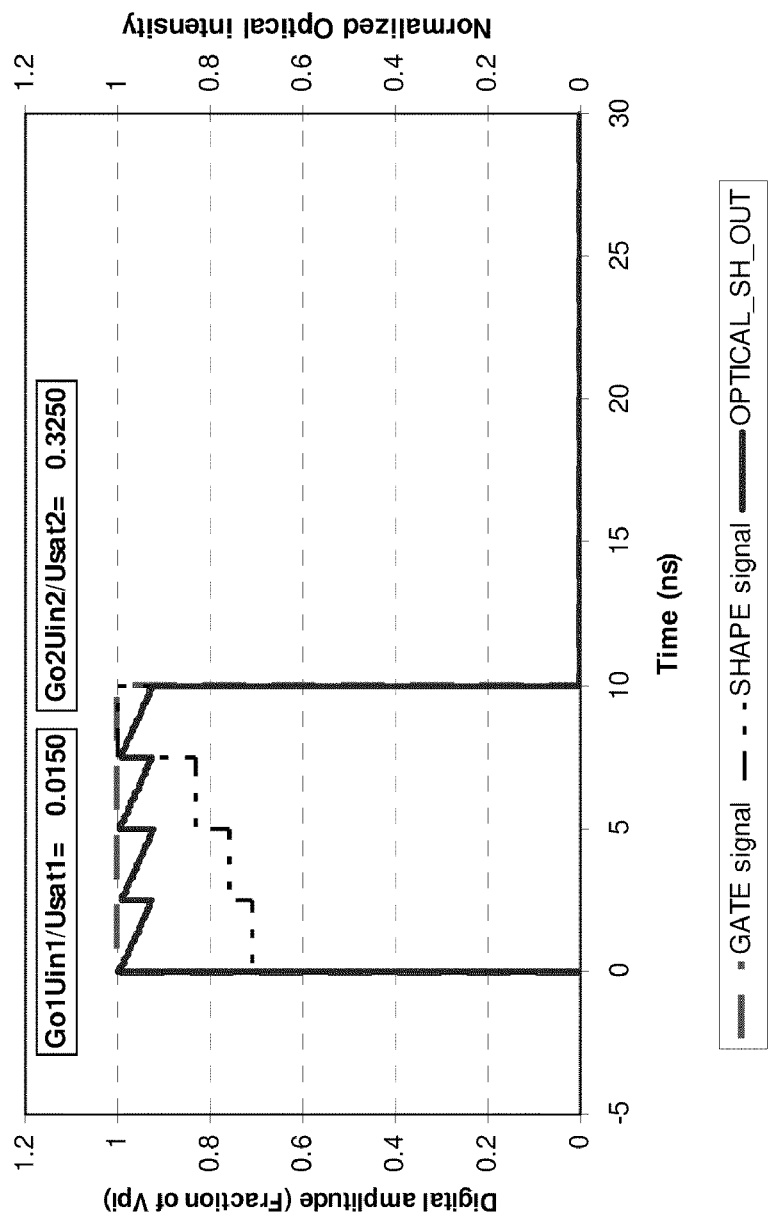
FIG. 31 shows an example of rectangular optical shape (OPTICAL_SH_OUT) obtained through appropriate adjustment of the different amplitudes values of the SHAPE signal so as to compensate optical gain saturation.

In U.S. Pat. No. 6,281,471 SMART present the advantages of using somewhat square pulse shapes for processing target material. FIG. 31 shows that such a shape can be readily obtained with a system according to embodiments of the present invention, with the SHAPE signal being programmed so as to compensate the pulse distortion induced by gain saturation (see FIG. 30) and with a rectangular GATE signal. Although the individual programmed digital amplitudes are visible because of remaining gain saturation, the effect is quite attenuated. Also, for the real optical pulse shapes obtained with the present embodiment the remaining amplitude oscillations are smaller than shown in FIG. 31, as the effect of the limited rise times and fall times are not considered in the calculated shape. In this example, the energy per pulse is 10 µJ at a repetition rate of 100 kHz, and both the rise time and the fall time are smaller than 1 ns. Preferably, the rise time and the fall time are of the order of 1 ns or less for the present invention. The pulse repetition rate is preferably higher than 100 kHz, and most preferably it is higher than 200 kHz. The preferred pulse energy range is 0.1 µJ to 1 mJ, whereas the preferred pulse duration range is 1 ps to 1 µs.

In U.S. Pat. No. 7,348,516 Sun et al. disclose pulse shapes comprising one or several spikes for IC link severing (see FIGS. 32 to 34 (PRIOR ART) of the present application). The spike peak power Pmax is preferably 10% to 50% over the average power of the pulse Pmin, and the spike duration is defined as the spike full duration at the middle power point Ps, between Pmax and Pmin. The spike ends at time, $t_e$, which is before the time, $t_1$, when the link material is totally removed.

Figure 32:
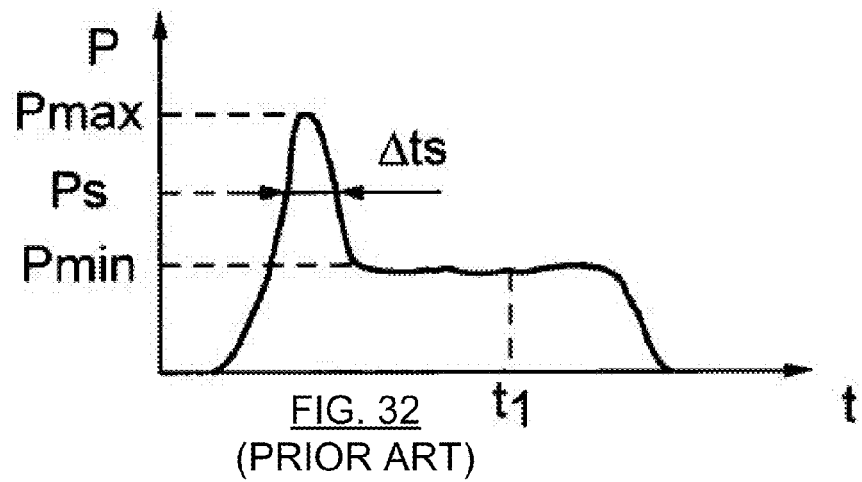
FIG. 32 [PRIOR ART] shows the prior art optical pulse shape for link severing, with a spike at the leading edge of the pulse.
Figure 33:
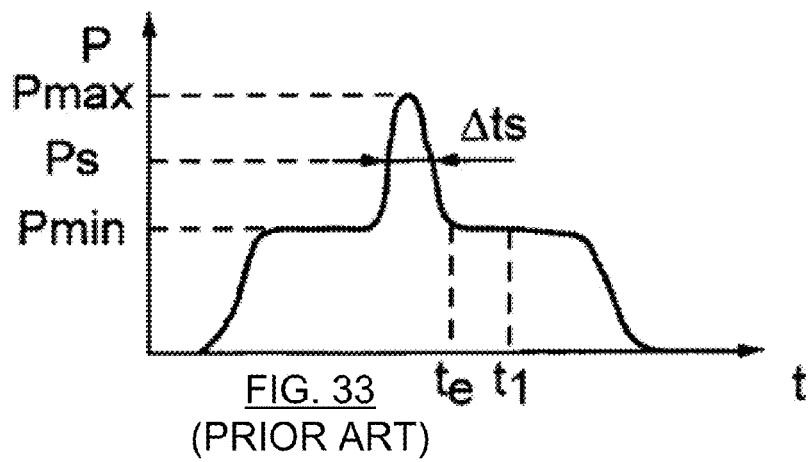
FIG. 33 [PRIOR ART] shows the prior art optical pulse shape for link severing, with a spike appearing during the laser pulse.
Figure 34:
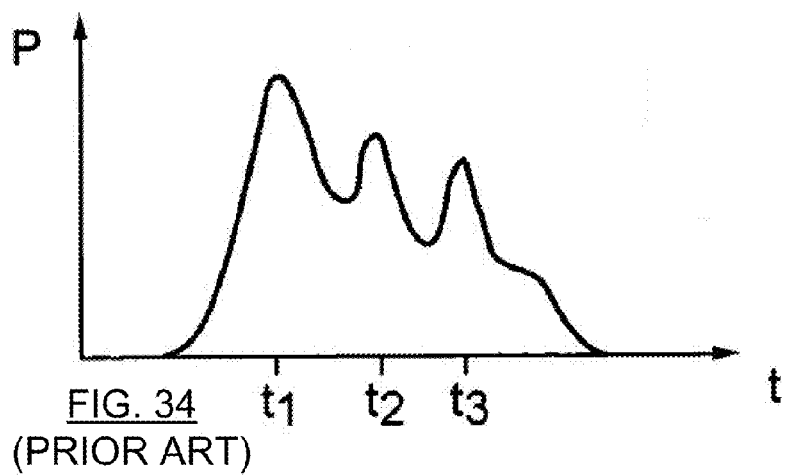
FIG. 34 [PRIOR ART] shows the prior art optical pulse shape for link severing, with multiple spikes appearing during the laser pulse.
Figure 35:
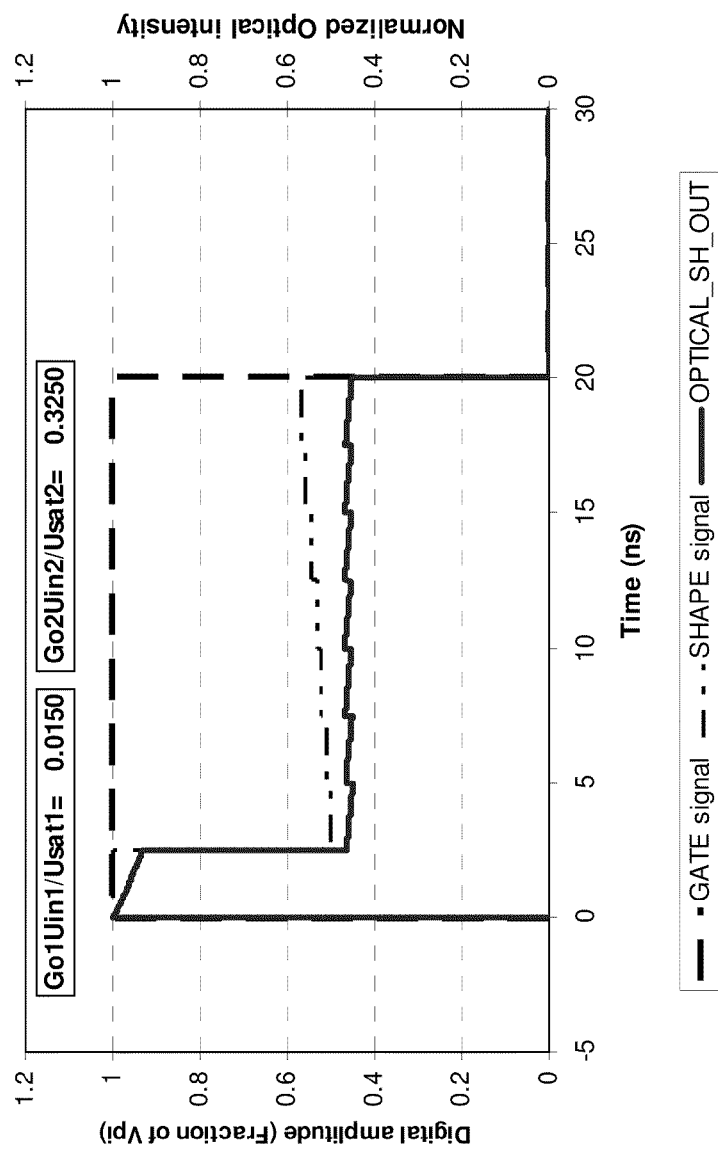
FIG. 35 shows an example of optical shape obtained with an embodiment of the present invention, corresponding to the optical shape type presented at FIG. 32.
Figure 36:
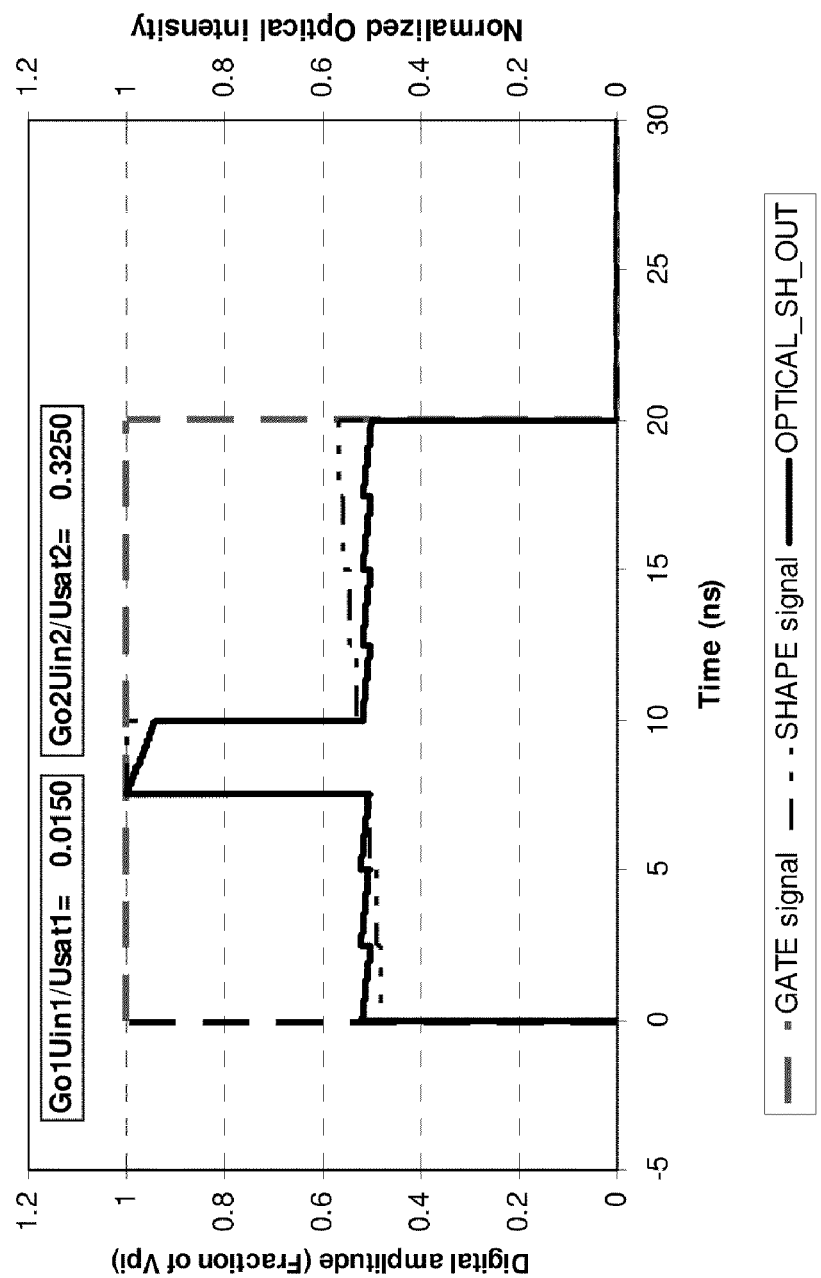
FIG. 36 shows an example of optical shape obtained with an embodiment of the present invention, corresponding to the optical shape type presented at FIG. 33.
Figure 37:
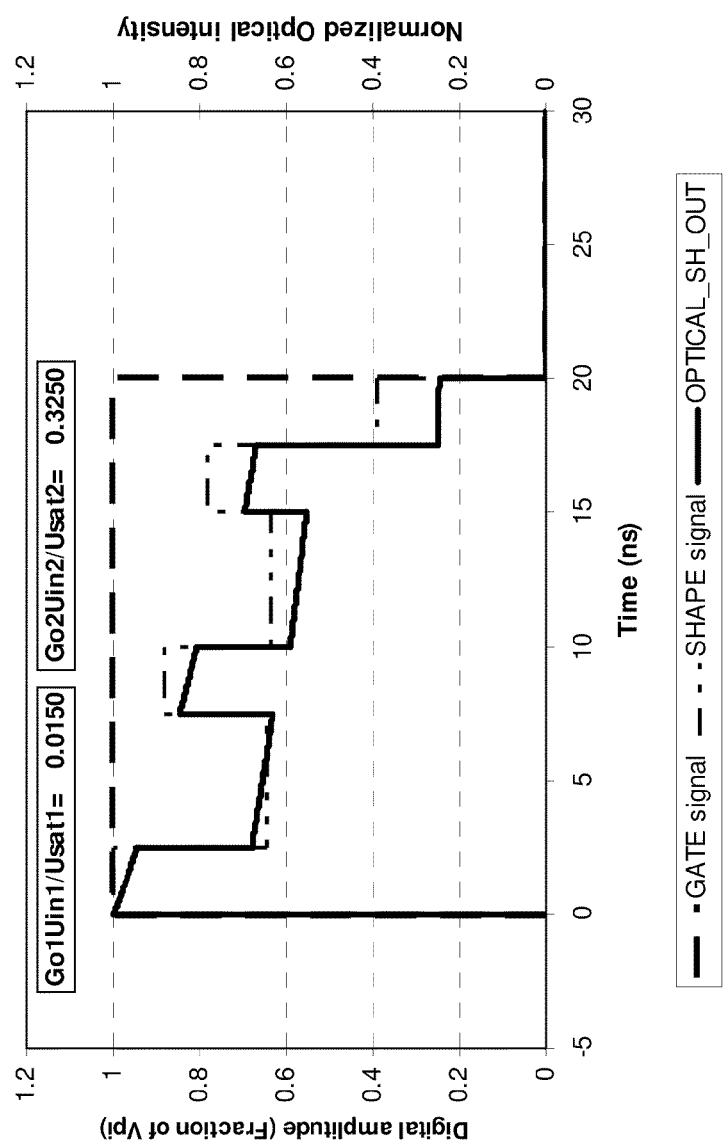
FIG. 37 shows an example of optical shape obtained with an embodiment of the present invention, corresponding to the optical shape type presented at FIG. 34.

FIGS. 35 to 37 show that optical pulse shapes of the type appearing in FIGS. 32 to 34 respectively can be easily obtained with the current system.

Figure 38:
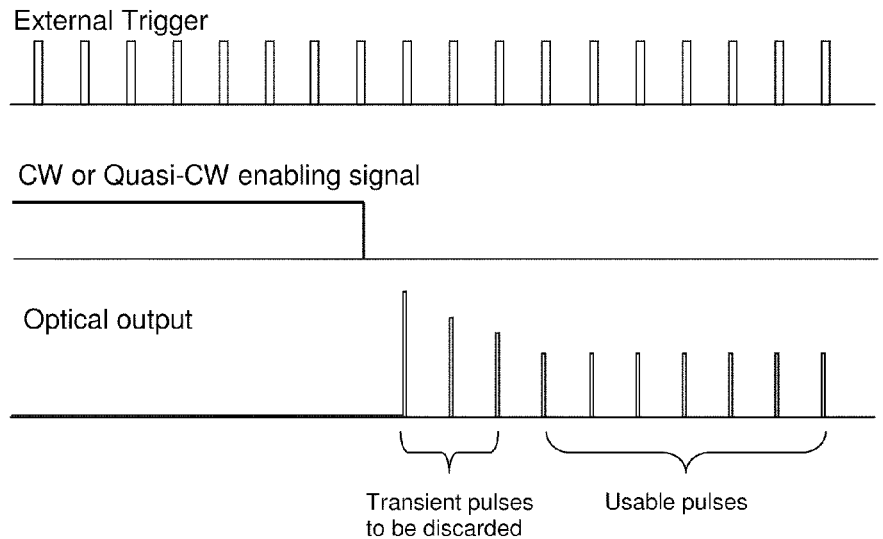
FIG. 38 is an illustration of the transient response of conventional pulsed lasers when switching from the CW or quasi-CW mode to the pulsed mode.

As a demonstration of the agility of the embodiments of the present invention, we now present an example were the quasi-CW mode emission can be controlled easily in a practical situation in order to maximize the throughput of a laser material processing system or method. Generally, in many conventional laser systems, when switching from the CW or quasi-CW mode to the pulsed mode of operation, the energy per pulse of the first few pulses coming after the transition will be either higher or lower than the steady state energy (see FIG. 38).

Figure 39:
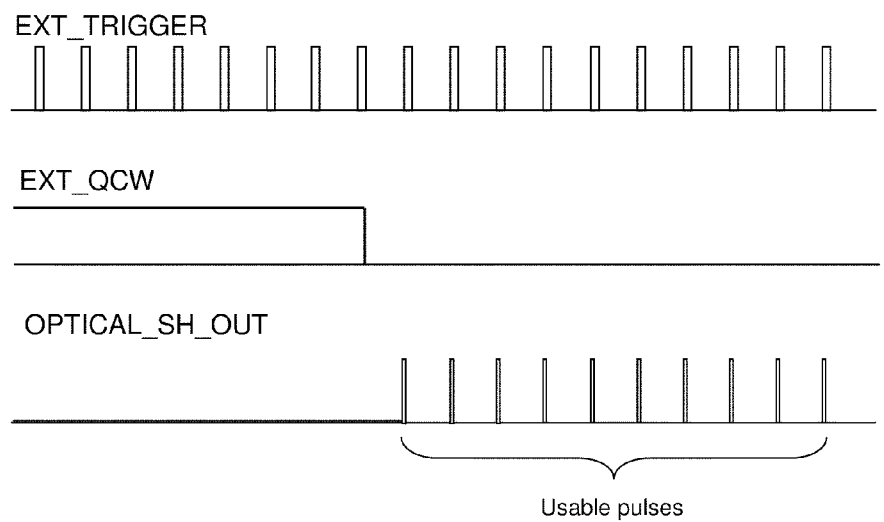
FIG. 39 is an illustration of the transient response that can be obtained with an embodiment of the present invention.

This transient behavior is due to slightly different conditions of operation in the gain media (population inversion level, input signal level, etc.) for the two modes of operation. The drawback of such transient effects for some material processing system is a throughput penalty as the transient pulses do not have the energy level required by the processing window. A certain number of pulses must then be rejected and a certain amount of time is lost, the exact amount depending upon the details of the laser processing conditions and on the transient response of the laser. To alleviate this issue embodiments of the present invention provide to the user a control over the modulation amplitude of the SHAPE signal when the laser is operated in the quasi-CW mode. This functionality, implemented in the digital pulse shaping module, has been successfully used in practical situations to finely adjust the quasi-CW amplitude modulation of the SHAPE signal so as to minimize the transient response when switching from the quasi-CW mode to the pulsed mode (FIG. 39). In fact, it is usually easy to perform an adjustment such that there is no throughput penalty for a given pulse shape and repetition rate. Preferably, the modulation amplitude can be adjusted with a resolution of at least 10 bit.

Figure 40:
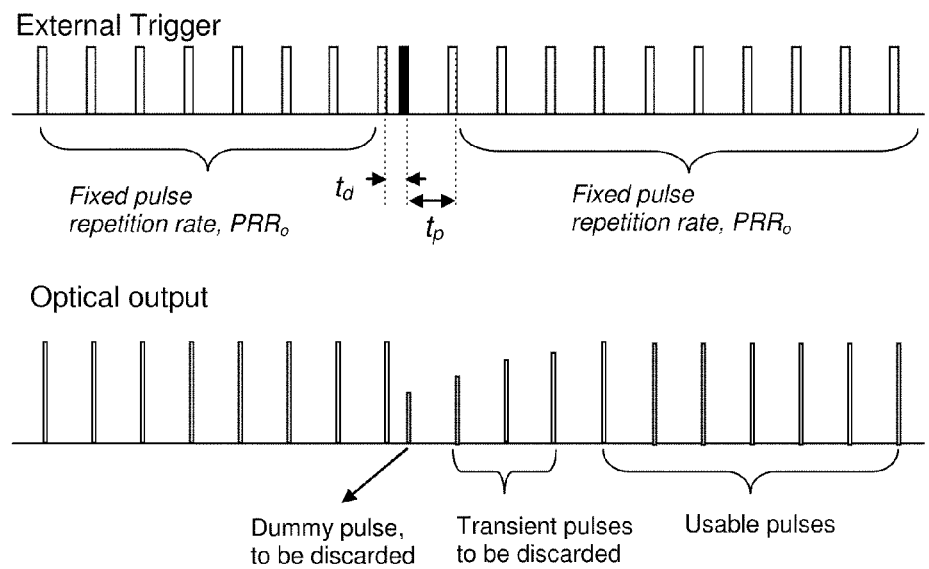
FIG. 40 is an illustration of the transient response of conventional pulsed lasers when inserting a dummy pulse.

In some material processing applications it is a current practice to locally insert a dummy pulse in a train of pulses of fixed repetition rate for resynchronization purposes when switching from a series of IC links just processed to other series of links that are to be processed, as shown in FIG. 40.

Again, for conventional lasers with fixed pulse shape and energy per pulse, a transient response can penalize the throughput of the material processing system given the fact that a number of pulses following the dummy pulse will not have the energy level required by the processing window. The exact number of pulses that will not be usable is dependent upon the processing pulse repetition rate $PRR_o$, the delay $t_d$ in between the dummy pulse and the pulse preceding it, the delay $t_p$ in between the dummy pulse and the pulse following it, the gain media characteristics, etc. The pulse-to-pulse shape selection capability of devices according to embodiments of the present invention at repetition rate as high as 10 MHz can be advantageously used to overcome this issue. The idea is to assign a different shape to the dummy pulse (that will be called "SHAPE B") with respect to the "processing" shape (that will be called "SHAPE A"), so as to minimize the impact of the dummy pulse on the energy per pulse of the pulses that follow it. In typical situations where this technique has been employed, $PRR_o$, was in the range of 100 kHz-200 kHz, $t_d$ had a value of about 1 μs and $t_p$ had a value in the range of 1 μs to 10 μs. The dummy pulse shape ("SHAPE B") programmed by user in the pulse shaping module had lower digital amplitude levels than the processing pulse shape ("SHAPE A"). In such a situation, the dummy pulse extracts less energy from the gain media with respect to the situation where the dummy pulse has the same shape or amplitude as the processing pulses, as it is the case in conventional laser systems. Therefore after a time $t_p$ following the dummy pulse more optical gain is available for the next processing pulse, which alleviates the undershoot behavior shown in FIG. 40.

Figure 41:
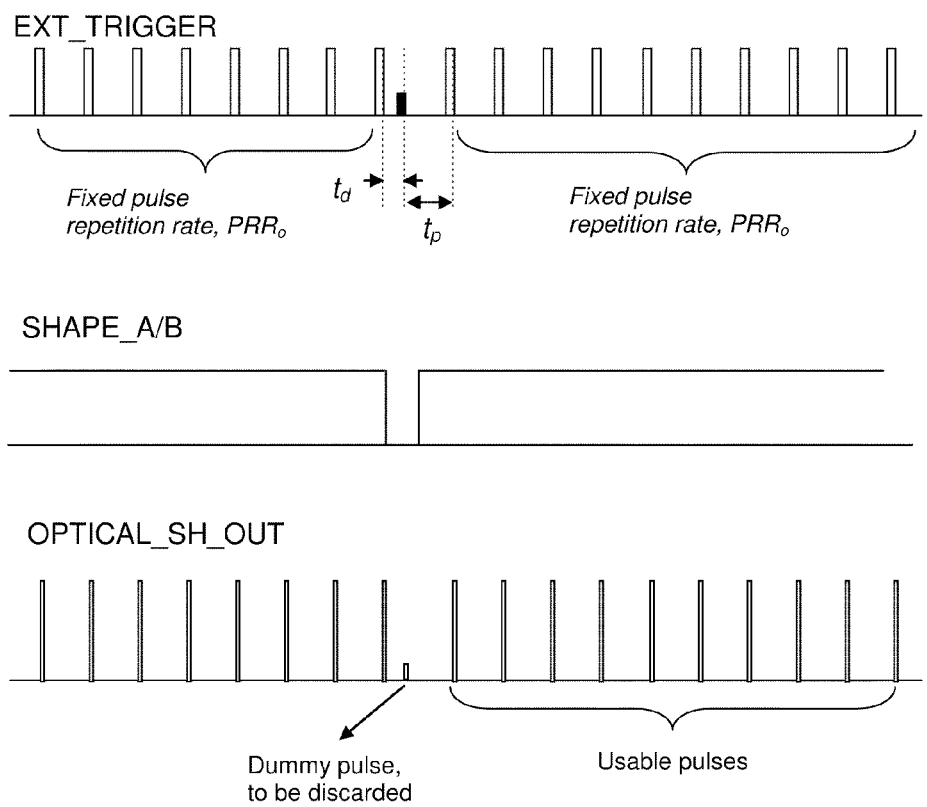
FIG. 41 is an illustration of the benefits of the pulse shape agility according to an embodiment of the present invention for alleviating the throughput penalty arising from the laser transient response when inserting a dummy pulse.

From a practical standpoint, the user simply programs the digital processing shape as well as the digital dummy pulse shape in the pulse shaping module and assigns those shapes to the SHAPE A and SHAPE B respectively, which are the two pulse shapes that can be dynamically selected by the user with the SHAPE_A/B input of the platform in the preferred embodiment. When processing the target the SHAPE_A/B input is then used to switch from SHAPE A to SHAPE B and back to SHAPE A so as to select SHAPE B for the dummy pulse only. With appropriate choice of the SHAPE B amplitudes, this pulse shaping agility of the laser has proven to be efficient as it was easy to reach the processing energy for the first pulse following the dummy pulse, that is, without throughput penalty. This is illustrated in FIG. 41.

In the microelectronic industry, entrenched trends, primarily driven by progressive miniaturization of microelectronics, continue to spur development of advanced laser processes capable of production of smaller feature sizes (e.g. link width of 0.2 μm with link pitch smaller than 1 μm), and, in many cases, higher throughput of processed features. A pulse shaping capability as well as high repetition rates, as provided by embodiment of the present invention, certainly enables major benefits in terms of throughput and processing windows, as explained by SUN et al. in U.S. Pat. No. 7,348,516. For addressing the demand of processing links at the sub-micron scale one further desirable laser characteristic is the availability of diffraction-limited spot sizes below 1 μm, which mean working with the harmonics (green or UV) of the fundamental laser wavelength. In embodiments of the present invention, one or several frequency conversion modules follow the second optical amplifier or optical amplifier chain. As the frequency conversion is non-linear, once again the pulse shaping agility of the laser can compensate the nonlinearity so as to generate precisely the desired optical pulse shape at the harmonics wavelengths. In some embodiments, the frequency conversion transfer function is programmed in the pulse shaping module so that the user directly enters, using a computer, the desired target optical pulse shape at the output of the laser. The pulse shaping module thereafter generate appropriate SHAPE and GATE waveforms for obtaining the target optical pulse shape, taking into account the nonlinearity associated with frequency conversion. In other embodiments, a feedback loop with a servo-control on the pulse shape is embedded in the pulse shaping module, so as to automatically adjust the SHAPE and GATE signals for compensating any optical pulse shape variation resulting from the varying conditions of operations, aging of the components, etc.

Figure 42:
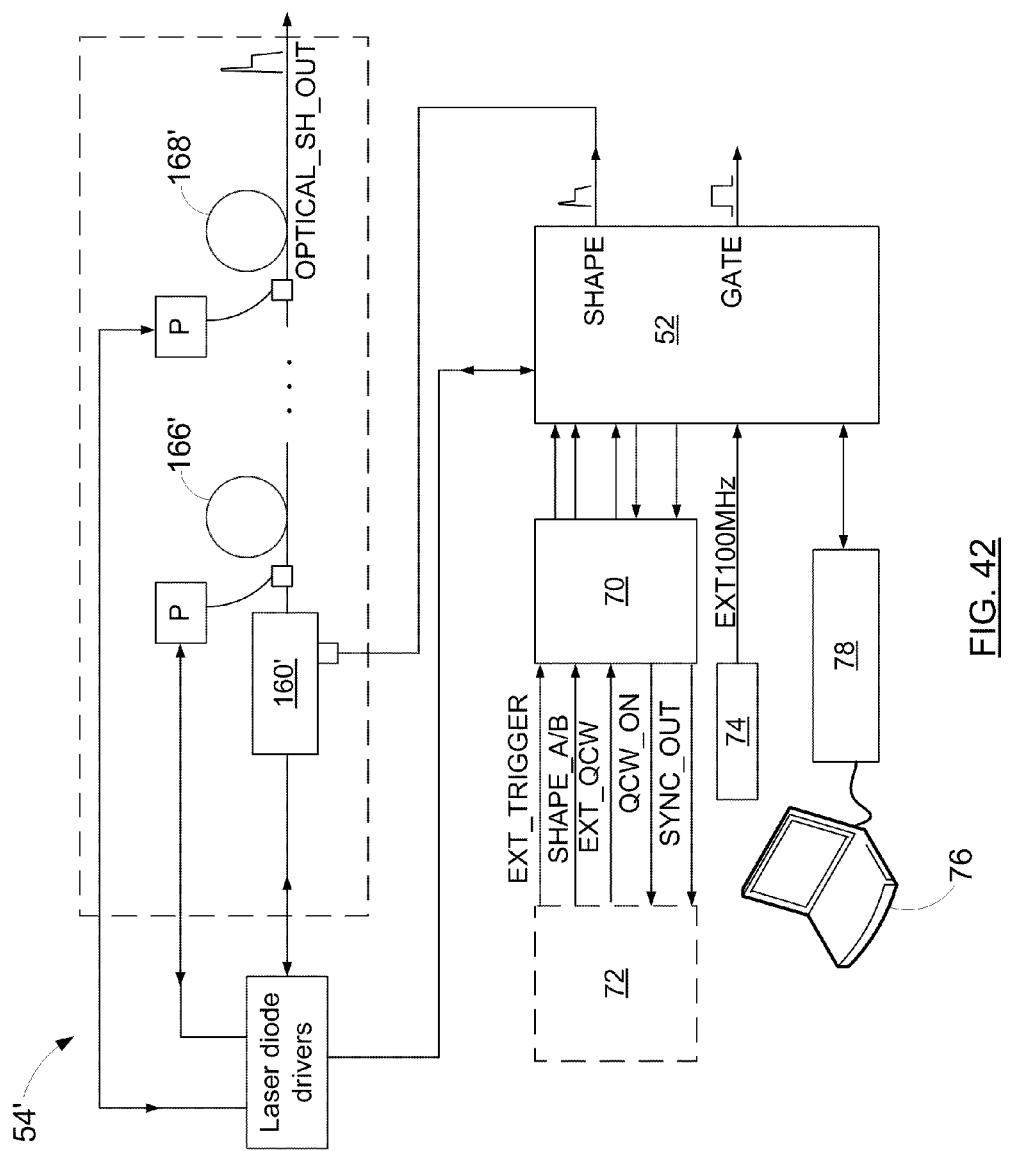
FIG. 42 schematically illustrates an embodiment of the present invention using a seed laser diode operated in the pulsed regime.

4.2 Pulsed Laser Source Based on a Semiconductor Laser Diode Operated in the Pulsed regime Referring to FIG. 42, there is illustrated another embodiment, where the SHAPE signal is used to drive the current of a seed laser diode 160'. The pulsed laser source 54' in this case consists in the seed laser diode 160' followed by one or several cascaded optical amplifiers 166'. The GATE signal is not used.

The pulsed laser source 54' of FIG. 42 first includes the seed light source 160' generating a pulsed light beam when controlled by the SHAPE signal outputted by the digital pulse shaping module. Preferably, the seed light source 160' is a semiconductor laser diode. The pulsed light beam preferably has a spectral shape which will determine the spectral shape of the light outputted by the entire pulsed light source. Advantageously, the laser diode 160' may be selected or replaced depending on the required spectral profile of the outputted light. Alternatively, a wavelength tunable diode may be used. Additional components may optionally be provided downstream the laser diode 160' to modify its spectral shape. An optical isolator may also be provided downstream the seed laser diode 160' to prevent feedback noise from reaching it.

In the preferred embodiment, the seed source is an external cavity semiconductor laser diode with a central emission wavelength of 1064.3 nm and a nominal output power of 100 mW in the CW regime. The emission is single longitudinal mode with a fairly narrow line width (less than 10 MHz). The emission wavelength can be easily fine-tuned by the user with a simple user command giving access to the seed laser diode operating temperature. This functionality, embedded in the core of the pulse shaping module, has been used for example in a memory repair application where the pulsed laser source output was amplified with a Nd:YVO$_4$ solid state amplifier. In such a configuration, it is important to control the overlap of the pulsed laser source emission spectrum with respect to the relatively narrow spectrum (~0.5 nm FWHM) of the solid state medium for optimizing the amplification, especially under different pumping conditions of the crystal. With increasing pump power, the crystal gain spectrum tends to shift to higher wavelengths. In the mentioned application, the emission wavelength flexibility provided by the embedded laser platform is used to fine-tune the pulsed laser source emission wavelength with a simple user command sent by a computer, in order to optimize the spectral overlap of the source with respect to the solid state amplifier gain spectrum under varying pumping conditions (see FIG. 28). In typical conditions, the seed laser diode wavelength shifts by about 50 pm when changing the diode operating temperature by 1° C. The laser platform provides a resolution of 0.1° C. for the laser diode operating temperature set point, thus allowing for a resolution of about 5 pm in the wavelength adjustments. In another embodiment, the seed source is a Fiber Bragg Grating (FBG) stabilized laser diode emitting at 1064.3 nm with a nominal output power of 150 mW. The FBG temperature is controlled with a resolution of 0.1° C. with a user command, also allowing for fine wavelength tuning by the user.

In this embodiment of the invention, the SHAPE signal is directly applied to the laser diode 160' for controlling the diode drive current with a shaped waveform. The amplitude of the SHAPE signal is controlled with a resolution of at least 10 bit in the preferred embodiment. The maximum current amplitude is preferably higher than 1 ampere and most preferably higher than 5 amperes. In some embodiments, a bias current (DC) is also applied to the laser diode 160' for controlling the diode transient response and gain-switch effects. In yet other embodiments, a feedback loop with a servo-control on the applied bias current is embedded in the pulse shaping module. As for the embodiments described above, the pulse shapes are programmed quite simply in the pulse shaping module. The shape address is programmed using a computer with a simple command that defines the number of temporal bins as well as their corresponding amplitudes.

The pulsed laser source 54' also preferably includes at least one optical amplifier 166', positioned downstream the seed laser diode 160' for amplifying the pulsed light signal generated thereby. An appropriate pump signal, propagating either backward or forward through the gain medium of the amplifier, maintains the required population inversion therein. In a particular embodiment, the amplifier includes a 35 m length of single-clad, polarization-maintaining Yb-doped aluminosilicate optical fiber having a core diameter of 5 µm and an Yb concentration of approximately $2 \times 10^{24}$ ions/m$^3$. In the same embodiment, a FBG-stabilized pump laser diode emitting at 976 nm with a nominal output power of 280 mW is used to pump the Yb-doped fiber. In one other particular embodiment, the amplifier includes a 3.5 m length of single-clad, polarization-maintaining Nd-doped aluminosilicate optical fiber having a core diameter of 5 µm and a Neodymium concentration of approximately $5 \times 10^{24}$ ions/m$^3$. In the same embodiment, a FBG-stabilized pump laser diode emitting at 808 nm with a nominal output power of 125 mW is used to pump the Nd-doped fiber. In specific embodiments, a WDM fiber pump combiner is used to launch the pump power into the gain fiber. In other embodiments the fiber amplifier includes a length of single clad optical fiber doped with other rare earth elements, such as Erbium, Holmium, Praseodymium, Samarium or Thulium. In the illustrated embodiment, an additional optical amplifier 168' is shown, although any appropriate number of such amplifiers may be provided. In yet other embodiments, additional optical components are employed for optimizing the pulsed laser source stability, such as isolators, polarizers, filters, etc. In a specific embodiment, the optical amplifier includes a Semiconductor Optical Amplifier (SOA).

In other specific embodiments the fiber amplifier chain includes a length of multi-clad optical fiber doped with rare earth elements, such as Erbium, Holmium, Praseodymium, Ytterbium, Samarium, Neodymium or Thulium. In a particular embodiment, the amplifier chain includes at least one DPSS amplifier stage based on gain medium like Nd:YAG or Nd:YVO$_4$. Those skilled in the art will recognize numerous variations and alternatives.

The pulse shape distortion induced by gain saturation effects in the optical amplifier stages can be readily compensated using the pulse shaping capability of the laser platform. For the different embodiments of the invention, the SHAPE signal waveform is adjusted accordingly. In some embodiments, the amplifier chain gain saturation parameters are stored in the pulse shaping module and used for automatically setting the SHAPE signal characteristics for obtaining a target optical pulse shape entered by the user. In other embodiments, a servo-control on the SHAPE signal is embedded in the pulse shaping module for maintaining the optical pulse shape constant under varying conditions of operations of the laser.

In the preferred embodiments of the invention, the SHAPE signal is a rectangular waveform in the Quasi-CW mode, with a frequency of 100 MHz typically. Dynamic on-demand switching in between the pulsed mode and the quasi-CW mode is also provided, as well as programmable amplitude of the SHAPE rectangular wave.

The examples presented above for a pulse light source of the type shown in FIG. 27 also apply to the different embodiments of a directly modulated seed source, except that the pulse shaping capability is provided via the SHAPE signal alone and that there is no modulator transfer function to take into account. Optical shapes such as the ones shown in FIGS. 31, 35, 36 and 37 can be readily obtained with appropriate SHAPE digital waveforms programmed in the pulse shaping module.

Figure 43:
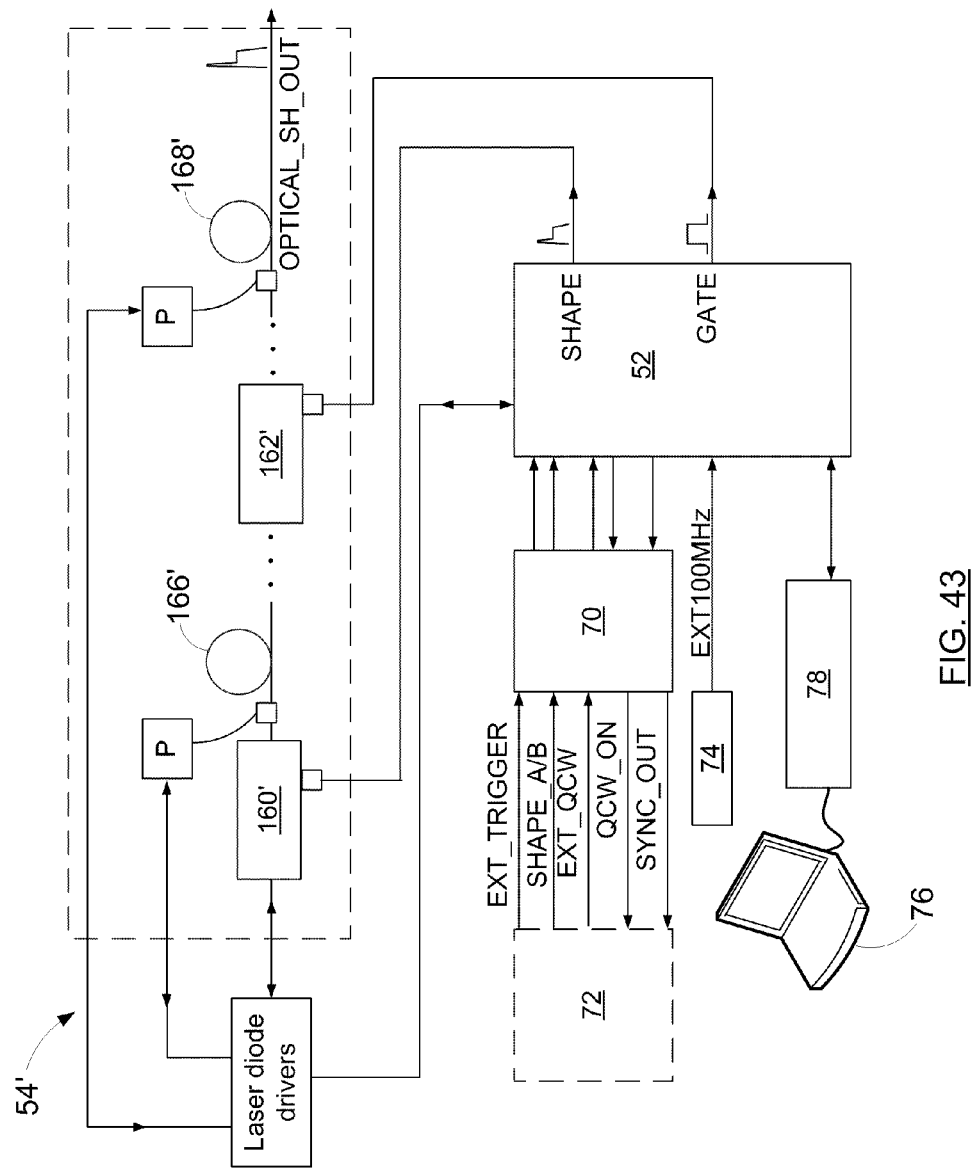
FIG. 43 schematically illustrates an embodiment of the present invention using a seed laser diode operated in the pulsed regime and a modulator.

4.3 Pulsed Laser Source Based on a Semiconductor Laser Diode Operated in the Pulsed Regime and an Amplitude Modulator Referring to FIG. 43, there is shown a variant of the embodiment of FIG. 42 where an amplitude modulator 162' driven by the GATE signal is added downstream to the seed laser diode 160', at any particular location in the amplifier chain. Preferably, the modulator 162' is located in between two consecutive optical amplifiers 166' and 168', and will provide extended pulse shaping capability as explained above. Furthermore, the modulator 162' provides time-domain filtering of the seed leakage and of the amplified spontaneous emission (ASE) generated by the optical amplifier stages.

In this embodiment, the modulator 162' is used to control the pulse temporal profile in conjunction with the seed laser diode 160'. Preferably, it is a Lithium Niobate Mach-Zehnder electro-optic modulator of the APE type having a bandwidth of at least 3 GHz at 1064 nm with an On/Off extinction ratio of at least 25 dB. In other embodiments, other modulation schemes, such as based on an acousto-optic modulator, an electroabsorption modulator, etc. could also be considered.

The RF port of the modulator is driven by the GATE signal outputted by the digital pulse shaping module. As with the SHAPE drive signal, the GATE drive signal can be made of a plurality of different drive pulses of predetermined widths $t_{sh}$ and shapes selected according to their desired effect on the pulsed light beam. The shape of the GATE drive pulses may simply be rectangular as shown in FIG. 2, or may present a more complex shape.

According to embodiments of the present invention, the final shape of the optical pulses of the pulsed light beam will be determined by both the seed laser diode 160' controlled by the SHAPE signal and the modulator 162' controlled by the GATE signal. The SHAPE and the GATE signals may be partially or completely synchronized with each other, depending on the desired shape of the resulting pulses of the pulsed light beam. The term "synchronized" is used herein as describing the joint timing of the leading edge and falling edge of the SHAPE signal and of the GATE signal, taking into account the travel time $t_{gt}$ of light between the seed laser diode and the modulator. For example, the two signals will be considered fully synchronized if the leading edge of the GATE signal occurs exactly at the instant the leading edge of the optical pulse generated by the seed laser diode reaches it, and the falling edge of the GATE signal occurs at the instant this pulse ends. In other words, the seed laser diode and the modulator are considered completely synchronized when both signals have the same duration or pulse width and the leading edge of the GATE signal is delayed by $t_{gt}$ with respect to the leading edge of the SHAPE signal, as shown in FIG. 2. It is an advantageous aspect of the invention that the synchronicity between the seed laser diode and the modulator may be used advantageously to control the width and shape of the pulses of the pulsed light beam. For example, by setting the seed laser diode and the modulator partially out of synchronization, pulses of a very small width may be obtained. Combining drive pulses of different widths and shapes may also advantageously be used to tailor the resulting pulses of the pulsed light beam to a wide range of specifications and with a very high resolution. Practically speaking, the digital pulse shapes programmed by the user will therefore generally include amplitude values and duration values for both the seed laser diode (SHAPE signal) and the modulator (GATE signal).

Still referring to FIG. 43, both the SHAPE and the GATE signals are preferably rectangular waveforms in the Quasi-CW mode, with a frequency of 100 MHz typically. Dynamic on-demand switching in between the pulsed mode and the quasi-CW mode is also provided, as well as a programmable amplitude of the SHAPE rectangular wave.

4.4 Other Embodiments Using Q-Switched Laser, Gain-Switched Lasers and Mode-Locked Lasers In alternative embodiments, the platform can control different types of pulsed laser so as to generate optical pulses with controlled shapes or pulse trains with different durations, amplitude profiles and repetition rates.

In some embodiments, the SHAPE signal is used to drive the pump laser diodes of a laser so as to generate gain-switched pulses with a controlled pulse shape. An optical amplifier or an optical amplifier chain following the gain-switched laser then amplifies the pulsed light beam. In particular embodiments, a modulator controlled by the GATE signal is inserted at a location in the amplifier chain, preferably in between two amplifier stages, and provides an extended pulse shaping capability.

In specific embodiments, the SHAPE signal is used to trigger a Q-switched laser so as to generate Q-switched pulses with a controlled pulse shape. An optical amplifier or an optical amplifier chain following the gain-switched laser then amplifies the pulsed light beam. In particular embodiments, an amplitude modulator controlled by the GATE signal is inserted at a location in the amplifier chain, preferably in between two amplifier stages, and provides an extended pulse shaping capability.

Figure 44:
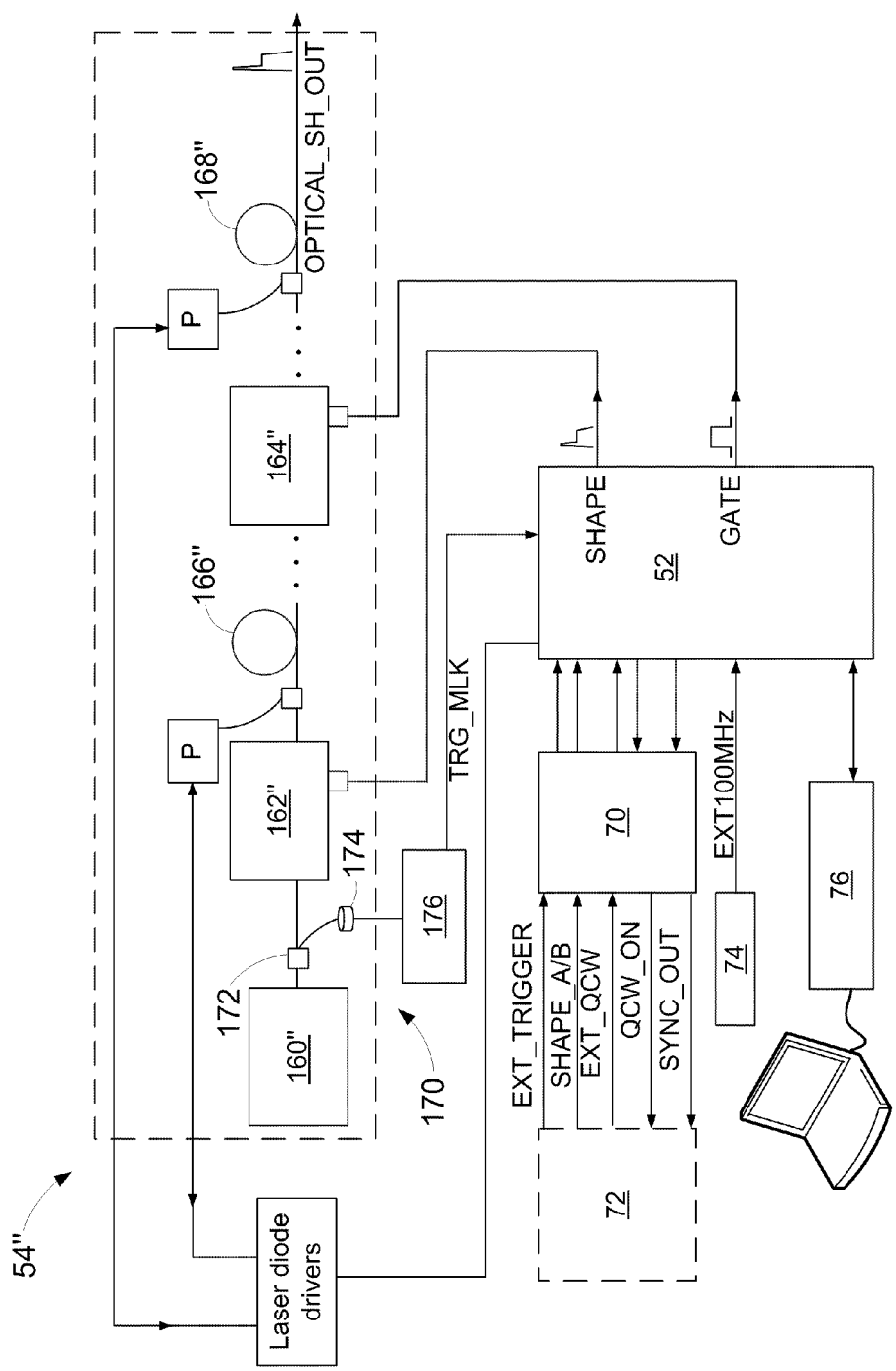
FIG. 44 schematically illustrates an embodiment of the present invention providing femtosecond or picosecond shaped pulse trains.

Referring to FIG. 44, there is illustrated a pulsed laser source 54" according to such an embodiment. In this case the pulsed seed light source 160" is preferably a mode-locked laser generating a light signal of sub-pulses, preferably optical pulses having durations in the femtosecond or picosecond time scale. A first modulator 162" is disposed downstream the pulsed seed laser source and 160" and modulates the light signal to form the laser pulses, with each laser pulse encompassing a train of the sub-pulses. The first modulator 162" is controlled by the SHAPE signal. Preferably, a second modulator 164", controlled by the GATE signal, is disposed downstream the first modulator 162". A first optical amplifier 166", such as a fiber gain medium as explained above, is preferably disposed between the first and second modulators 162" and 164". One or more additional gain medium or optical amplifiers 168" may be provided downstream the second modulator 164".

In the illustrated embodiment of FIG. 44, a sampling assembly 170 provides a trigger signal synchronized with the sub-pulses from the mode-locked laser to the digital pulse shaping module 52. The sampling assembly 170 preferably includes an optical coupling device 172 (e.g. tap coupler) coupling a small fraction of the light signal from the mode-locked laser out of the light path, and a detector 174 (e.g. a photodiode) for detecting the tapped fraction of the light signal and outputting a corresponding detected signal. A trigger generator 176 receives the detected signal and generates therefrom the trigger signal TRG_MLK synchronized with the mode-locked laser.

Figure 45:
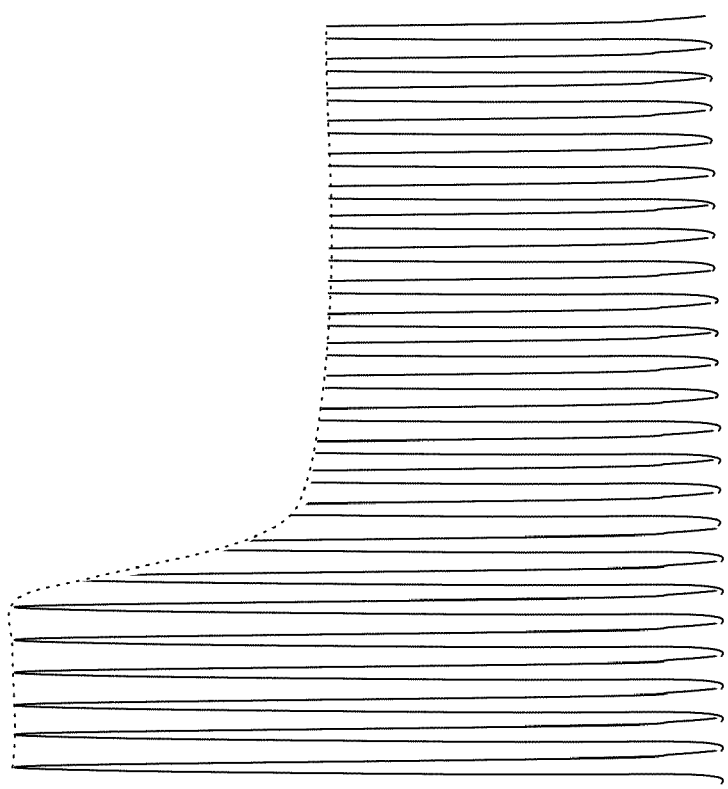
FIG. 45 is an illustration of a shaped picosecond pulse train generated with embodiments of the invention.

In the preferred embodiment, the TRG_MLK signal is used by the pulse shaping module 52 to perform pulse picking with the first amplitude modulator 162". Preferably, the SHAPE signal pulse repetition rate is n times smaller than the mode-locked laser repetition rate, where n is an integer. In the service mode, the SHAPE signal pulse repetition rate and pulse shape are controlled by the user with simple commands sent to the digital pulse shaping module 52. In the user mode, an external trigger signal EXT_TRIGGER can be used to trigger shaped trains of mode locked laser pulses (see FIG. 45), which can be very beneficial for advanced material processing applications. The optional second modulator 164" provides an extended pulse train shaping capability.

Of course, numerous modifications could be made to the embodiments described above without departing from the scope of the present invention.

The invention claimed is:

1. A digital pulse shaping module for controlling a pulsed laser oscillator according to a digital input waveform, comprising:
   a clock generator generating a plurality of phase-related clock signals at a same clock frequency;
   a shape generator outputting a digital shape signal corresponding to said digital input waveform, said shape generator operating in Double Data Rate in response to said clock signals; and
   a Digital-to-Analog Converter, hereinafter DAC, receiving the digital shape signal and converting the digital shape signal into an analog shape signal.

2. The digital pulse shaping module according to claim 1, wherein the plurality of phase-related clock signals comprises a Clock_0 signal and a Clock_180 lagging half a period behind said Clock_0 signal.

3. The digital pulse shaping module according to claim 2, wherein the shape generator comprises a shape sub-module comprising:
   parallely operating a first and a second shape state machines respectively clocked by the Clock_0 and Clock_180 signals and each outputting a corresponding output shape; and
   a shape DDR switch alternatingly outputting the output shape from said first and second shape state machines as said digital shape signal.

4. The digital pulse shaping module according to claim 3, further comprising a shape memory buffer storing a plurality of predetermined waveforms, each shape state machine comprising selecting means for selecting any one of said predetermined waveforms as the digital input waveform.

5. The digital pulse shaping module according to claim 4, wherein the shape memory buffer comprises a pulse shape data buffer for storing pulse shape and a pulse duration data buffer for storing pulse duration data.

6. The digital pulse shaping module according to claim 4, wherein each of said shape state machines comprises shape switching means for dynamically switching the corresponding output shape between two of said predetermined waveforms.

7. The digital pulse shaping module according to claim 4, wherein each of said shape state machines has a shape mode wherein the output shape corresponds to a selected one of said predetermined waveforms, and a QCW mode where the output shape is a quasi-continuous wave shape.

8. The digital pulse shaping module according to claim 7, wherein each of said shape state machine outputs said quasi-continuous wave shape by default.

9. The digital pulse shaping module according to claim 2, wherein the plurality of phase-related clock signals further comprises a Clock_90 signal and a Clock_270 signal respectively lagging a quarter of a period and three-quarters of a period behind said Clock_0 signal.

10. The digital pulse shaping module according to claim 9, wherein the shape generator further comprises a clock DDR switch providing a DAC clock signal to the DAC, said clock DDR switch being clocked by the Clock_90 and Clock_270 signals.

11. The digital pulse shaping module according to claim 1, further comprising a frequency synthesizer generating a high frequency clock control signal inputted to said DAC.

12. The pulse shaping platform according to claim 1, further comprising a shape buffer driver receiving the analog shape signal and generating a control shape signal adapted for controlling said pulse laser oscillator.

13. The digital pulse shaping module according to claim 1, further comprising QCW means for outputting a quasi-continuous wave as said digital shape signal.

14. The digital pulse shaping signal according to claim 13, wherein the QCW means comprise a frequency measurement module for measuring the frequency of an external QCW trigger signal, said frequency measurement module outputting a QCW output flag dependent on said frequency.

15. The digital pulse shaping module according to claim 2, wherein the shape generator further comprises a gate sub-module generating a gate signal having a predetermined timing relationship with respect to the digital shape signal.

16. The digital pulse shaping module according to claim 15, wherein the gate sub-module comprises:
parallely operating first and a second gate state machines respectively clocked by the Clock_0 and Clock_180 signals and each outputting a corresponding gate output;
first and second variable delay line respectively associated with the first and second gate state machines and imposing a delay on the corresponding gate output, thereby generating a delayed gate output; and
a gate DDR switch alternatingly outputting the delayed gate output from said first and second gate state machines as said gate signal.

17. The digital pulse shaping module according to claim 15, further comprising a gate buffer driver receiving the analog gate signal and generating a control gate signal.

18. The digital pulse shaping module according to claim 2, wherein the shape generator further comprises a synchronization sub-module generating a trigger synchronization signal having a predetermined timing relationship with respect to a light pulse emitted by said laser oscillator responsive to an external trigger signal.

19. The digital pulse shaping module according to claim 18, wherein the synchronization sub-module comprises:
parallely operating first and a second synchronization state machines respectively clocked by the Clock_0 and Clock_180 signals and each outputting a corresponding synchronization output responsive to said external trigger signal;
first and second synchronization variable delay lines respectively associated with the first and second synchronization state machines and imposing a delay on the corresponding synchronization output, thereby generating a delayed synchronization output; and
a synchronization DDR switch alternatingly outputting the delayed synchronization output from said first and second synchronization state machines as said trigger synchronization signal.

20. The digital pulse shaping module according to claim 18, wherein the delay imposed by each synchronization delay line is user-defined.

21. The digital pulse shaping module according to claim 1, further comprising a microcontroller.

22. The digital pulse shaping module according to claim 21, further comprising a high speed digital logic circuit, the microcontroller, clock generator and shape generator being embedded thereon.

23. The digital pulse shaping module according to claim 22, wherein the high speed digital logic circuit is a FPGA or an ASIC.

24. The digital pulse shaping module according to claim 1, in combination with a connector interface interfacing communication between said digital pulse shaping module and user equipment.

25. The combination of claim 24, wherein the connector interface provides an external trigger signal to the digital pulse shaping module in response to a trigger command from the user equipment.

26. The combination of claim 25, wherein the connector interface outputs a trigger synchronization signal having a predetermined timing relationship with respect to a light pulse emitted by said laser oscillator responsive to said external trigger signal.

27. The combination of claim 24, wherein the connector interface provides a shape switching signal to the digital pulse shaping module in response to a shape selection command from the user equipment.

28. A pulse laser system for generating laser pulses, said pulsed laser system comprising:
a digital pulse shaping module comprising:
a clock generator generating a plurality of phase-related clock signals at a same clock frequency;
a shape generator outputting a digital shape signal corresponding to said digital input waveform, said shape generator operating in Double Data Rate in response to said clock signals;
a Digital-to-Analog Converter, hereinafter DAC, receiving the digital shape signal and converting the digital shape signal into an analog shape signal; and
a shape buffer driver receiving the analog shape signal and generating a control shape signal; and
a laser oscillator receiving said control shape signal and generating said laser pulses in accordance therewith.

29. The pulsed laser system according to claim 28, wherein the laser oscillator comprises a pulsed seed light source generating said light pulses, the pulsed seed light source having a current source controlled by said control shape signal.

30. The pulsed laser system according to claim 28, wherein the digital pulse shaping module further comprises:
- a gate sub-module generating a gate signal having a predetermined timing relationship with respect to the digital shape signal; and
- a gate buffer driver receiving the analog gate signal and generating a control gate signal.

31. The pulsed laser system according to claim 30, wherein the laser oscillator comprises:
- a seed source generating a continuous light beam; and
- first and second modulators disposed in a path of said continuous light beam and modulating the same to provide said laser pulses, the first modulator and second modulators being respectively controlled by the control shape signal and the control gate signal.

32. The pulsed laser system according to claim 31, wherein the laser oscillator further comprises a first gain medium disposed between the first and second modulators.

33. The pulsed laser system according to claim 32, wherein the laser oscillator further comprises a second gain medium disposed downstream the second modulator.

34. The pulsed laser system according to claim 30, wherein the laser oscillator comprises:
- a pulsed seed light source generating said light pulses, the pulsed seed light source having a current source controlled by said control shape signal; and
- a modulator disposed downstream the pulsed seed laser source, the modulator being controlled by the control gate signal.

35. The pulsed laser system according to claim 28, wherein the laser oscillator comprises:
- a pulsed seed light source generating a light signal of sub-pulses;
- a first modulator disposed downstream the pulsed seed laser source and modulating the light signal to form said laser pulses, each laser pulse comprising a train of said sub-pulses, the modulator being controlled by the control shape signal.

36. The pulsed laser system according to claim 35, further comprising a sampling assembly providing a trigger signal synchronized with said sub-pulses to the digital pulse shaping module, the sampling assembly comprising:
- an optical coupling device coupling a fraction of the light signal generated by the pulsed seed light source;
- a detector for detecting said fraction of the light signal and outputting a corresponding detected signal; and
- a trigger generator receiving said detected signal and generating therefrom the trigger signal synchronized with said sub-pulses.

37. The pulsed laser system according to claim 35, wherein the pulsed seed light source is a mode-locked laser.

38. The pulsed laser system according to claim 35, wherein:
- the digital pulse shaping module further comprises a gate sub-module generating a gate signal having a predetermined timing relationship with respect to the digital shape signal, and a gate buffer driver receiving the analog gate signal and generating a control gate signal; and
- the laser oscillator further comprises a second modulator disposed downstream the first modulator, the second modulator being controlled by the control gate signal.

39. The pulsed laser system according to claim 38, wherein the laser oscillator further comprises a first gain medium disposed between the first and second modulators.

40. The pulsed laser system according to claim 39, wherein the laser oscillator further comprises a second gain medium disposed downstream the second modulator.

* * * * *